United States Patent
Crane et al.

(10) Patent No.: US 11,913,687 B2
(45) Date of Patent: Feb. 27, 2024

(54) THERMOELECTRIC ENHANCED HYBRID HEAT PUMP SYSTEMS

(71) Applicant: DTP Thermoelectrics LLC, Pasadena, CA (US)

(72) Inventors: Douglas Crane, El Cerrito, CA (US); Lon Bell, Altadena, CA (US)

(73) Assignee: DTP THERMOELECTRICS LLC, Pasadena, CA (US)

( * ) Notice: Subject to any disclaimer, the term of this patent is extended or adjusted under 35 U.S.C. 154(b) by 0 days.

(21) Appl. No.: 18/065,209

(22) Filed: Dec. 13, 2022

(65) Prior Publication Data

US 2023/0113018 A1 Apr. 13, 2023

Related U.S. Application Data

(63) Continuation of application No. PCT/US2021/037249, filed on Jun. 14, 2021.
(Continued)

(51) Int. Cl.
*F25B 30/02* (2006.01)
*F25B 41/20* (2021.01)
(Continued)

(52) U.S. Cl.
CPC ............. *F25B 30/02* (2013.01); *F25B 13/00* (2013.01); *F25B 21/04* (2013.01); *F25B 41/20* (2021.01); *F25B 2313/02741* (2013.01)

(58) Field of Classification Search
CPC .......... F25B 30/02; F25B 41/20; F25B 13/00; F25B 21/04; F25B 2313/02741
See application file for complete search history.

(56) References Cited

U.S. PATENT DOCUMENTS 3,212,274 A 10/1965 Eidus
5,269,146 A 12/1993 Kerner
(Continued)

FOREIGN PATENT DOCUMENTS

CN 106885588 A 6/2017
DE 102013217193 A1 3/2014
(Continued)

OTHER PUBLICATIONS

English translation of Teraki (JP-2012088021-A). (Year: 2012).*
(Continued)

*Primary Examiner* — Miguel A Diaz
(74) *Attorney, Agent, or Firm* — Snell & Wilmer, L.L.P.; Jaime D. Choi

(57) ABSTRACT

Thermoelectric enhanced hybrid heat pump systems are provided herein. A compressor increases the pressure of refrigerant within tubing. A first heat exchanger is downstream of the compressor and changes enthalpy of first fluid flow through heat exchange with refrigerant. A second heat exchanger changes enthalpy of second fluid flow through heat exchange with refrigerant. A thermoelectric device is downstream of the first heat exchanger and reduces refrigerant temperature. Expansion valves are downstream of the thermoelectric device and first heat exchanger, respectively located on first and second sides of the thermoelectric device, and expand refrigerant and reduce refrigerant pressure while conserving refrigerant enthalpy. At least one valve reverses refrigerant flow within the tubing without changing compressor operation. A control system controls the thermoelectric device and at least one valve to switch the heat pump system from heating mode to cooling mode and from cooling mode to heating mode.

22 Claims, 55 Drawing Sheets

Related U.S. Application Data

(60) Provisional application No. 63/115,277, filed on Nov. 18, 2020, provisional application No. 63/039,107, filed on Jun. 15, 2020.

(51) Int. Cl.
    *F25B 13/00* (2006.01)
    *F25B 21/04* (2006.01)

(56) References Cited

U.S. PATENT DOCUMENTS

| | | | |
|---|---|---|---|
| 5,361,587 A | 11/1994 | Hoffman | |
| 5,761,908 A * | 6/1998 | Oas | F24H 4/06 454/238 |
| 7,296,417 B2 | 11/2007 | Ghoshal | |
| 7,752,852 B2 | 7/2010 | Akei et al. | |
| 7,779,639 B2 * | 8/2010 | Goenka | F25B 21/04 165/41 |
| 8,307,663 B2 | 11/2012 | Akei et al. | |
| 8,408,012 B2 * | 4/2013 | Goenka | B60H 1/2221 62/3.3 |
| 8,445,772 B2 | 5/2013 | Bell et al. | |
| 8,789,385 B2 | 7/2014 | Campbell et al. | |
| 8,899,052 B2 | 12/2014 | Campbell et al. | |
| 9,103,573 B2 * | 8/2015 | Goenka | B60H 1/00478 |
| 9,134,053 B2 | 9/2015 | Lu | |
| 9,366,461 B2 | 6/2016 | Bell et al. | |
| 9,506,675 B1 | 11/2016 | Campbell et al. | |
| 9,890,975 B2 | 2/2018 | Zelissen | |
| 10,415,689 B2 | 9/2019 | Dickson et al. | |
| 10,655,910 B2 | 5/2020 | Roekens et al. | |
| 10,718,551 B2 | 7/2020 | Edwards et al. | |
| 10,816,244 B2 | 10/2020 | Höjer | |
| 2004/0042181 A1 | 3/2004 | Nagasaki | |
| 2006/0123827 A1 | 6/2006 | Achaichia | |
| 2007/0095382 A1 | 5/2007 | Snyder et al. | |
| 2007/0101750 A1 | 5/2007 | Pham et al. | |
| 2009/0007952 A1 | 1/2009 | Kondoh et al. | |
| 2009/0151768 A1 | 6/2009 | Forseth | |
| 2010/0011781 A1 | 1/2010 | Lents et al. | |
| 2011/0036384 A1 | 2/2011 | Culp | |
| 2011/0120517 A1 | 5/2011 | Li | |
| 2012/0079837 A1 | 4/2012 | Maranville et al. | |
| 2012/0139075 A1 | 6/2012 | Shankar et al. | |
| 2012/0312030 A1 | 12/2012 | Lu | |
| 2013/0000688 A1 | 1/2013 | Cho et al. | |
| 2013/0074898 A1 | 3/2013 | Snyder | |
| 2013/0255743 A1 | 10/2013 | Ogimoto | |
| 2013/0327063 A1 | 12/2013 | Gawthrop | |
| 2014/0260332 A1 * | 9/2014 | Wu | F25B 5/02 62/3.6 |
| 2014/0366926 A1 | 12/2014 | Ashkenazi | |
| 2015/0128614 A1 | 5/2015 | Ghoshal et al. | |
| 2017/0284708 A1 | 10/2017 | Wang et al. | |
| 2018/0031285 A1 | 2/2018 | Thomas et al. | |
| 2019/0077225 A1 | 3/2019 | Nakamura et al. | |
| 2020/0056795 A1 * | 2/2020 | Mishra | F24F 5/0042 |

FOREIGN PATENT DOCUMENTS

| | | |
|---|---|---|
| EP | 1669697 A1 | 6/2006 |
| EP | 2397790 A2 | 12/2011 |
| JP | 10510677 | 10/1998 |
| JP | 2011202939 A * | 10/2011 |
| JP | 2012088021 A * | 5/2012 |
| JP | 2013089719 A | 5/2013 |
| JP | 2014511031 A | 5/2014 |
| JP | 2017204550 A | 11/2017 |
| JP | 2018192968 A2 | 12/2018 |
| KR | 100298724 B1 | 11/2001 |
| KR | 20160115430 A | 10/2016 |
| WO | 2006043514 A1 | 4/2006 |
| WO | 2007027171 A1 | 3/2007 |
| WO | 2021257464 A1 | 12/2021 |

OTHER PUBLICATIONS

Andersen et al., "Economic and Climate Advantages: Secondary-Loop Motor Vehicle Air Conditioners (MACs)," SAE Technical Paper 2018-37-0030 (2018) https://doi.org/10.4271/2018-37-0030.

Angrist, "Direct Energy Conversion," 4th ed., Boston: Allyn and Bacon, Inc. (1982).

Astrain et al., "Improvements in the cooling capacity and the COP of a transcritical CO2 refrigeration plant operating with a thermoelectric subcooling system," Applied Thermal Engineering; 155: pp. 110-122 (2019).

Bell, Lon E., "Optimally Distributed Transport Properties Can Produce Highest Performance Thermoelectric Systems," Phys. Status Solidi A; 1900562: pp. 1-7 (2019) https://doi.org/10.1002/pssa.201900562.

Chang et al., "Modeling and Performance Simulation of Gas Cooler for CO2 Heat Pump System," International Refrigeration and Air Conditioning Conference. Paper 764 (2006) http://docs.lib.purdue.edu/iracc/764.

Crane, et al., "Maximum temperature difference in a single-stage thermoelectric device through distributed transport properties," International Journal of Thermal Sciences 154; pp. 1-9 (2020) https://doi.org/10.1016/j.ijthermalsci.2020.106404.

International Search Report and Written Opinion of the International Searching Authority dated Sep. 17, 2021 in Int'l PCT Patent Appl. Serial No. PCT/US2021/037249 (13 pages).

Llopis et al., "Experimental evaluation of a CO2 transcritical refrigeration plant with dedicated mechanical subcooling," International Journal of Refrigeration, vol. 69, pp. 361-368, ISSN 0140-7007 (2016) https://doi.org/10.1016/j.ijrefrig.2016.06.009.

Mathur, "Carbon dioxide as an alternative refrigerant for automotive air conditioning systems," AIAA 2000-2858. 35th Intersociety Energy Conversion Engineering Conference and Exhibit (Jul. 2000) https://doi.org/10.2514/6.2000-2858.

Schoenfeld et al., "Experimental Results: Thermoelectric 'Subcooler' for CO2 Transcritical Vapor Compression System," International Institute of Refrigeration; record ID: 2010-1890: pp. 1-26 (2009).

Wang et al., "Experimental and Theoretical Study on the Cooling Performance of a CO2 Mobile Air Conditioning System," Energies, 11, 1927 (2018) https://doi.org/10.3390/en11081927.

Wantha, "Experimental investigation of the influence of thermoelectric subcooler on the performance of R134a refrigeration systems," Applied Thermal Engineering; 80: pp. 1-8 (2020) https://doi.org/10.1016/j.applthermaleng.2020.115829.

Anatychuk et al., "Functionally Graded Materials and New Prospects for Thermoelectricity Use," 16th International Conference on Thermoelectrics: pp. 588-591 (1997).

Angrist, "Direct Energy Conversion," Thermoelectric Generators Chapter 4: pp. 139-144 (1965).

Bhattacharjee et al., "A shield based thermoelectric converter system with a thermosyphonic heat sink for utilization in woodstoves." ICAER: pp. 1-13 (2015).

Bian et al., "Beating the maximum cooling limit with graded thermoelectric materials." Appl. Phys. Lett. 89 212101: pp. 1-3 (2006) https://doi.org/10.1063/1.2396895.

Buist, R.J. "The Extrinsic Thomson Effect." Proceedings of the 14th International Conference on Thermoelectrics, St. Petersburg: pp. 1-4 (1995).

Chinese Office Action dated Apr. 24, 2023 in Chinese Application No. 202080011948.0 (EN translation).

Chung et al., "CsBi4Te6: A high-performance thermoelectric material for low-temperature applications," Science 287: pp. 1024-1027 (2000) DOI: 10.1126/science.287.5455.1024.

Cramer et al., "Performance of Functionally Graded Thermoelectric Materials and Devices: A Review," Journal of Electronic Materials, vol. 47, No. 9 (Year: 2018).

Goldsmid, "The physics of thermoelectric energy conversion," Morgan & Claypool: pp. 1-6 (2017) doi:10 .1088/978-1-6817-4641-8.

International Search Report and Written Opinion of the International Searching Authority dated Apr. 29, 2020 in Int'l PCT Patent Appl. Serial No. PCT/US2020/016247 (9 pages).

(56) References Cited

OTHER PUBLICATIONS

International Search Report and Written Opinion of the International Searching Authority dated Oct. 7, 2021 in Int'l PCT Patent Appl. Serial No. PCT/US2021/037253 (8 pages).
Jamali et al., "Performance improvement of a transcritical CO2 refrigeration cycle using two-stage thermoelectric modules in subcooler and gas cooler," International Journal of Refrigeration 74: pp. 105-115 (2017) http://dx.doi.org/10.1016/j.ijrefrig.2016.10.007.
Japanese Office Action dated Apr. 24, 2023 in Japanese Application No. 2021-544747 (EN translation).
Kaliazin et al., "Rigorous calculations related to functionally graded and segmented thermoelectrics," International Conference on Thermoelectrics: pp. 286-291 (2001).
Kishore et al., "Ultra-high performance wearable thermoelectric coolers with less materials," Nature Communications 10(1): pp. 1-13 (2019).
Korean Office Action dated Jun. 15, 2023 in Korean Application No. 10-2021-7024002 (EN translation).
Korshuev et al., "Efficiency of Low-Grade Heat Recovery Using Various Thermoelectric Converters." Journal of Thermoelectricity ISSN 16070-8829, 1: pp. 63-70 (2011).
Kuznetsov, "Functionally graded materials for thermoelectric applications," Thermoelectrics Handbook—Macro to Nano (D.M. Rowe, editor, CRC Tatlor & Francis: pp. 1-12 (2006)).
Kwan et al., "Application of the Peltier sub-cooled trans-critical carbon dioxide heat pump system for water heating—Modelling and performance analysis," Energy Conversion and Management 185: pp. 574-585 (2019) https://doi.org/10.1016/j.enconman.2019.01.104.
Lee et al., "Nanoporous Si as an Efficient Thermoelectric Material," Nano Letters: 8(11): pp. 3750-3754 (2008).
Llopis et al., "Subcooling methods for CO2 refrigeration cycles: A review," International Journal of Refrigeration 93: pp. 85-107 (2018) https://doi.org/10.1016/j.ijrefrig.2018.06.010.
Muller et al., "Separated effect of 1 D thermoelectric material gradients," International Conference on Thermoelectrics, pp. 1-6. (2006).
Müller et al., "Optimization Strategies for Segmented Peltier Coolers," Physica Status Solidi (a) 203(8): pp. 2128-2141 (2006) doi: 10.1002/pssa.200521047.
Nakamura, "First-principles simulation on Seebeck coefficient in silicon and silicon carbide nanosheets," Japanese Journal of Applied Physics Part 1 55 06GJ07: pp. 1-9 (2016).
Nolas et al., "Thermoelectrics—Basic principles and new materials developments," Springer-Verlag, Berlin Heidelberg: pp. 1-5 (2001).
Ren et al., "Thermal conductivity anisotropy in holey silicon nanostructures and its impact on thermoelectric cooling," Nanotechnology: 29: 045404, pp. 1-8 (2018) https://doi.org/10.1088/1361-6528/aa9f07.
Rull-Bravo et al., "Skutterudites as Thermoelectric Materials: Revisted," RSC Advances 5: pp. 41653-41667 (2015).
Sarkar, "Performance optimization of transcritical CO2 refrigeration cycle with thermoelectric subcooler," Int. J. Energy Res 37: pp. 121-128 (2013) https://onlinelibrary.wiley.com/doi/abs/10.1002/er.1879.
Schierning, "Silicon nanostructures for thermoelectric devices: A review of the current state of the art," Phys. Status Solidi A 211(6): pp. 1235-1249 (2014) DOI:10.1002/pssa.201300408.

Schoenfield et al., "CO2 transcritical vapor compression cycle with thermoelectric subcooler," HVAC&R Research 18(3): pp. 297-311 (2012) https://doi.org/10.1080/10789669.2012.625348.
Semeniouk et al., "Single stage thermoelectric coolers with temperature difference of 80K," International Conference on Thermoelectrics, St. Petersburg, Russia: pp. 485-489 (1995).
Shao et al., "Thermodynamic transition from subcritical to transcritical CO2 cycle," International Journal of Refrigeration 64: pp. 123-129 (2016) http://dx.doi.org/10.1016/j.ijrefrig.2016.01.018.
Snyder et al. "Supercooling of Peltier cooler using a current pulse," Journal of Applied Physics 92: pp. 1564-1569 (2002) http://dx.doi.org/10.1063/1.1489713.
Snyder et al., "Improved thermoelectric cooling based on the Thomson effect." American Physical Society Physical Review B 86, 045202: pp. 1-8 (2012) DOI: 10.1103/PhysRevB.86.045202.
Stranz et al., "Thermoelectric Properties of a High-Doped Silicon from Room Temperature to 900K," Journal of Electronic Materials: 42(7): pp. 2381-2387 (2013) DOI: 10.1007/s11664-013-2508-0.
Tang et al., "Holey silicon as an efficient thermoelectric material," Nanoletters 10: pp. 4279-4283 (2010).
Tritt et al., "Thermoelectric materials, phenomena, and applications: A bird's eye view" MRS Bulletin 31: pp. 188-229 (2006).
Vikhor et al, "Theoretical evaluation of maximum temperature difference in segmented thermoelectric coolers," Applied Thermal Engineering 26: pp. 1692-1696 (2006) https://doi.org/10.1016/j.applthermaleng.2005.11.009.
Walczak et al., "Modeling of Segmented Peltier Cooling with Discrete and Continuous Concentration Function." Trans Tech Publications, Switzerland Materials Science Forum 492-493: pp. 507-516 (2005) doi:10.4028/www.scientific.net/MSF.
Wang et al., "Exact Solution of a Constrained Optimization Problem in Thermoelectric Cooling." Applied Mathematical Sciences 2(4): pp. 177-186 (2008).
Wang et al., "Experimental and numerical investigation of a CO2 heat pump system for electrical vehicle with series gas cooler configuration," International Journal of Refrigeration 100: pp. 156-166 (2019) https://doi.org/10.1016/j.ijrefrig.2018.11.001.
Winkler et al., "Potential Benefits of Thermoelectric Element Used With Air-Cooled Heat Exchangers," Purdue University Purdue e-Pubs, International Refrigeration and Air Conditioning Conference Paper 813: pp. 1-9 (2006) http://docs.lib.purdue.edu/iracc/813.
Yamashita et al., "Dependence of Seebeck Coefficient on Carrier Concentration in Heavily B- and P-Doped Si1—xGex (x≤ 0.05) System" Japanese Journal of Applied Physics: 38(11): pp. 6394-6400 (1999).
Yazawa et al., "Cost Optimization of Thermoelectric Sub-Cooling in Air-cooled CO2 Air Conditioners," International Refrigeration and Air Conditioning Conference Paper 1626: pp. 1-10 (2016) http://docs.lib.purdue.edu/iracc/1626.
Zhou et al., "Pulsed cooling of inhomogeneous thermoelectric materials," Journal of Physics D: Applied Physics 40: pp. 4376-4381 (2007).
Zhu et al., "Theoretical study of a thermoelectric-assisted vapor compression cycle for air-source heat pump applications," International Journal of Refrigeration: 51: pp. 33-40 (2015) http://dx.doi.org/10.1016/j.ijrefrig.2014.12.001.
Ziabari, "Nanoscale solid-state cooling: A review," Reports on Progress in Physics 79(095901): pp. 1-35 (2016) doi:10.1088/0034-4885/79/9/095901.

\* cited by examiner

| Configuration | AC only | Heating only | combined AC & heating | primary loop only (TE device is refrigerant-to-air) | secondary loop (TE device is refrigerant-to-liquid) | TE heat to air before condenser | TE heat to air after condenser | TE heat to air adjustable | TE heat to air is separate from condenser | TE heat to air in parallel with condenser | includes 4 way valve & bi-flow expansion valves | 2nd glycol/water loop | split TE device | air handling valve | TE device as a second stage |
|---|---|---|---|---|---|---|---|---|---|---|---|---|---|---|---|
| 1 | x | | | | | | | | | | | | | | |
| 2 | x | | | | x | x | | | | | | | | | |
| 3 | x | | | | x | | x | | | | | | | | |
| 4 | | x | | | x | | | x | | | | | | | |
| 5 | | x | | | x | x | | | | | | | | | |
| 6 | | x | | | x | | x | | | | | | | | |
| 7 | | | x | | x | x | | x | | | | | | | |
| 8 | | | x | | x | x | | | | | | | | | |
| 9 | | | x | | x | x | | | | | | | | | |
| 10 | | | x | | x | | | | x | | x | | | | |
| 11 | | | x | | x | x | | x | | | | | | | |
| 12 | | | x | | x | x | | x | | | | x | | | |
| 13 | | | x | | x | x | | | | | | x | | | |
| 14 | | | x | | x | | | | | | | x | | | |
| 15 | | | x | x | x | | | | | | | | x | | |
| 16 | | | x | x | | x | | | | x | | | | | |
| 17 | | | x | x | | x | | | | x | x | | | | |
| 18 | | x | | x | | | | | | | x | | | x | |
| 19 | | | | x | | | | | | | | | | x | |
| 20 | x | | | x | | | | | | | | | | | x |
| 21 | | | | x | | | | | | | | | | | x |
| 22 | | | x | x | | | | | | | | | | | x |
| 23 | | | x | x | | | | | | | x | | | | x |

FIG. 24

Fig. 21 Pressure-Enthalpy Diagram for Refrigerant 744 (Carbon Dioxide)

THERMOELECTRIC ENHANCED HYBRID HEAT PUMP SYSTEMS

CROSS-REFERENCE TO RELATED APPLICATIONS

This application is a continuation under 35 U.S.C. § 120 of International Patent Application No. PCT/US2021/037249, filed on Jun. 14, 2021, the entire contents of which are incorporated by reference herein, which claims the benefit of the following applications, the entire contents of each of which are incorporated by reference herein:

U.S. Provisional Patent Application No. 63/039,107, filed on Jun. 15, 2020 and entitled "Increased Heat Pumping Capacity and Maximum Power Output from Using DTP Thermoelectrics;" and U.S. Provisional Patent Application No. 63/115,277, filed on Nov. 18, 2020 and entitled "Temperature Control Using DTP Thermoelectrics."

FIELD

This application relates to thermoelectric (TE) elements with distributed transport properties (DTP), and devices using TE elements.

BACKGROUND

A material with distributed transport properties (DTP) has varying properties (Seebeck coefficient, electrical resistivity, and thermal conductivity) at different spatial locations within the material at the same temperature. This concept has also been described as functionally graded material. First described as a material utilizing the distributed Peltier effect by Reich et al.'s patent application, filed in 1966 and issued as U.S. Pat. No. 3,564,860 in 1971, claimed a material "having differing thermoelectric properties along the spatial extent thereof between said hot junction and said cold junction" and further states that the absolute value of the Seebeck coefficient at the cold junction is "significantly less than the absolute value of the Seebeck coefficient of material at said hot junction."

Buist described an approach as the extrinsic Thomson effect in "The Extrinsic Thomson Effect (ETE)," International Conference on Thermoelectrics (Cardiff, Wales, 1991). In this paper, he describes test results for a three-stage device with up to 20% gain in maximum temperature difference. The group of Walczak, Seifert, and Muller conducted modelling studies achieving a maximum temperature difference of 10-20% using what they called the functionally graded material (FGM) effect as described in "Modeling of segmented Peltier cooling with discrete and continuous concentration function," Materials Science Forum 492-493: 507-516 (2005) and "Optimization strategies for segmented Peltier coolers," Physica Status Solidi (a) 203(8): 2128-2141 (2006). They claimed that no substantial improvement can be achieved with greater than five stages. Korzhuev and Nikhesina also described the effect that creates improvement by " . . . 20% and more" in "Efficiency of low-grade heat recovery using various thermoelectric converters," Journal of Thermoelectricity No. 1, 4: 63-70 (2011). Kaliazin et al. studied FGM stating that "real coefficient of performance can indeed be significantly different from that given by Ioffe formula, particularly in the regime of maximum temperature" in "Rigorous calculations related to functionally graded and segmented thermoelectrics," International Conference on Thermoelectrics (2001). Semeniouk et al. described fabrication of a device with distributed properties in two segments by the Czochralski method, achieving a maximum temperature difference of 83K for a single stage device in "Single stage thermoelectric coolers with temperature difference of 80K," International Conference on Thermoelectrics (St. Petersburg, Russia, 1995). Bian and Shakouri described that "cooling enhancement is attributed to the redistribution of the Joule heating and Peltier cooling profiles" in "Beating the maximum cooling limit with graded thermoelectric materials," Applied Physics Letters 89: 212101-1 to -3 (2006). They concluded that "more than twice maximum cooling temperature of the uniform material with the same ZT can be achieved".

Anatychuk and Vikhor described different methods to produce functionally graded materials, including by pressing, extrusion, zone melting, and the Czochralski method in "Functionally graded materials and new prospects for thermoelectricity use," International Conference on Thermoelectrics (1997). Kuznetsov further described making functionally graded materials using the Bridgeman method, Czochralski technique, plasma spray method, diffusion of a dopant from a gaseous phase, zone leveling technique, and hot pressing of powder layers containing different amounts of a dopant in "Functionally graded materials for thermoelectric applications," Thermoelectrics Handbook—Macro to Nano (D. M. Rowe, editor, CRC Tatlor & Francis, 2006). He further concluded that the efficiency of a functionally graded material is insensitive to variations in the doping profile "which means that the carrier concentration along the length of the material does not have to match exactly the optimum profile to achieve thermoelectric efficiency very close to its maximum possible value".

SUMMARY

The performance of traditional thermoelectric devices may be improved by increasing the maximum temperature differential and the achievable maximum heat pumping capacity. As provided herein, these capabilities may provide and enable increased performance, stability and durability of heat pump systems. Thermoelectrics have the advantage of being solid state, containing no moving parts and being scalable to match the requirements of the application.

Previously known thermoelectrics have not been broadly used in applications such as described in detail below, for example because of relatively low efficiency and high cost due to low thermal power output and higher energy consumption that is possible either for cost reasons or weight. As provided herein, the present heat pump systems may benefit from the use of DTP TE systems such as disclosed in greater detail below, or in International Patent Application No. PCT/US2020/016247, filed on Jan. 31, 2020 and entitled "Thermoelectric Elements and Devices with Enhanced Maximum Temperature Differences Based on Spatially Varying Distributed Transport Properties," the entire contents of which are incorporated by reference herein. Such DTP TE systems may be modified as described herein to effectively address TE based system limitations.

As provided herein, a heat pump system utilizing refrigerant in a vapor compression cycle is disclosed where a thermoelectric device is integrated into the system. The thermoelectric device provides or enables sub-ambient refrigerant temperatures on the condensing/gas cooling side of the system. This increases capacity and COP for the system. The thermoelectric device also provides or enables the opportunity to use less refrigerant charge and reduce the size of the overall system. Lastly, the thermoelectric device also has the potential to reduce the operating pressure of the system, which is particularly important when using a refrigerant such as $CO_2$. The system can be used with many different refrigerants, including, but not limited to, $CO_2$ and R1234yf. The system can be operated in either heating or cooling mode, for example, to provide a complete HVAC system for all ambient conditions. The system can be used in a variety of applications including passenger vehicles including electric vehicles and hybrid-electric vehicles, buses, including electric buses, and building HVAC and/or hot water. For example, the system may be used to selectably cool and heat the cabin air of a vehicle. The air to be conditioned can be either recirculated or fresh air. The system can be particularly useful in electric vehicles where there is less waste heat (as compared to a vehicle with an internal combustion engine) to provide passenger comfort in cold weather. When used to provide hot water, the heat rejected from the condenser/gas cooler and/or the thermoelectric device can be rejected to water instead of air. For example, in FIG. 16 described further below, fan 1606 can be replaced by a pump and air flow 1611 can be replaced by water flow. Similarly, in FIGS. 17 and 19 described further below, where heat is rejected by the thermoelectric device and the condenser/gas cooler in parallel to each other, one component, the thermoelectric device 1706 or 1905, can reject heat to air while the other, condenser/gas cooler 1710 or 1903, can reject heat to water or vice versa. This parallel heat rejection can allow the system to provide heated air and hot water to a building for example at the same time. Other fluids beyond water and air can also be used as working fluids that are conditioned by the system.

Some of what holds back appeal for electric vehicles in some regions of the world relates to how performance varies in extreme environments. In a 2019 report titled "AAA Electric Vehicle Range Testing," AAA reported a 40% decrease in driving range in cold regions with ambient temperatures at 20° F. compared to 75° F. ambient temperature. This makes it very difficult to sell vehicles in cold climates such as northern Europe, the northeast United States, and parts of China. This decrease in range is principally due to two things: 1) Li ion batteries lose capacity when they are cold and 2) heating occupants to comfort is a much larger parasitic in EVs than in vehicles with international combustion engines (ICE). In vehicles with internal combustion engines, the engines are only roughly 30% efficient. The remaining energy is lost as heat principally to the exhaust and coolant systems. This waste heat can then be used to heat the occupants of the vehicle.

In electric vehicles, the electric motor is far more efficient than an internal combustion engine, with the energy stored in batteries instead of fuel. The amount of waste heat from the process of powering the electric motor from the batteries is a fraction of the waste heat available from the ICE. Today's electric vehicles have principally used the positive temperature coefficient (PTC) heater to provide heating comfort to its occupants. The PTC works well, is simple, and is inexpensive, but the PTC only operates at a coefficient of performance (COP)=1. This low COP is what drives the low performance in cold conditions.

Air conditioning can also be a problem in high ambient environments, such as India. In a 2019 report titled "AAA Electric Vehicle Range Testing," AAA reported a 17% decrease in driving range in cold regions with ambient temperatures at 95° F. compared to 75° F. ambient temperature. As recognized by the present inventors, a solution that can boost HVAC cooling and heating COP at the same time could greatly widen the market for electric vehicles.

Thermoelectrics is an appealing technology in that it provides the potential for both heating and cooling without ozone-depleting and global warming refrigerants. Thermoelectric elements are solid-state and, thus, can also operate with low maintenance. Unfortunately, TE elements may operate at about one quarter (¼) the COP of typical vapor compression cycles.

However, the present inventors recognized that thermoelectrics can be combined with vapor compression to provide a solution. The present systems incorporate a thermoelectric device into a vapor compression cycle, operating on the refrigerant side downstream of the condenser/gas cooler and upstream of the expansion valve. The thermoelectric device provides subcooling below ambient that a standard condenser cannot provide. This subcooling increases the capacity of the vapor compression cycle and reduces the refrigerant charge and subsequent system size.

The proposed system can also be used in standard applications for heating and air conditioning. The proposed system can still be helpful in vehicles with high efficiency engines where waste heat is still not fully available. For example, the proposed system can also be used in building HVAC, particularly in mini-split systems that currently use a combined heating/cooling HVAC system. The proposed system would reduce the size and increase the efficiency of such systems for all ambient conditions, further allowing or enabling those systems to be cost-competitive. The system can also be used in refrigeration, freezer, and ultra-cold freezer applications. The proposed system can be used with a variety of different refrigerants. The subject system has been specifically simulated for use with $CO_2$ and R1234yf.

Some of the novel aspects of the system include its ability to provide both heating and cooling with one system. This is accomplished by reversing the refrigerant flow direction in the system. A series of valves further provides or enables this feature. The system is also set up such that the waste heat from the TE can be rejected either before or after the waste heat from the condenser/gas cooler. This can be set up either way, depending on the refrigerant used, or the system can include the option of being able to do both in one system and optimally switch to whichever configuration will provide better performance for the system. Another novel attribute of the system is the ability to operate the thermoelectric device at an optimal current for the system. Often, the optimal current for the system is much higher than the optimal current for the TE based on the temperature difference. The system often wants to operate closer to maximum heat pumping for the thermoelectric device. The controls of the proposed system provide or enable this operation. In addition, the thermoelectric device can operate at multiple different currents, for example to provide higher COP when the temperature differences across the thermoelectric are or may be different in different parts of the device.

The proposed system can be constructed with conventional thermoelectric material, but it can be constructed and perform even more cost-effectively by using Distributed Transport Property (DTP) materials. DTP is a thermoelectric material structure that provides optimal transport properties (Seebeck coefficient, electrical resistivity, and thermal conductivity) at different spatial locations along the length of the thermoelectric leg. This material structuring can provide a larger temperature difference than conventional thermoelectric materials can provide. By providing a larger temperature difference for a given heat capacity requirement for a given size, DTP thermoelectric material can operate at a higher COP than conventional thermoelectric material. Further details regarding DTP thermoelectric materials may be found in International Patent Application No. PCT/US2020/016247. As provided herein, using DTP thermoelectric material increases system COP in hot environments, which makes $CO_2$ HVAC systems more competitive with R1234yf in cooling, and also provides or enables $CO_2$ usage in heating, where the thermoelectric material provides at least 3× higher COP than R1234yf systems with PTC heaters. Improving $CO_2$ HVAC performance at reduced operating pressures improves safety and reduces cost of the overall system, reducing barriers to its use. Improvements described and provided herein can make a significant impact on electric vehicle driving range, while helping to reduce HVAC total deployment costs and improving HVAC system safety. Using DTP thermoelectric material in the TE device in the hybrid vapor compression cycle can boost COP, reduce energy usage, reduce refrigerant charge and operating pressures, and keep the size of the TE device to a reduced or minimum size. DTP subcooling has the largest benefit when the overall temperature difference is largest.

The thermoelectric device used in the hybrid system can be either liquid-liquid, air-air, or air-liquid. When a DTP thermoelectric element is utilized along with a counterflow heat exchanger configuration and multiple thermally isolated elements or devices in the direction of fluid flow, better performance can be achieved than for conventional thermoelectric technology, with >3× better COP at large temperature differences possible. Using DTP thermoelectric element with the convection thermal cycle for thermoelectrics is advantageous when multiple isolated elements or devices is not practical. The use of a DTP thermoelectric element may not necessarily be beneficial for maximum temperature difference situations, but nonetheless may provide the highest COP in single-stage mid-range temperature difference applications (i.e. ~2× better COP at DT=15° C. compared to a conventional thermoelectric module). Air is typically the working fluid for the convection cycle, but other gases, including helium or argon, can be used as well.

Illustratively, for an example evaporator temperature of −86° C. and an example condenser temperature of 40° C., adding DTP thermoelectric subcooling to a R134a vapor compression cycle nearly triples the COP. For the same example conditions, combining R134a for a hot vapor compression stage, plus $CO_2$ for a medium vapor compression stage, plus a DTP thermoelectric cold stage can provide 10× the COP for R134a only without the use of flammable refrigerants.

Additionally, the broad societal need to reduce energy consumption results in growing applications for higher efficiency and greater thermal capacity solid-state cooling and heating systems. Specific opportunities exist to create electrically powered solid-state systems for vehicle (e.g., electric vehicle) heating, ventilation and air conditioning (HVAC), residential heat pumps for homes, and compact, high power density thermal management systems for the electronics industry. The improvements in cooling and heating thermal management performance achievable from appropriately designing and producing DTP TE material systems are advantageous for satisfying these demands.

Production TE heating and cooling systems use n-type and p-type TE materials that are each of a single composition. The p- and n-materials have been developed over the past 20 to 50 years to attempt to maximize TE device performance. Despite the efforts of researcher initiatives in America, Asia and Europe, TE system performance for many potential applications is still not adequate. The present disclosure is based on newly developed equations, and optimized solutions to equations, that accurately describe the key performance metrics which govern TE device operation. The solutions to these equations lead to new design concepts that measurably improve TE device performance. For example, the solutions to these equations may be used to guide the TE material properties selection process, and to produce TE devices with increased efficiency and higher heat pumping capacity. These new solutions show that composite materials, with properly selected transport properties (Seebeck coefficient, thermal conductivity and electrical conductivity) which vary in a prescribed manner in a TE n- and p-couple in the primary direction of current flow, can improve the key metrics of operating efficiency and TE device heat pumping capacity.

TE elements and devices are discussed in terms of the new design criteria that improves the performance of DTP TE devices over that of conventional thermoelectric (CTE) devices. New computer models are referenced for computing performance of DTP TE system couples. It is shown that by appropriately combining traditional CTE materials into segmented composite TE elements with DTP, device performance can be improved. Examples are given for a non-limiting, representative sample of such combinations, and the resulting performance is modeled. These results show the gains in maximum temperature differential (Max DT), energy conversion efficiency (coefficient of performance, or COP), and increased heat pumping capacity (cooling capacity $Q_C$ and heating capacity $Q_H$, respectively) result from various new methods of implementing DTP couple design.

The gains in Max DT and $Q_C$ provide or enable the design of TE cascade systems, utilizing DTP, that exhibit increased Max DT with higher $Q_C$ for the same number of cascade stages. As a result, to achieve performance of present CTE cascades, it is shown that with the new designs using DTP, fewer stages may be required and $Q_C$ and COP may increase as compared to CTE cascades. Indeed, gains from DTP are shown to be useful in making cascade systems with performance that exceeds that of CTE cascades by an amount that enables new applications for TE coolers and thermal management systems.

The differences in performance and the gain made possible through the new DTP designs are identified. The beneficial performance increases from DTP design, combined with recently available fabrication technologies, are shown to be capable of producing significant realizable increases in TE device performance. Several modern production methods which allow manufacture of such composite material systems are described.

BRIEF DESCRIPTION OF DRAWINGS

FIG. 24 is a configuration matrix that shows example attributes of each of the example configurations described with reference to FIGS. 1-23.

DETAILED DESCRIPTION

FIGS. 1-23 schematically illustrate twenty-three different example configurations of the present hybrid heat pump system. These systems can be used with any refrigerant, including $CO_2$ (R744), R1234yf, R134a, ethane (R170), propane (R290), isobutane (R600a), ammonia (R717), ethylene (R1150), and propylene (R1270). The configurations can be used in subcritical only cycles, transcritical only cycles, and cycles that selectably can operate either subcritically or transcritically. Not specifically illustrated, but should be understood to be included in the present configurations, is a control system, which may, for example, include electronic circuitry configured to control at least the thermoelectric device, four-way valve or other controllable valve(s) that may be included, and the compressor. The control system may include electronic circuitry configured to switchably reverse refrigerant flow, electronic circuitry configured to provide voltage(s)/current(s) to the thermoelectric device(s), one or more sensors for use by the control system to determine optimal compressor speed, thermoelectric current(s)/voltage(s), valve control, and the like. The control system may be implemented using any suitable combination of hardware and software, e.g., using a field-programmable gate array (FPGA), application specific integrated circuit (ASIC), general purpose computer processor implementing suitable instructions stored on a non-volatile computer-readable medium, and the like. Particular equipment that may be specific to particular refrigerants (e.g., accumulator) also may be included.

Figure 1:
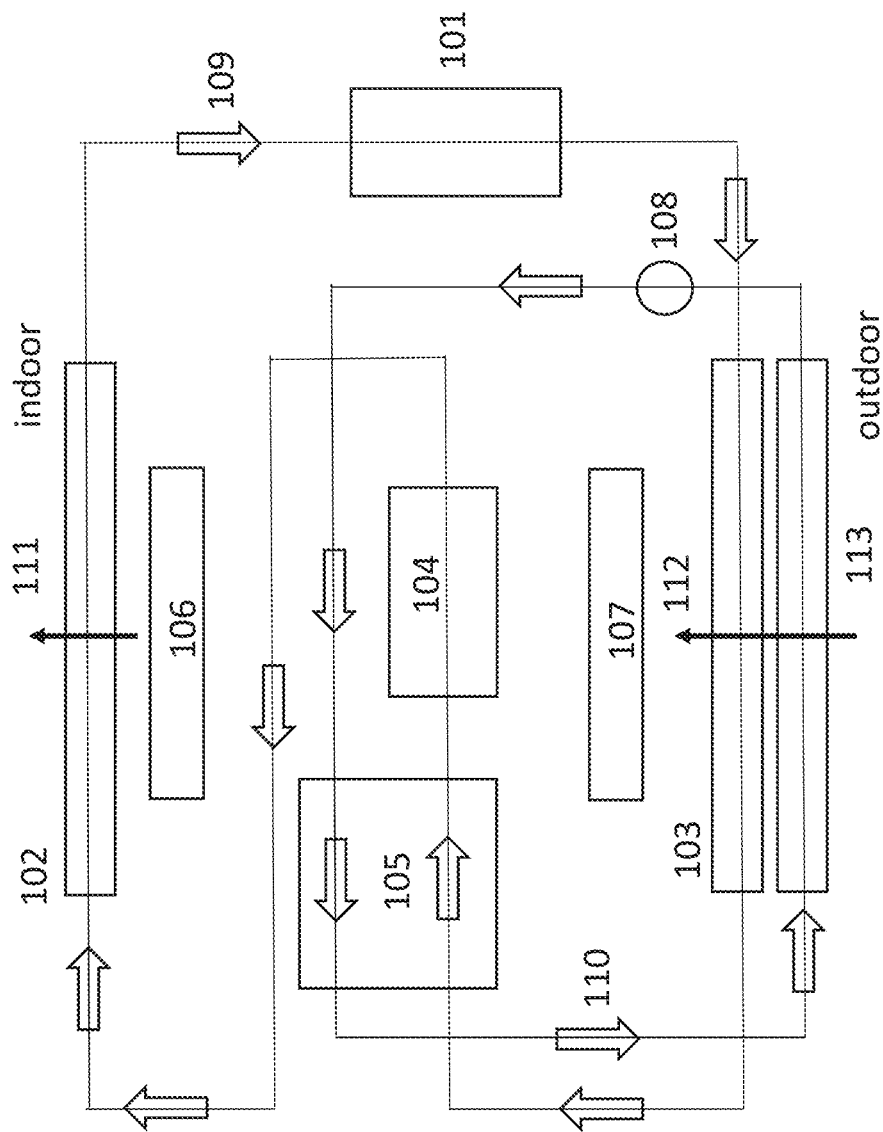
FIG. 1 schematically illustrates an example configuration for a cooling only system with a secondary loop that includes a thermoelectric device where thermoelectric waste heat is rejected to fluid flow before condenser/gas cooler waste heat.

FIG. 1 shows an example configuration of an air conditioning only (cooling only) system. The base configuration includes compressor 101, evaporator (first heat exchanger) 102, condenser or gas cooler (second heat exchanger) 103, expansion valve 104, and liquid-air heat exchanger 113. In some examples, fan 106 forces fluid flow, e.g., air flow 111, across the evaporator 102. In another example (not shown), fan 106 is replaced by another means of providing fluid flow across the evaporator 102. This alternative means can be a pump for example. Air flow 111 can also be replaced by another gaseous or liquid fluid such as water or any other fluid. These alternative fluids and fluid-flow means can replace fan 107 and air flow 112 as well and also replace other instances of fans and air flow in other figures in this specification. Natural air flow or air flow caused by vehicle motion can also be a means of fluid-flow.

Heat exchangers 102, 103, and any other heat exchangers disclosed herein may include any suitable type of heat exchanger known in the art. Such heat exchangers can be but are not limited to refrigerant-to-air or liquid-to-air. Such heat exchangers also can be or include a flat plate or finned heat sink that rejects heat through natural convection. Such plate or finned heat sink may conductively spread the heat to increase heat transfer effectiveness. Such heat exchangers can reject heat to air, water, or any other fluid.

The expansion valve 104 can be any type of expansion valve know in the art, including but not limited to thermostatic and electronic. The compressor 101 can be any type of compressor known in the art including but not limited to constant speed and variable speed. In some examples, fan 107 forces fluid flow, e.g., air flow 112, across the condenser or gas cooler 103 and liquid-air heat exchanger 113. The thermoelectric device 105 is coupled to the refrigerant loop (including tubing configured to hold a refrigerant) 109 downstream of the condenser 103. Expansion valve 104 is configured to expand refrigerant flow downstream of the thermoelectric device 105. The thermoelectric device 105 is a refrigerant-to-coolant device operating in counter-flow in this example configuration. Liquid or coolants in the coolant loop (including tubing configured to hold a coolant liquid) 110 can be a 50%/50% water/ethylene glycol mix or any other coolant known in the art. Pump 108 circulates the coolant through the thermoelectric device 105 and the liquid-air heat exchanger 113. Waste heat is rejected from the thermoelectric device 105 to the liquid-air heat exchanger 113. Waste heat is then rejected to the fluid flow, e.g., air 112 from the liquid-air heat exchanger 113 before the heat from the condenser 103 is rejected to the fluid flow, e.g., air 112. The reverse can also be achieved by changing the fan 107 flow direction. The thermoelectric device 105 can also alternatively be integrated into the condenser/gas cooler 103 where parts of the thermoelectric device 105 can be turned off with other parts of the thermoelectric device 105 remaining on, e.g., using a control system such as described elsewhere herein.

Figure 2:
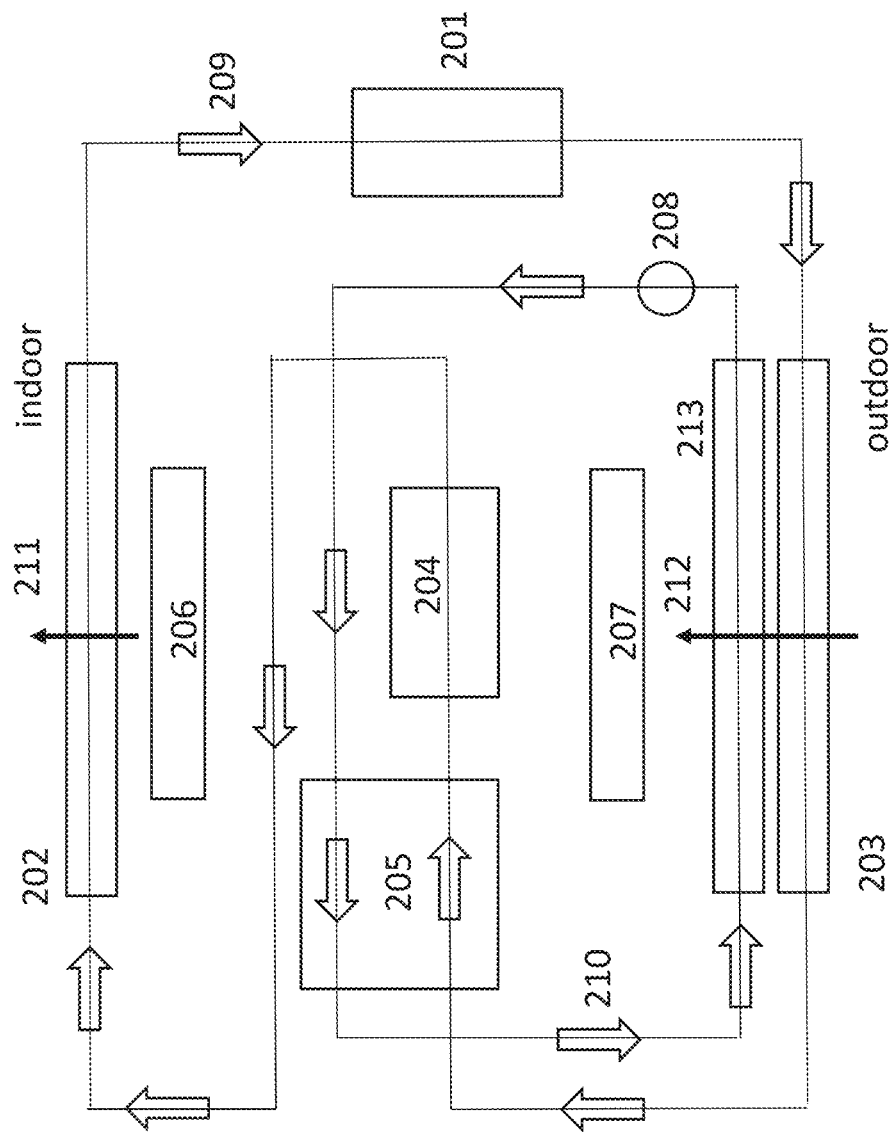
FIG. 2 schematically illustrates an example configuration for a cooling only system with a secondary loop that includes a thermoelectric device where thermoelectric waste heat is rejected to fluid flow after condenser/gas cooler waste heat.

FIG. 2 shows an alternative configuration to FIG. 1 where liquid-air heat exchanger 213 and condenser 203 change positions with regards to air flow 212. Now, air flow 212 flows through condenser 203 first and then through liquid-air heat exchanger 213, such that the waste heat is rejected from the condenser 203 to the air flow 212 before waste heat from liquid-air heat exchanger 213 is rejected to air flow 212. This changes the temperature differences in both the refrigerant 209 and coolant 210 loops and can, thus, be optimized for a particular set of operating conditions. Additional components of this configuration may include compressor 201 configured similarly as compressor 101, evaporator 202 configured similarly as evaporator 101, expansion valve 204 configured similarly as expansion valve 104, thermoelectric device 205 configured similarly as thermoelectric device 105, fans 206 and 207 configured similarly as fans 106 and 107, pump 208 configured similarly as pump 108, and a control system such as described elsewhere herein. Air flow 211 may be forced by fan 206 in a similar manner as described with reference to FIG. 1.

Figure 3:
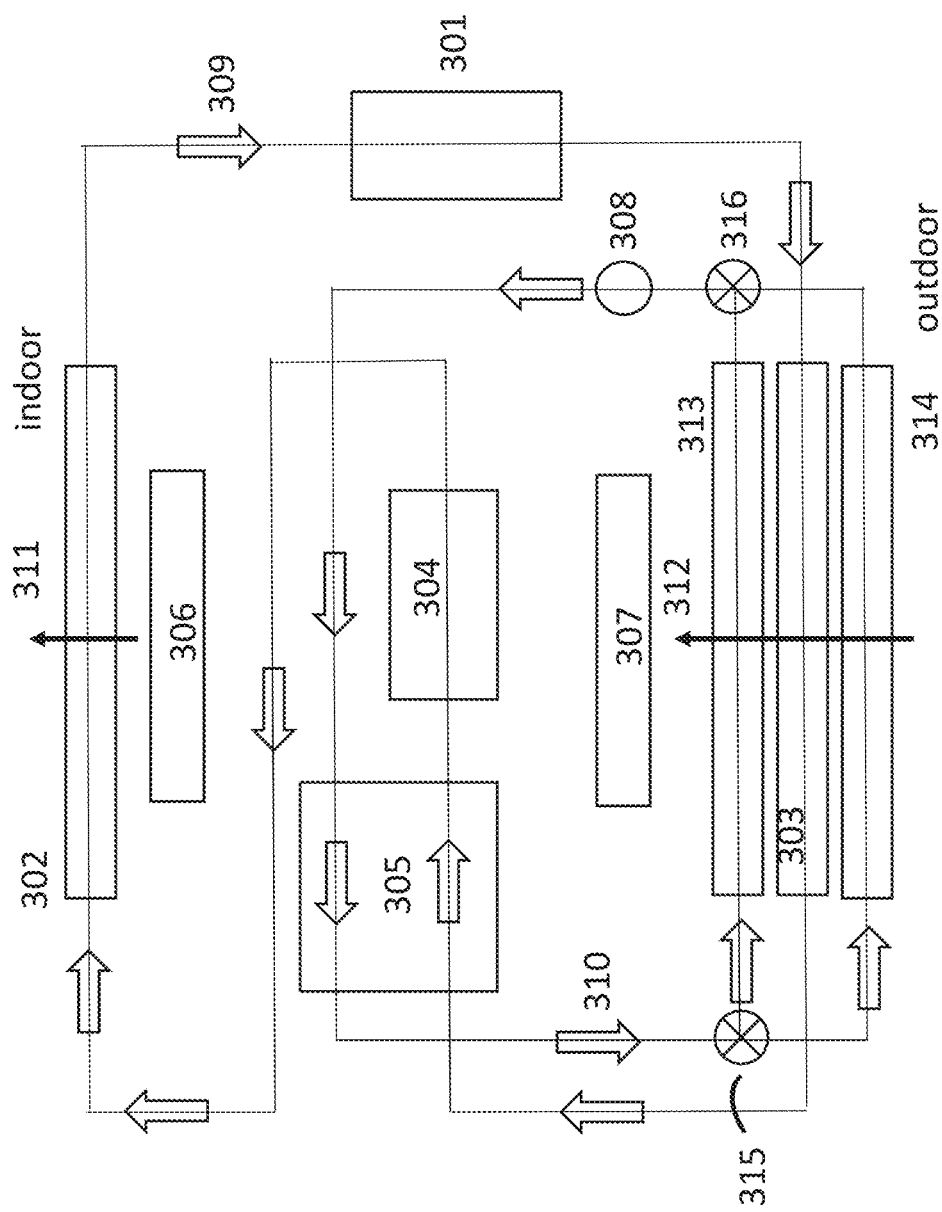
FIG. 3 schematically illustrates an example configuration for a cooling only system with a secondary loop that includes a thermoelectric device where thermoelectric waste heat rejection to fluid flow can be rejected either before or after condenser/gas cooler waste heat.

FIG. 3 shows another alternative configuration to FIGS. 1 and 2 with a second liquid-air heat exchanger 314 and two three-way valves 315 and 316 added. These additions may be used by a control system to switch which loop rejects waste heat to air first, which could be more beneficial one way or the other based on the operating conditions. Three-way valve 315 can direct coolant flow 310 to either liquid-air heat exchanger 313, which would allow waste heat to be rejected from the condenser 303 to air flow 312 first, or to liquid-air heat exchanger 314, which would allow waste heat to be rejected from the condenser 303 to air flow 312 after it is rejected from the liquid air heat exchanger 314. Three-way valve 316 then directs the coolant flow 310 towards the thermoelectric device 305. Additional components of this configuration may include compressor 301 configured similarly as compressor 101, evaporator 302 configured similarly as evaporator 102, expansion valve 304 configured similarly as expansion valve 104, fans 306 and 307 configured similarly as fans 106 and 107, pump 308 configured similarly as pump 108, refrigerant loop 309 configured similarly as refrigerant loop 109, and a control system such as described elsewhere herein. Air flow 311 may be forced by fan 306 in a similar manner as described with reference to FIG. 1.

Figure 4:
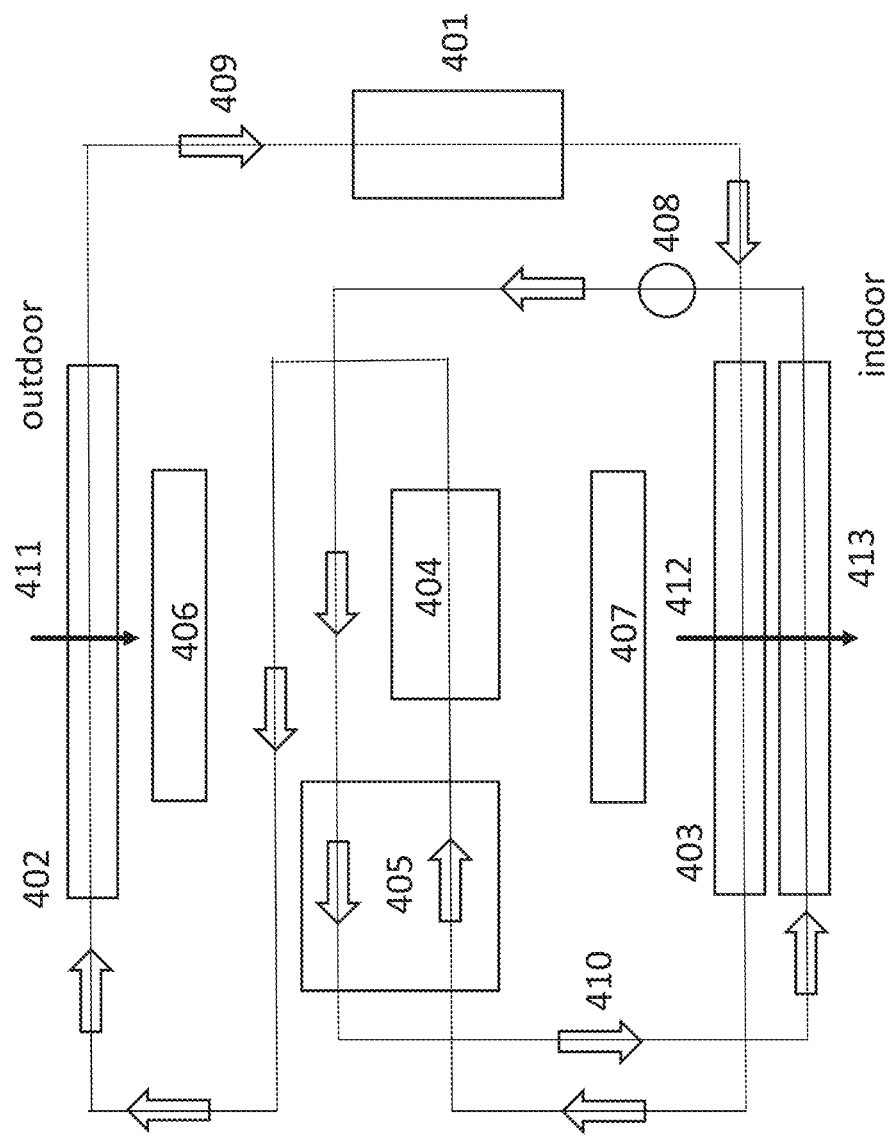
FIG. 4 schematically illustrates an example configuration for a heating only system with a secondary loop that includes a thermoelectric device where thermoelectric waste heat is rejected to fluid flow after condenser/gas cooler waste heat.

FIG. 4 schematically illustrates a similar configuration to FIG. 1. FIG. 4 is an example of a heating only system. The evaporator 402 now sits outdoor and the condenser 403 now sits indoor with the air flow 412 from fan 407 flowing in the opposite direction to that shown in FIG. 1. Waste heat from the coolant loop 410 is rejected to the air flow 412 after waste heat is rejected to the air flow 412 from the refrigerant loop 409. Additional components of this configuration may include compressor 401 configured similarly as compressor 101, expansion valve 404 configured similarly as expansion valve 104, thermoelectric device 405 configured similarly as thermoelectric device 105, fan 406 configured similarly as fan 106, pump 408 configured similarly as pump 108, heat exchanger 413 configured similarly as heat exchanger 113, and a control system such as described elsewhere herein. Air flow 411 may be forced by fan 406 in a similar manner as described with reference to FIG. 1.

Figure 5:
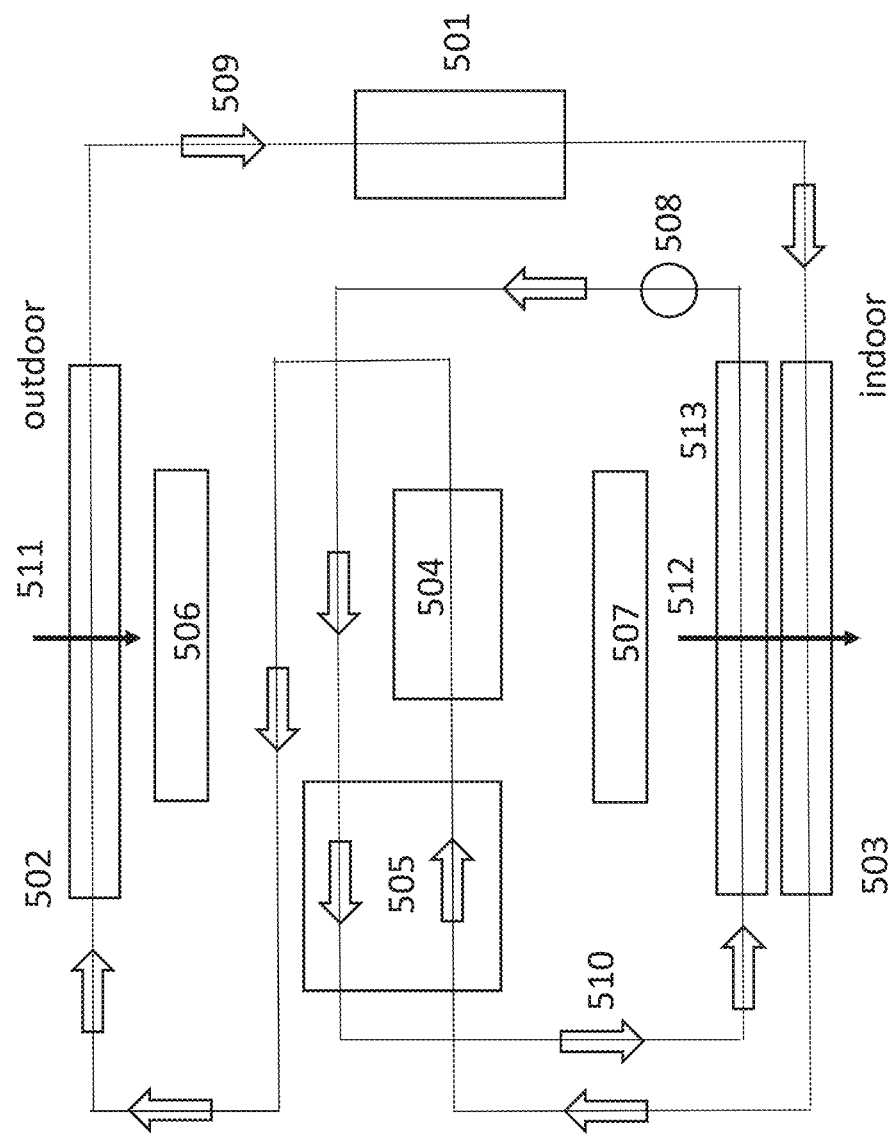
FIG. 5 schematically illustrates an example configuration for a heating only system with a secondary loop that includes a thermoelectric device where thermoelectric waste heat is rejected to fluid flow before condenser/gas cooler waste heat.

FIG. 5 schematically illustrates a similar configuration to FIG. 2. FIG. 5 is an example of a heating only system. The evaporator 502 now sits outdoor and the condenser 503 now sits indoor with the air flow 512 from fan 507 flowing in the opposite direction to that shown in FIG. 2. Waste heat from the coolant loop 510 is rejected to the air flow 512 before waste heat is rejected to the air flow 512 from the refrigerant loop 509. Additional components of this configuration may include compressor 501 configured similarly as compressor 101, expansion valve 504 configured similarly as expansion valve 104, thermoelectric device 505 configured similarly as thermoelectric device 105, fan 506 configured similarly as fan 106, pump 508 configured similarly as pump 108, heat exchanger 513 configured similarly as heat exchanger 113, and a control system such as described elsewhere herein. Air flow 511 may be forced by fan 506 in a similar manner as described with reference to FIG. 1.

Figure 6:
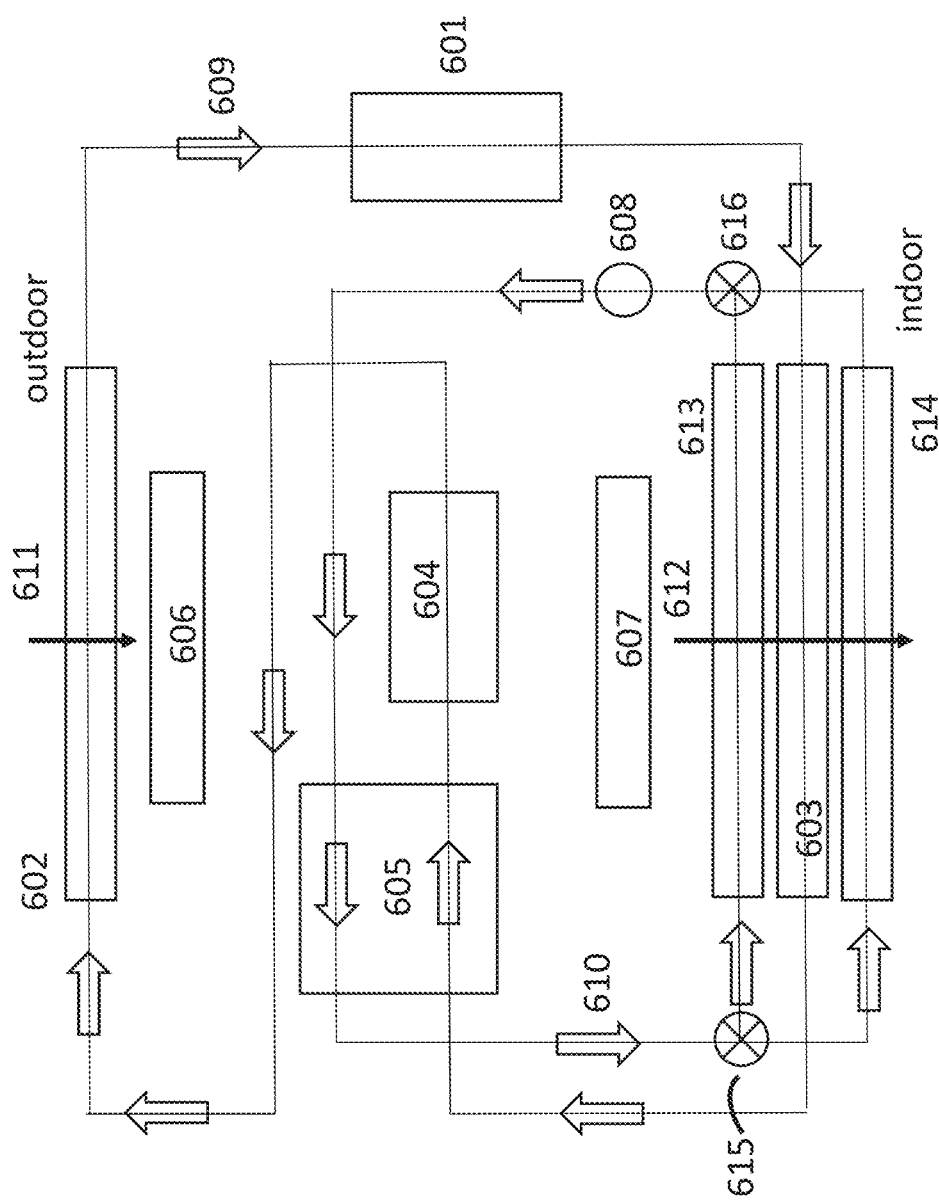
FIG. 6 schematically illustrates an example configuration for a heating only system with a secondary loop that includes a thermoelectric device where thermoelectric waste heat rejection to fluid flow can be rejected either before or after condenser/gas cooler waste heat.

FIG. 6 schematically illustrates a similar configuration to FIG. 3. FIG. 6 is an example of a heating only system. The evaporator 602 now sits outdoor and the condenser 603 now sits indoor with the air flow 612 from fan 607 flowing in the opposite direction to that shown in FIG. 3. Additional components of this configuration may include compressor 601 configured similarly as compressor 101, expansion valve 604 configured similarly as expansion valve 104, thermoelectric device 605 configured similarly as thermoelectric device 105, fan 606 configured similarly as fan 106, pump 608 configured similarly as pump 108, refrigerant loop 609 configured similarly as refrigerant loop 109, coolant loop 610 configured similarly as coolant loop 110, heat exchangers 613 and 614 configured similarly as heat exchangers 313 and 314, three-way valves 615 and 616 configured similarly as three-way valves 315 and 316, and a control system such as described elsewhere herein. Air flow 611 may be forced by fan 606 in a similar manner as described with reference to FIG. 1.

Figure 7:
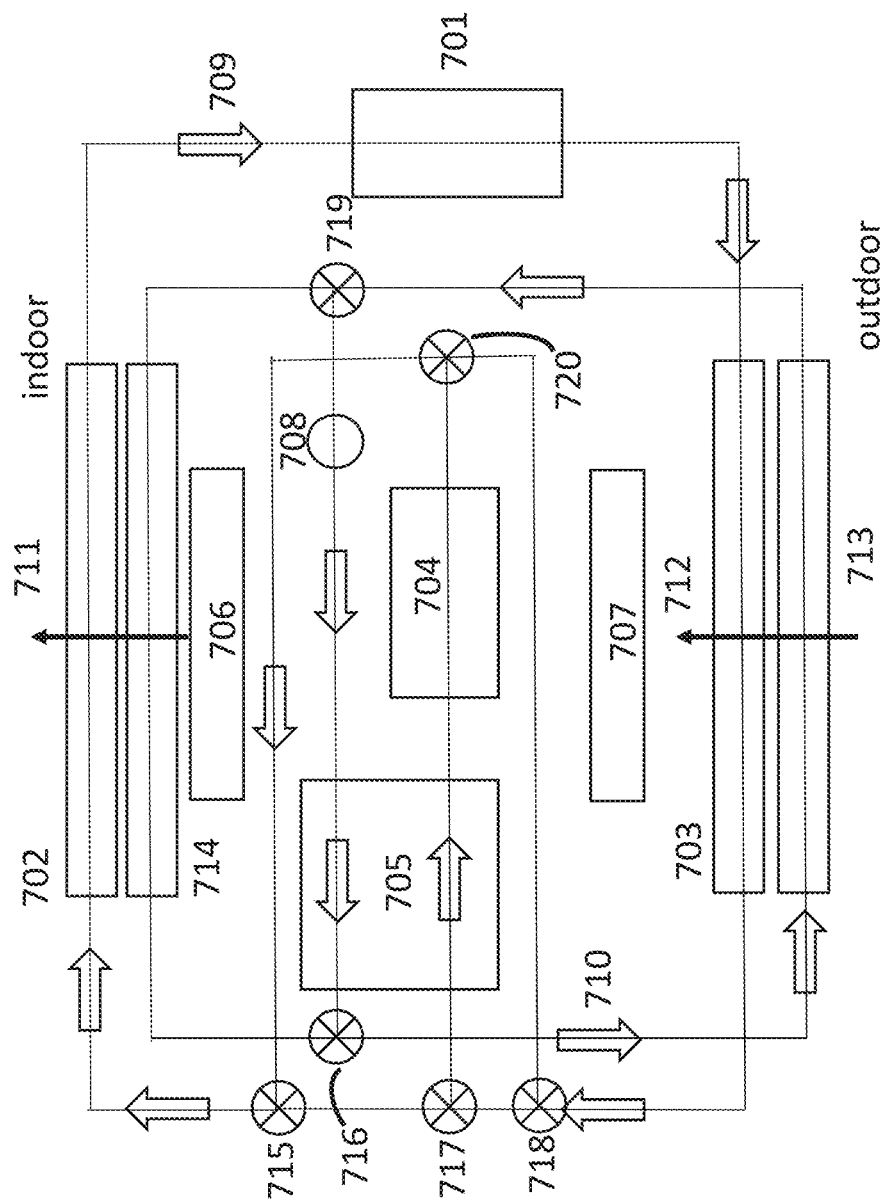
FIG. 7 schematically illustrates an example configuration for a combined cooling and heating system with a secondary loop that includes a thermoelectric device where thermoelectric waste heat is rejected to fluid flow before condenser/gas cooler waste heat.

FIG. 7 shows an example of a combined cooling and heating system. The example illustrated in FIG. 7 builds off of the earlier configurations, adding liquid-air heat exchanger 714 and six three-way valves, 715, 716, 717, 718, 719, and 720, to the components shown in FIG. 1. This configuration allows the system to selectably operate in either air conditioning (cooling) or heating modes. In this configuration, the system is configured to provide heat rejection to air flow 712 from the coolant loop 710 before heat rejection from the refrigerant loop 709. Pump 708 pumps in one direction for cooling mode or another direction for heating mode. Three-way valve 716 is controlled by the control system to direct the coolant flow 710 from the thermoelectric device 705 towards liquid-air heat exchanger 713 in air conditioning mode. Three-way valve 719 then is controlled to direct the coolant flow 710 back to the thermoelectric device 705. In heating mode, three-way valve 716 is controlled to direct the coolant flow 710 from the thermoelectric device 705 towards liquid-air heat exchanger 714 with three-way valve 719 still directing the coolant flow 710 back to the thermoelectric device 705. A four-way valve (not shown in this figure, but shown in FIG. 16) is controlled to appropriately change the direction of the refrigerant flow 709 when operating in either air conditioning or heating modes. In air conditioning mode, three-way valve 718 is controlled to direct the refrigerant flow 709 to thermoelectric device 705 first. In heating mode, three-way valve 718 is controlled to direct the refrigerant flow 709 to the expansion valve 704 first. In air conditioning mode, three-way valve 717 is controlled to direct refrigerant flow 709 from three-way valve 718 to the thermoelectric device 705. In heating mode, three-way valve 717 is controlled to direct refrigerant flow 709 from three-way valve 715 to the thermoelectric device 705. In air conditioning mode, three-way valve 720 is controlled to direct refrigerant flow 709 towards three-way valve 715. In heating mode, three-way valve 720 is controlled to direct refrigerant flow 709 towards three-way valve 718. In air conditioning mode, three-way valve 715 is controlled to direct flow towards evaporator 702. In heating mode, three-way valve 715 is controlled to direct refrigerant flow 709 towards three-way valve 717. The configuration shown in FIG. 7 is operating in air conditioning mode. In heating mode, evaporator 702 (first heat exchanger) becomes the condenser and condenser 703 (second heat exchanger) becomes the evaporator responsive to switching of appropriate components by the control system. Additional components of this configuration may include compressor 701 configured similarly as compressor 101, and fans 706 and 707 configured similarly as fans 106 and 107. Air flow 711 may be forced by fan 706 in a similar manner as described with reference to FIG. 1.

Figure 8:
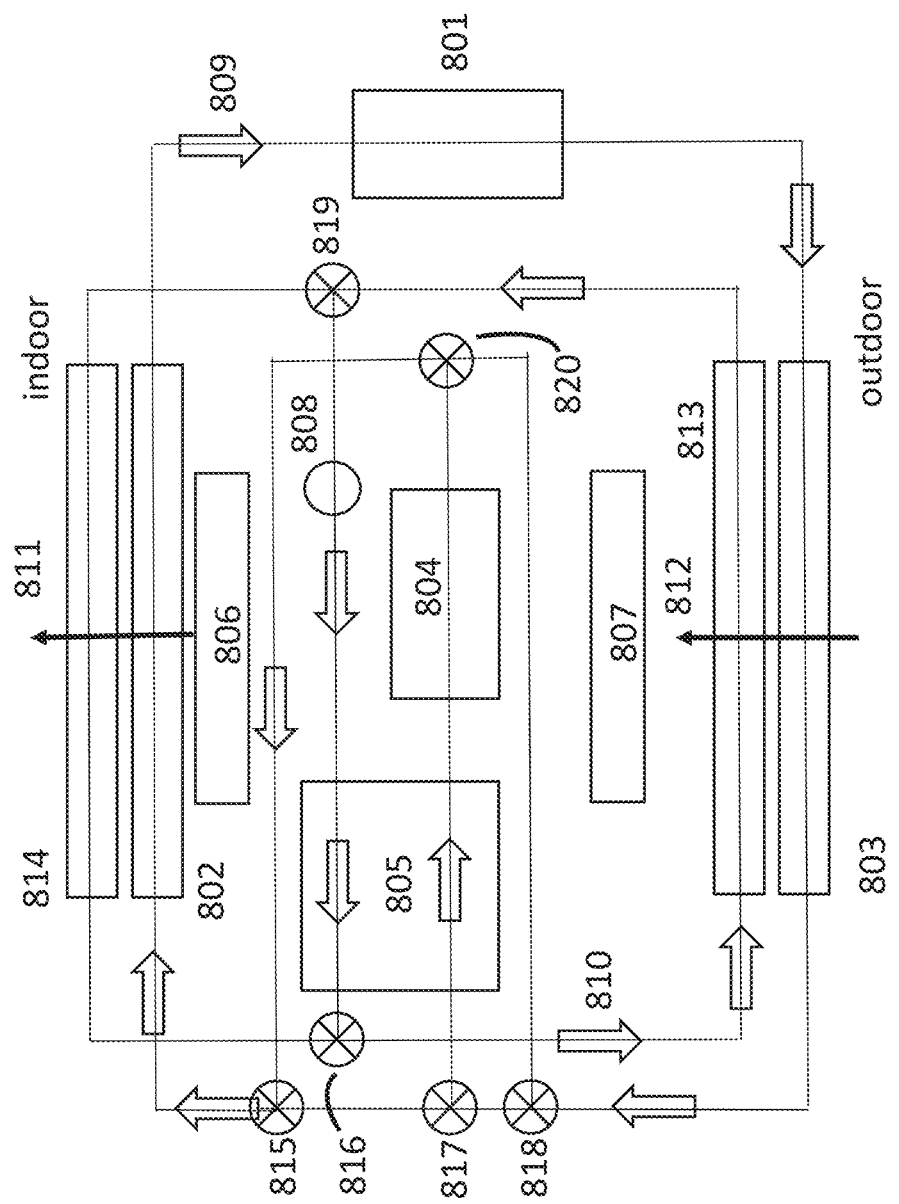
FIG. 8 schematically illustrates an example configuration for a combined cooling and heating system with a secondary loop that includes a thermoelectric device where thermoelectric waste heat is rejected to fluid flow after condenser/gas cooler waste heat.

FIG. 8 is configured similarly as FIG. 7 except that heat rejection from the coolant flow 810 to air flow 812 is now after heat rejection from refrigerant flow 809 to air flow 812. The configuration shown in FIG. 8 is operating in air conditioning mode. In heating mode (not shown), heat is rejected from refrigerant flow 809 to air flow 811 before heat is rejected from coolant flow 810 to air flow 811. Additional components of this configuration may include compressor 801 configured similarly as compressor 101, evaporator 802 configured similarly as evaporator 102, condenser/gas cooler 803 configured similarly as condenser/gas cooler 103, expansion valve 804 configured similarly as expansion valve 104, thermoelectric device 805 configured similarly as thermoelectric device 105, fans 806 and 807 configured similarly as fans 106 and 107, pump 808 configured similarly as pump 108, heat exchangers 813 and 814 configured similarly as heat exchangers 713 and 714, three-way valves 815, 816, 817, 818, 819, and 820 configured similarly as three-way valves 715, 716, 717, 718, 719, and 720, and a control system such as described elsewhere herein.

Figure 9:
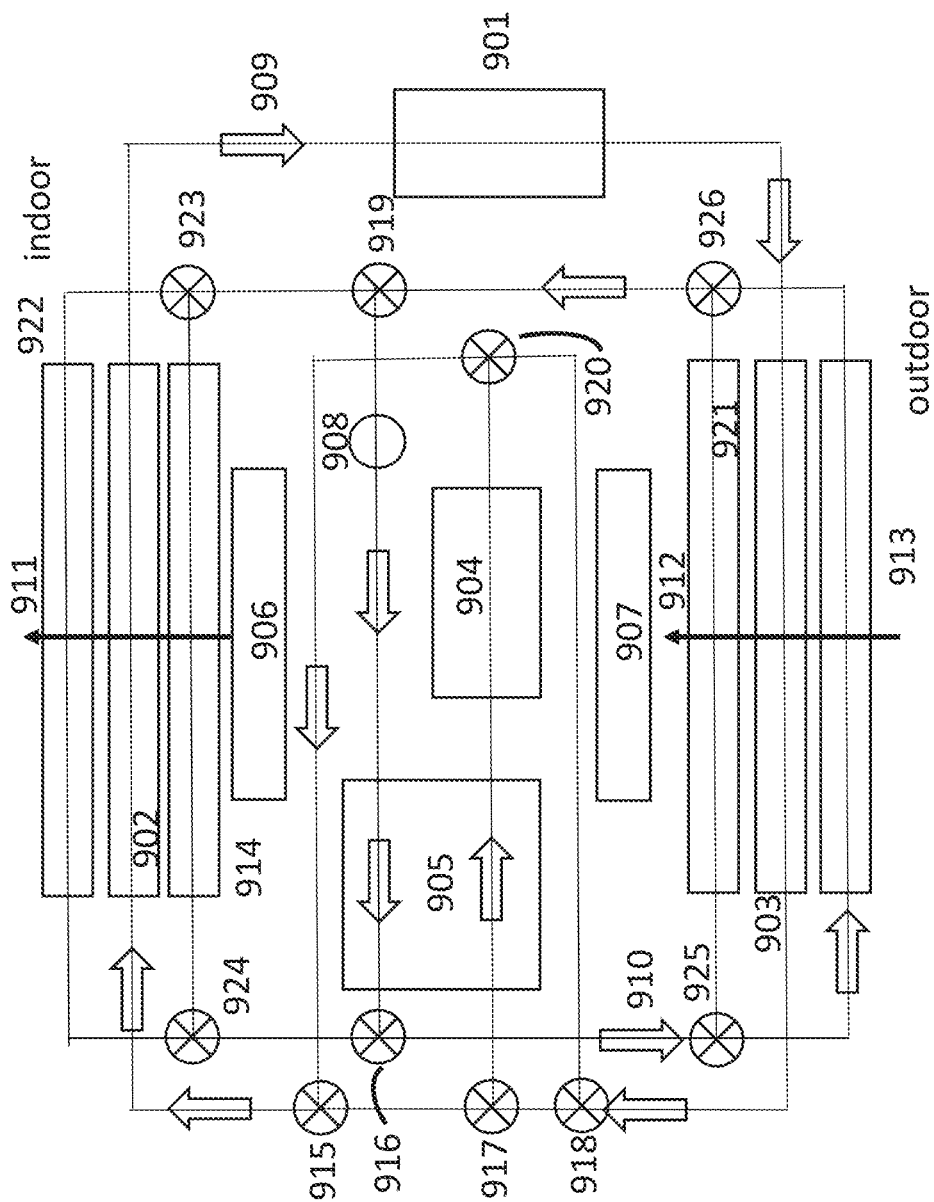
FIG. 9 schematically illustrates an example configuration for a combined cooling and heating system with a secondary loop that includes a thermoelectric device where thermoelectric waste heat rejection to fluid flow can be rejected either before or after condenser/gas cooler waste heat.

FIG. 9 is also configured similarly as FIG. 7. This configuration also allows both air conditioning (as shown) and heating (not shown). This configuration adds two more liquid-air heat exchangers, 921 and 922 and four more three-way valves, 923, 924, 925, and 926. Like in FIG. 7, the additional liquid-air heat exchanger 922 allows the system to reject heat from the coolant loop 909 to the air flow 911 before or after heat is rejected to the air flow 911 from the refrigerant loop 910. Three-way valves 923 and 924 may be controlled to provide this switching between liquid-air heat exchanger 914 and liquid-air heat exchanger 922. Similarly, the addition of liquid-air heat exchanger 921 allows the system to reject heat from the coolant loop 909 to air flow 912 before or after heat is rejected to the air flow 912 from the refrigerant loop 910. Three-way valves 925 and 926 may be controlled to provide this switching between liquid-air heat exchanger 913 and liquid-air heat exchanger 921. Additional components of this configuration may include compressor 901 configured similarly as compressor 101, evaporator 902 configured similarly as evaporator 102, condenser/gas cooler 903 configured similarly as condenser/gas cooler 103, expansion valve 904 configured similarly as expansion valve 104, thermoelectric device 905 configured similarly as thermoelectric device 105, fans 906 and 907 configured similarly as fans 106 and 107, pump 908 configured similarly as pump 108, three-way valves 915, 916, 917, 918, 919, and 920 configured similarly as three-way valves 715, 716, 717, 718, 719, and 720, and a control system such as described elsewhere herein.

Figure 10:
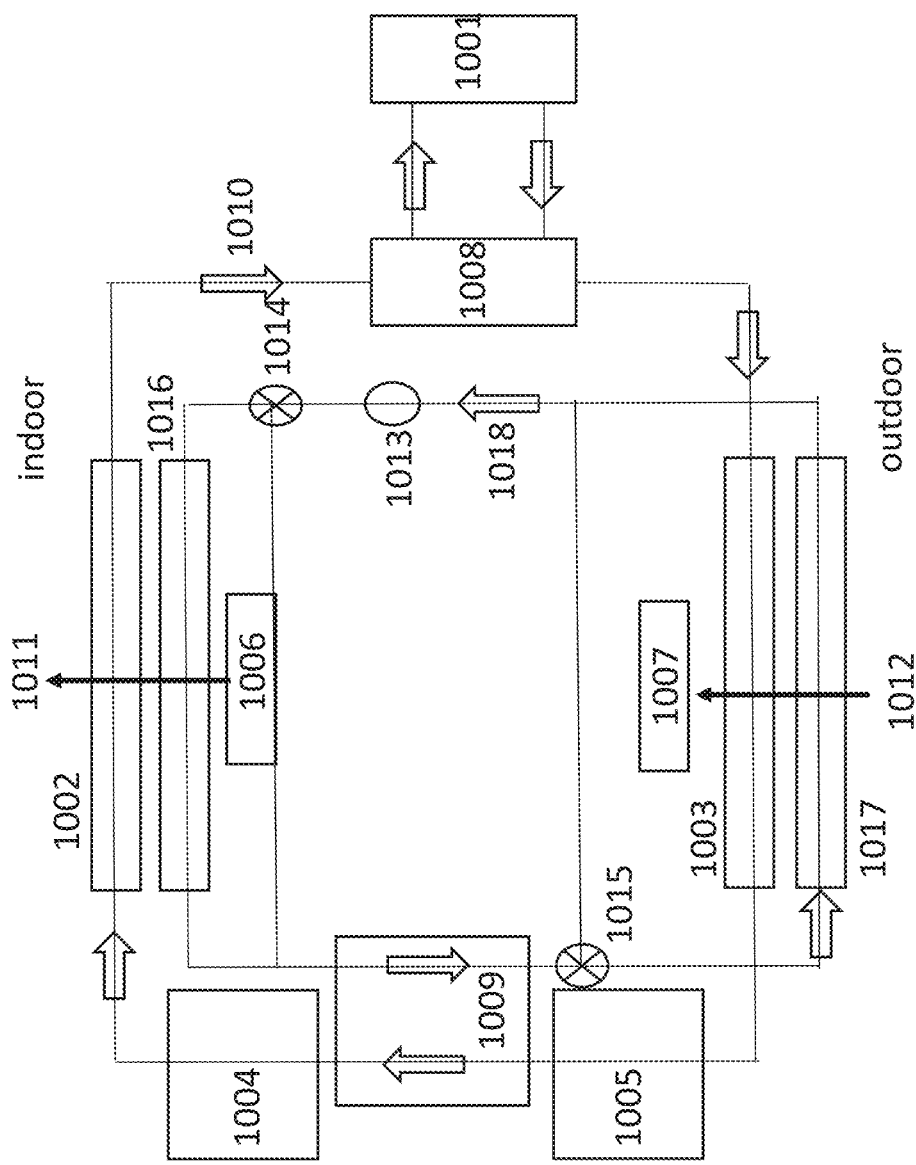
FIG. 10 schematically illustrates an example configuration for a combined cooling and heating system with a secondary loop that includes a thermoelectric device where thermoelectric waste heat is rejected to fluid flow before condenser/gas cooler waste heat that also includes a four-way valve and bi-flow expansion valves.

FIG. 10 shows an example of a combined cooling and heating system in cooling mode. The base configuration includes the compressor 1001, evaporator 1002, condenser or gas cooler 1003, and the bi-flow expansion valves 1004 and 1005. Fan 1006 forces air flow 1011 across the evaporator 1002 and liquid-to-air heat exchanger 1016. Fan 1007 forces air flow 1012 across the condenser or gas cooler 1003 and liquid-to-air heat exchanger 1017. The thermoelectric device 1009 is added to the refrigerant loop 1010 downstream of the condenser 1003. The illustrated configuration may include first and second bi-flow expansion valves 1004 and 1005 respectively disposed on either side of the thermoelectric device 1009 so as to provide for switchable reversal of refrigerant flow and provide the ability to selectively operate the system in both heating and cooling modes. Bi-flow expansion valve 1004 is expanding flow downstream of the thermoelectric device 1009 for cooling mode as shown in the figure. Bi-flow expansion valve 1005 may be fully open in cooling mode. Having two bi-flow expansion valves also may allow for the option of doing a partial expansion before the thermoelectric device 1009 followed by the rest of the expansion. In heating mode, not shown, the refrigerant flow 1010 changes direction and bi-flow expansion valve 1005 provides expansion while bi-flow expansion valve 1004 is full open. Four-way valve 1008 may be used by the control system to switch the direction of the refrigerant flow 1010 without changing the operation of compressor 1001. The thermoelectric device 1009 is a refrigerant-to-liquid device operating in counter-flow or parallel flow in this configuration. Secondary liquid loop 1018 adds further control to the system and provides thermal storage and can help isolate the refrigerant loop 1010 from the passenger compartment. Secondary loop 1018 connects to the thermoelectric device 1009 waste side and/or connects to liquid-to-air heat exchangers 1016 and 1017. A reversing pump 1013 may be used by the control system to reverse the flow direction of the secondary loop. Secondary loop 1018 can use any preferred heat transfer fluid such as water/glycol. Valves 1014 and 1015 help direct the secondary loop 1018 flow to the proper liquid-to-air heat exchanger, either 1016 or 1017. Waste heat is rejected to the air 1012 from liquid-to-air heat exchanger 1017 before the heat from the condenser 1003 is rejected to the air 1012. The reverse can also be achieved by controlling the fan 1007 flow direction. Thermoelectric device heat rejection can also be in parallel to heat rejected from the condenser. In cooling mode, as shown, fan 1006 may be controlled to blow across liquid-to-air heat exchanger 1016 before evaporator 1002, but there is fluid flow in that part of the secondary loop 1018 for this operating mode. In heating mode, not shown, fluid from secondary loop 1018 may be controlled to flow through liquid-to-air heat exchanger 1016 and not to flow through liquid-to-air heat exchanger 1017. Fan 1006 can also be controlled to reverse direction to blow air 1011 across evaporator 1002 before liquid-to-air heat exchanger 1016.

Figure 11:
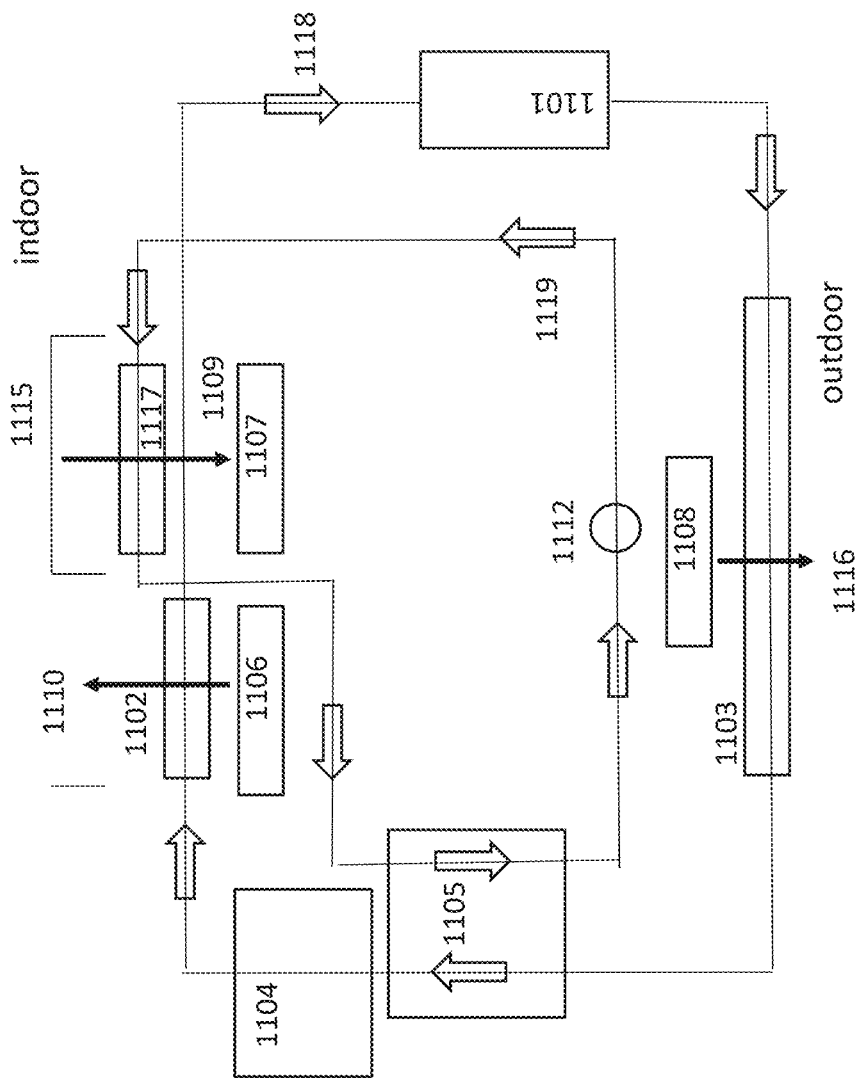
FIG. 11 schematically illustrates an example configuration for a combined cooling and heating system with a secondary loop that includes a thermoelectric device where thermoelectric waste heat to fluid flow is separate from condenser/gas cooler waste heat rejection.

FIG. 11 schematically illustrates an example configuration of a combined cooling and heating system. As shown, the system provides heat rejection from the thermoelectric device 1105 to air 1109 through a secondary liquid loop with coolant flow 1113 separate from condenser 1103 heat rejection. Heating is supplied by the thermoelectric device 1105 only. Separate fans 1106 and 1107 may be used for the evaporator 1102 and the thermoelectric device 1105 that may be controlled to run in both directions, e.g., into and out of the cabin of a vehicle, or into and out of a building. An air handler 1115 may be included for use in separating evaporator 1102 air 1110 and the thermoelectric device 1105 hot air 1109. Additional components of this configuration may include compressor 1101 configured similarly as compressor 101, expansion valve 1104 configured similarly as expansion valve 104, fan 1108 configured similarly as fan 1007, pump 1112 configured similarly as pump 108, heat exchanger 1117 configured similarly as heat exchanger 1016, refrigerant loop 1118 configured similarly as refrigerant loop 109, coolant loop 1119 configured similarly as coolant loop 110, and a control system such as described elsewhere herein.

Figure 12:
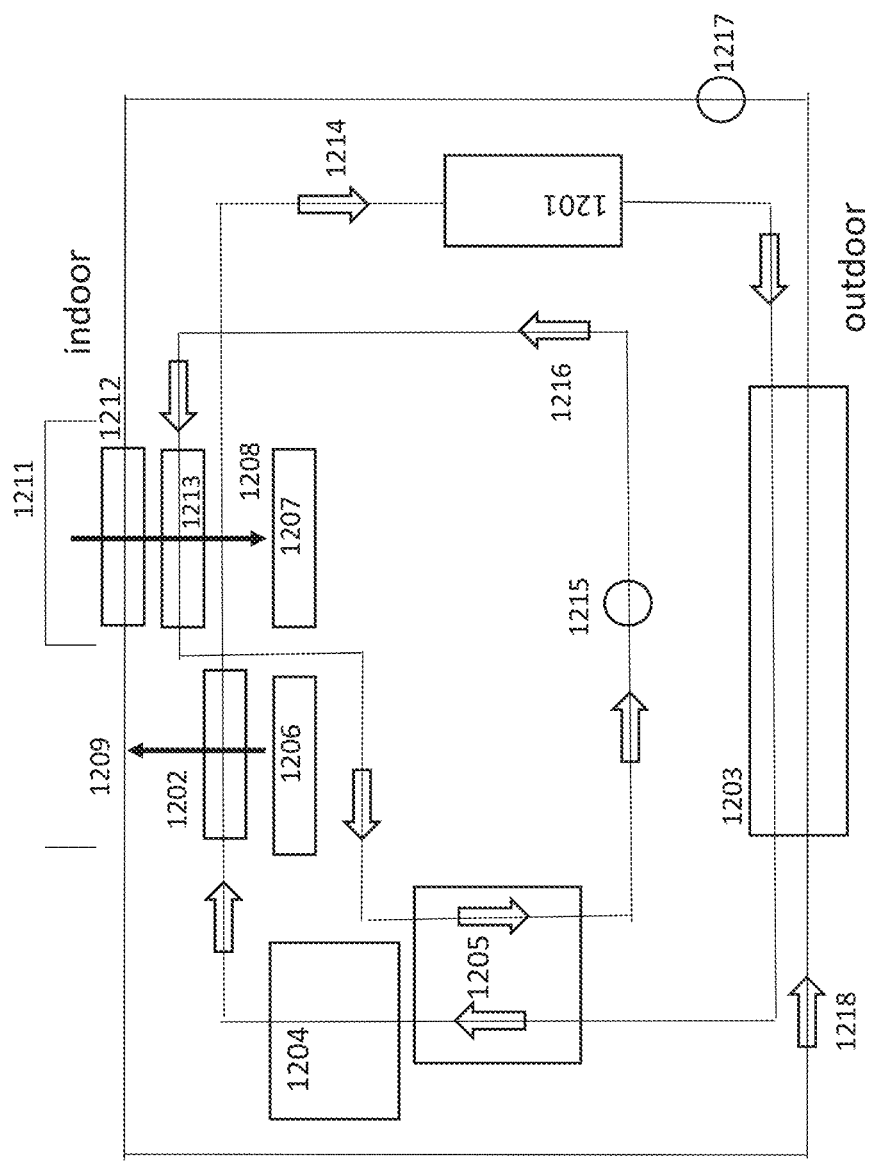
FIG. 12 schematically illustrates an example configuration for a combined cooling and heating system with a secondary loop that includes a thermoelectric device where thermoelectric waste heat is rejected to fluid flow before condenser/gas cooler waste heat that also includes a second coolant loop.

FIG. 12 schematically illustrates another combined cooling and heating system. In this configuration, an additional glycol/water loop with coolant flow 1218 is added with a pump 1217. A separate fan for the condenser 1203 is eliminated. The condenser 1203 may reject heat directly to the secondary liquid (e.g., glycol/water) loop 1218, which carries the heat to an additional liquid/air heat exchanger 1212. Condenser 1203 heat rejection to air can be before (as shown) or after the thermoelectric device 1205 heat rejection to air or in parallel. Air conditioning mode is shown. Heating mode is not shown. For heating mode, the fans 1206 and 1207 may be controlled to reverse directions and the air handler 1211 may be controlled to open on the other side. Additional components of this configuration may include compressor 1201, evaporator 1202, expansion valve 1204, air flows 1208 and 1209, heat exchanger 1213, refrigerant loop 1214, pump 1215, coolant loop 1216, and a control system such as described elsewhere herein.

Figure 13:
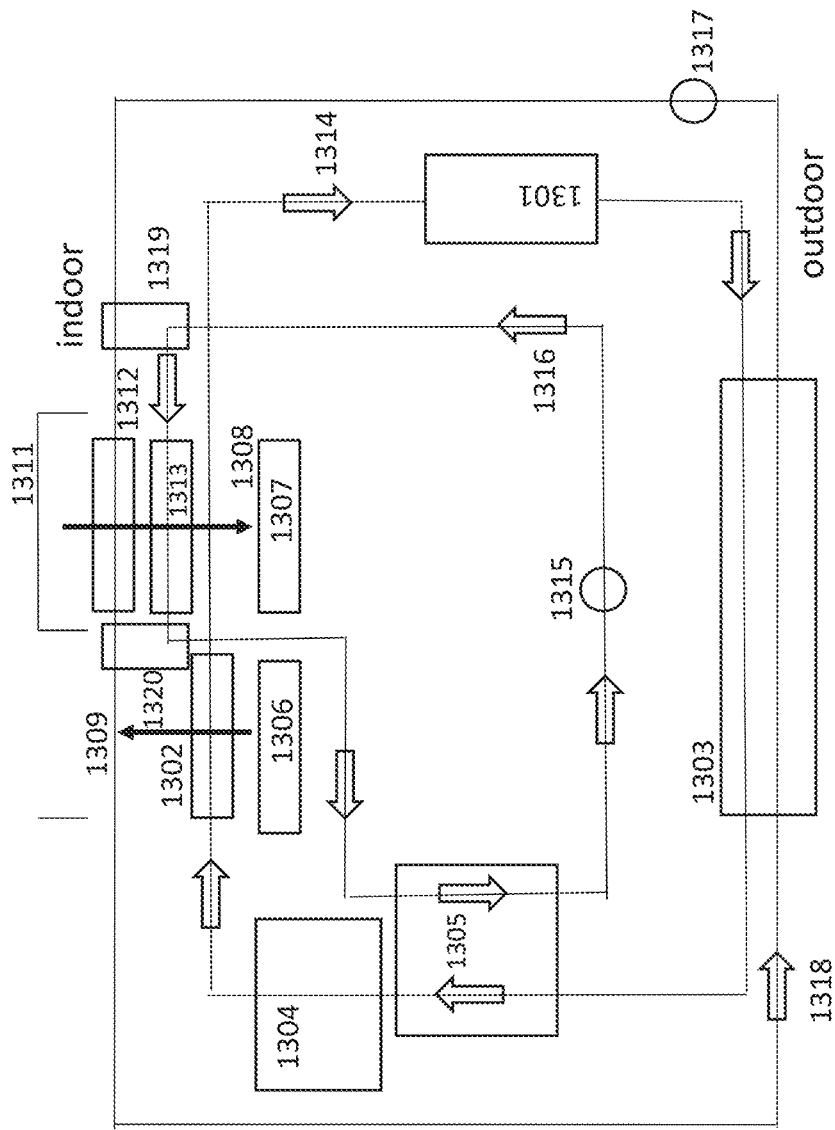
FIG. 13 schematically illustrates an example configuration for a combined cooling and heating system with a secondary loop that includes a thermoelectric device where thermoelectric waste heat rejection to fluid flow can be rejected either before or after condenser/gas cooler waste heat that also includes a second coolant loop.

FIG. 13 is configured similarly as FIG. 12. This configuration adds two more valves 1319 and 1320 which may be used by the control system to switch between the heat being rejected from the thermoelectric device 1305 before condenser 1303 or being rejected after the condenser. The configuration illustrated in FIG. 13 may be controlled to reject heat to air 1308 from the thermoelectric device 1305 before condenser 1303 for air conditioning. The configuration illustrated in FIG. 13 may be controlled to reject heat to air 1308 from the thermoelectric device 1305 after condenser 1303 for heating. Additional components of this configuration may include compressor 1301 configured similarly as compressor 101, evaporator 1302 configured similarly as evaporator 102, expansion valve 1304 configured similarly as expansion valve 104, fans 1306 and 1307 configured similarly as fans 1206 and 1207, air handler 1311 configured similarly as air handler 1211, heat exchangers 1312 and 1313 configured similarly as heat exchangers 1212 and 1213, refrigerant loop 1314 configured similarly as refrigerant loop 109, pumps 1315 and 1317 configured similarly as pump 108, coolant loops 1316 and 1318 configured similarly as coolant loops 1216 and 1218, and a control system such as disclosed elsewhere herein. Air flow 1309 may be forced by fan 1306 in a similar manner to how air flow 1308 is forced by fan 1307.

Figure 14:
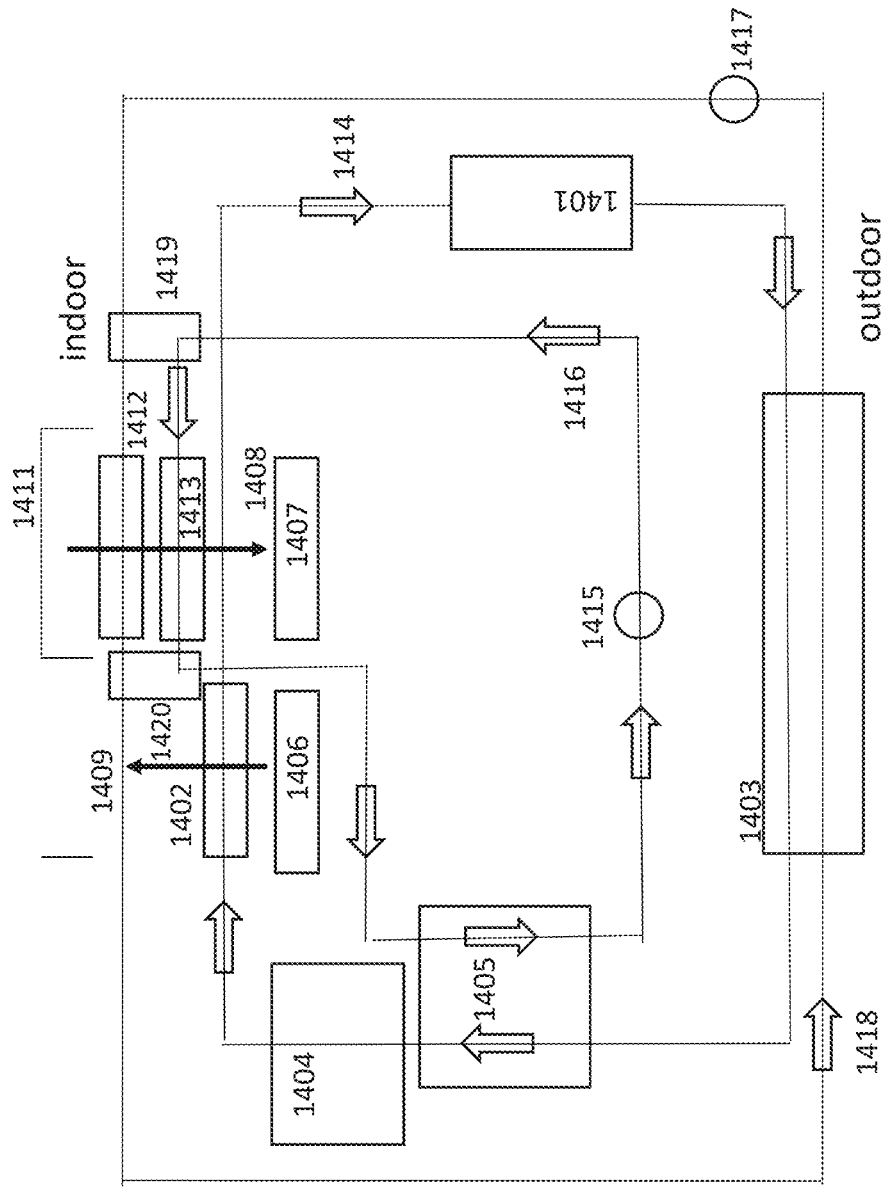
FIG. 14 schematically illustrates an example configuration for a combined cooling and heating system with a secondary loop that includes a thermoelectric device where thermoelectric waste heat rejection to fluid flow can be rejected either before or after condenser/gas cooler waste heat that also includes a second coolant loop.

FIG. 14 is configured similarly as FIG. 13. In the configuration illustrated in FIG. 14, heat may be controlled to be rejected to air 1408 from the thermoelectric device 1405 after condenser 1403 in air conditioning mode. In the configuration illustrated in FIG. 14, heat may be controlled to be rejected to air 1408 from the thermoelectric device 1405 before condenser 1403 in heating mode. Additional components of this configuration may include compressor 1401 configured similarly as compressor 101, evaporator 1402 configured similarly as evaporator 102, expansion valve 1404 configured similarly as expansion valve 104, fans 1406 and 1407 configured similarly as fans 1306 and 1307, air handler 1411 configured similarly as air handler 1311, heat exchangers 1412 and 1413 configured similarly as heat exchangers 1312 and 1313, refrigerant loop 1414 configured similarly as refrigerant loop 1314, pumps 1415 and 1417 configured similarly as pumps 1315 and 1317, coolant loops 1416 and 1418 configured similarly as coolant loops 1316 and 1318, valves 1419 and 1420 configured similarly as valves 1319 and 1320, and a control system such as disclosed elsewhere herein. Air flow 1409 may be forced by fan 1406 in a similar manner to how air flow 1408 is forced by fan 1407.

Figure 15:
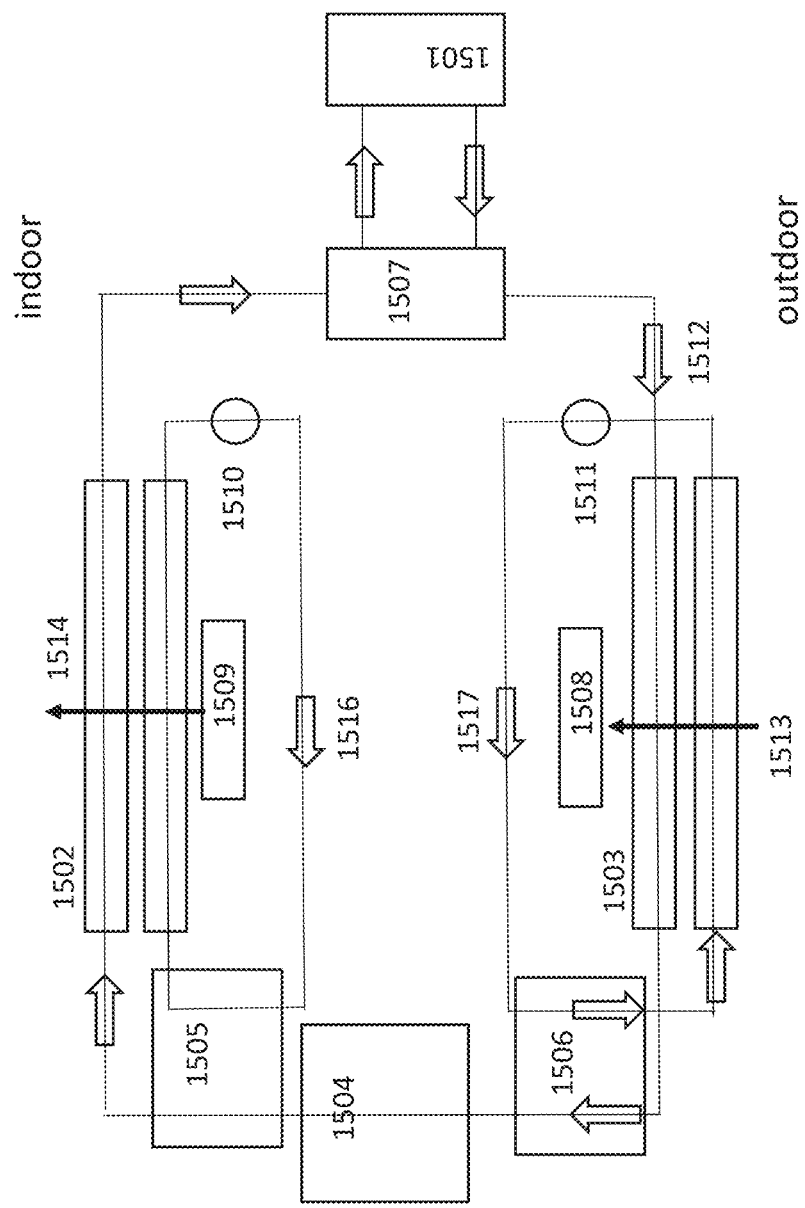
FIG. 15 schematically illustrates an example configuration for a combined cooling and heating system with a secondary loop that includes a split thermoelectric device where thermoelectric waste heat is rejected to fluid flow before condenser/gas cooler waste heat that also includes a four-way valve and bi-flow expansion valves.

FIG. 15 schematically illustrates another combined cooling and heating system. In this configuration, the system may be controlled such that heat is rejected from the thermoelectric devices 1505 and/or 1506 to air 1513 or 1514 before refrigerant 1512 waste heat rejection to air 1513 or 1514. The heat rejected from the thermoelectric device 1505 can also be after refrigerant 1512 or in parallel. This configuration may include two thermoelectric devices 1505 and 1506 (one on each side of the bi-flow expansion valve 1504). Each thermoelectric device 1505 and 1506 selectively may be either on or off, responsive to control by a control system, depending on whether system is in air conditioning or heating mode. The configuration illustrated in FIG. 15 may eliminate two 3-way valves, a bi-flow expansion valve, and a reversing pump and replace such elements with the two thermoelectric devices 1505 and 1506 with two secondary liquid (e.g., glycol/water) loops 1515 and 1516 (each with a standard pump 1510 and 1511). Half of the thermoelectric device 1505 or 1506 that is turned "off" can also be turned "on" by the control system, and additional means (such as a secondary liquid loop) for directing thermoelectric waste heat may be included. The control system may be used to control the thermoelectric devices 1505 and/or 1506 to switch whether to be upstream or downstream of the condenser/gas cooler 1503. In air conditioning mode, coolant loop 1517 and pump 1511 are controlled to be operating. In heating mode, coolant loop 1516 and pump 1510 are controlled to be operating. In heating mode, evaporator 1502 (first heat exchanger) becomes the condenser and condenser 1503 (second heat exchanger) becomes the evaporator responsive to appropriate controls by the control system. Additional components of this configuration mays include compressor 1501 configured similarly as compressor 101, four-way valve 1507 configured similarly as four-way valve 1008, and fans 1508 and 1509 configured similarly as fans 106 and 107.

Figure 16:
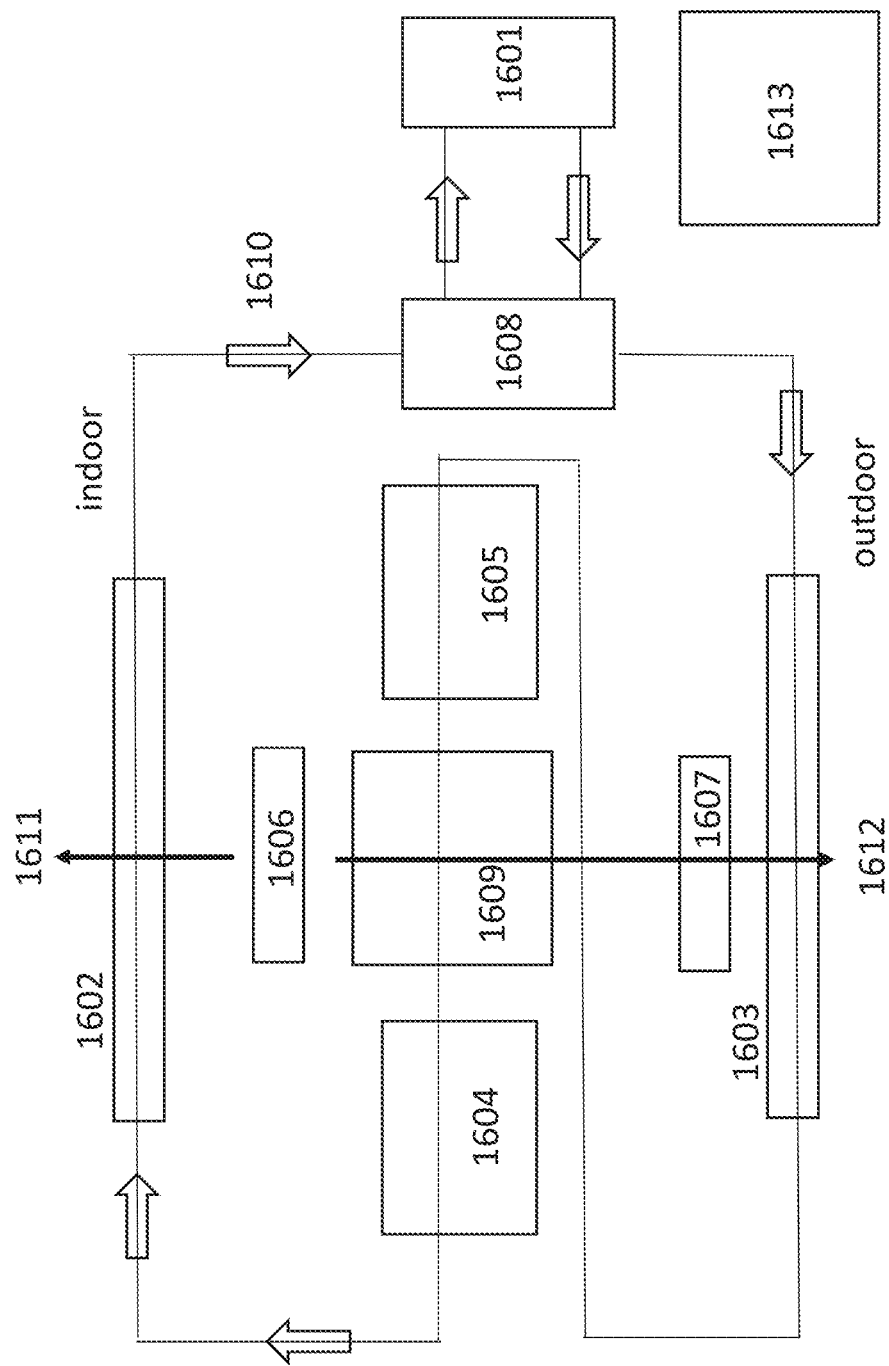
FIG. 16 schematically illustrates an example configuration for a combined cooling and heating system with a primary loop only that includes a thermoelectric device where thermoelectric waste heat is rejected to fluid flow before condenser/gas cooler waste heat that also includes a four-way valve and bi-flow expansion valves.

FIG. 16 shows an example of the combined cooling and heating system in cooling mode. The base configuration includes the compressor 1601, evaporator 1602, condenser or gas cooler 1603, and the bi-flow expansion valves 1604 and 1605. Fan 1606 forces air flow 1611 across the evaporator 1602. Fan 1607 forces air flow 1612 across the condenser or gas cooler 1603. The thermoelectric device 1609 is added to the refrigerant loop 1610 downstream of the condenser 1603. Evaporator 1602 (first heat exchanger), condenser or gas cooler 1603 (second heat exchanger), and any other heat exchangers disclosed herein may include any suitable type of heat exchanger known in the art. Such heat exchangers can be but are not limited to refrigerant-to-air or liquid-to-air. Such heat exchangers also can be or include a flat plate or finned heat sink that rejects heat through natural convection. Such plate or finned heat sink may conductively spread the heat to increase heat transfer effectiveness. Such heat exchangers can reject heat to air, water, or any other fluid.

This configuration may include bi-flow expansion valves 1604 and 1605 on either side of the thermoelectric device 1609 in order the reversal of refrigerant flow and provide the ability to operate the system in both heating and cooling modes. Bi flow expansion valve 1604 is expanding flow downstream of the thermoelectric device 1609 for cooling mode as shown in the figure. While bi-flow expansion valve 1605 is full open in cooling mode. Having two bi-flow expansion valves also enables the possibility of doing a partial expansion before the thermoelectric device 1609 followed by the rest of the expansion. In heating mode, not shown, the refrigerant flow 1610 changes direction and bi-flow expansion valve 1605 provides expansion while bi-flow expansion valve 1604 is full open. 4-way valve 1608 enables the refrigerant flow 1610 direction to change without changing the operation of compressor 1601. The thermoelectric device 1609 is a refrigerant-to-air device operating in cross-flow in this configuration. Waste heat is rejected to the air 1612 from the thermoelectric device 1609 before the heat from the condenser 1603 is rejected to the air 1612. The reverse can also be achieved by changing the fan 1607 flow direction. FIG. 16 shows operation in air conditioning mode. In heating mode, evaporator 1602 becomes the condenser and condenser 1603 becomes the evaporator. In heating mode, fan 1606 pulls air across the thermoelectric device 1609 and fan 1607 does not. Control system 1613 provides electronic control of at least the thermoelectric device 1609, the 4-way valve 1608, and the compressor 1601. Control system 1613 can also control the bi-flow expansion valves 1604 and 1605 if they are electronically controlled. Similar control systems are also included in FIGS. 1-15, 17-23, and 32-40 but are not directly shown in those figures.

Figure 17:
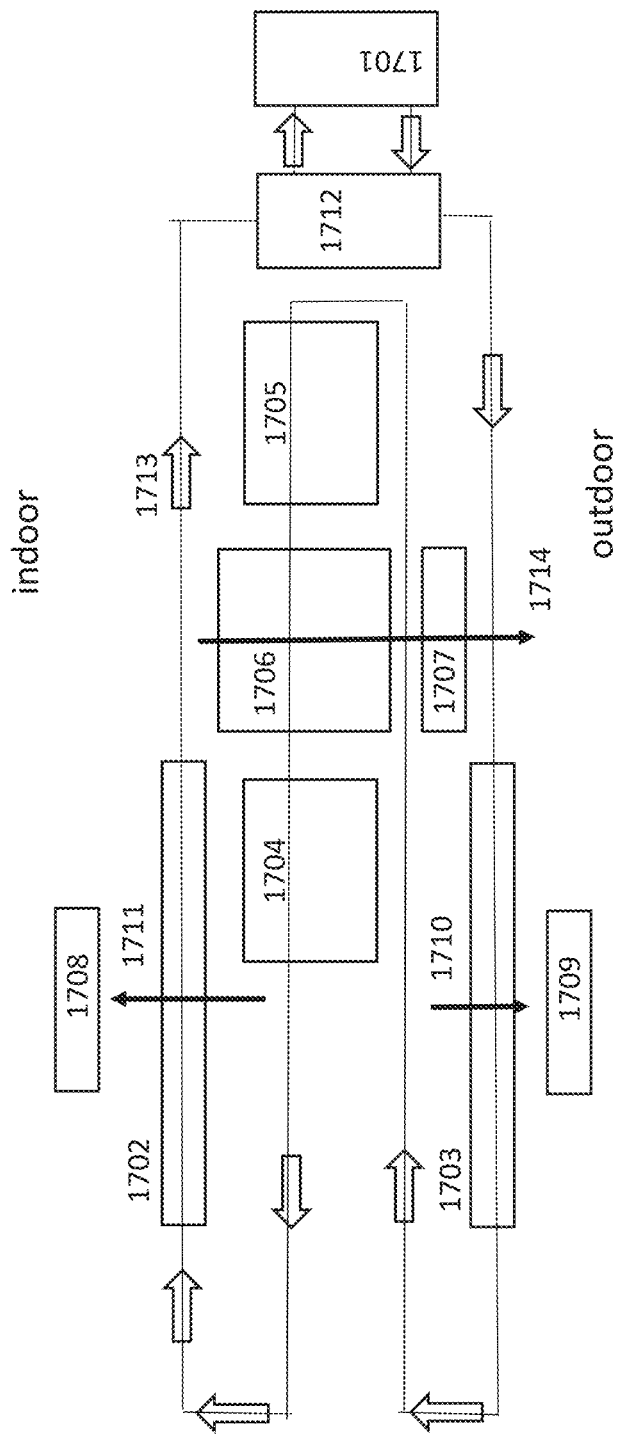
FIG. 17 schematically illustrates an example configuration for a combined cooling and heating system with a primary loop only that includes a thermoelectric device where thermoelectric waste heat is rejected to fluid flow parallel to condenser/gas cooler waste heat.

FIG. 17 schematically illustrates another combined HVAC configuration. In this configuration, the system has heat rejected from the thermoelectric device 1706 to air 1714 in parallel to heat rejection to air 1710 from condenser 1703. The thermoelectric device 1706 is a refrigerant-to-air device in a cross-flow configuration. No additional glycol/water loop with pump is needed. An additional fan 1707 is needed for thermoelectric device heat rejection. FIG. 17 shows operation in air conditioning mode. In heating mode, evaporator 1702 becomes the condenser and condenser 1703 becomes the evaporator. In heating mode, refrigerant flow 1713 reverses direction enabled by 4-way valve 1712. In air conditioning mode, bi-flow expansion valve 1704 is metering while bi-flow expansion valve 1705 is full open. The opposite is the case when in heating mode. In heating mode, fan 1707 reverses direction. Additional components of this configuration include compressor 1701 similar to compressor 101 and fans 1708 and 1709 similar to fans 106 and 107. Air flow 1711 is forced by fan 1708 in a similar manner as described with reference to FIG. 1.

Figure 18:
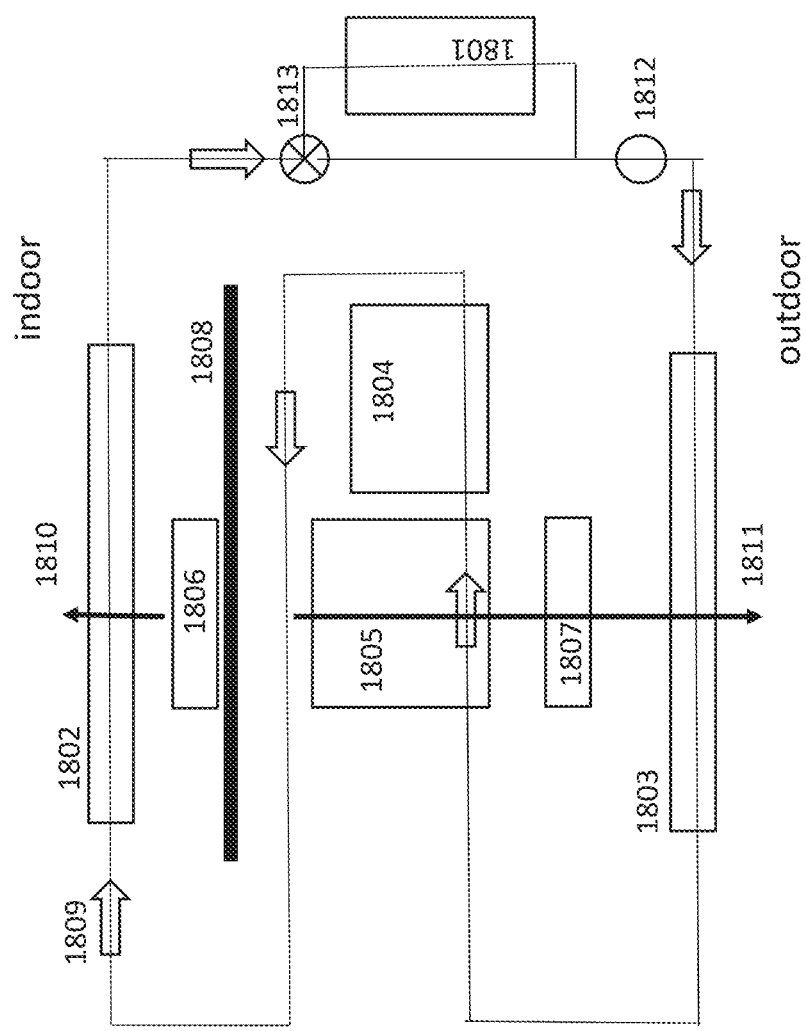
FIG. 18 schematically illustrates an example configuration for a combined cooling and heating system with a primary loop only that includes a thermoelectric device where thermoelectric waste heat is rejected to fluid flow before condenser/gas cooler waste heat that also includes an fluid handling valve.

FIG. 18 schematically illustrates another combined HVAC system. The thermoelectric device 1805 is a refrigerant-to-air device in a cross-flow configuration. No additional glycol/water loop with pump is needed. Air handling valve 1808 is closed (as shown) to separate cooled air from heated air in air conditioning mode with pump 1812 off. Compressor 1801 is turned "off" and bypassed, and pump 1812 is operated to circulate refrigerant 1809 as the coolant loop for the thermoelectric device 1805 in heating mode (not shown) with air handling valve 1808 open (not shown) to allow heat rejected from the thermoelectric device 1805 to air 1810 to inside. Outdoor fan 1807 is "off" and expansion valve 1804 is full open as refrigerant loop 1809 functions only as a coolant loop for the thermoelectric device 1805. Additional components of this configuration include evaporator 1802 similar to evaporator 102, condenser/gas cooler 1803 similar to condenser/gas cooler 103, fan 1806 similar to fan 106, and three-way valve 1813 similar to three-way valve 1014. Air flow 1811 is forced by fan 1807 in a similar manner as described with reference to FIG. 1.

Figure 19:
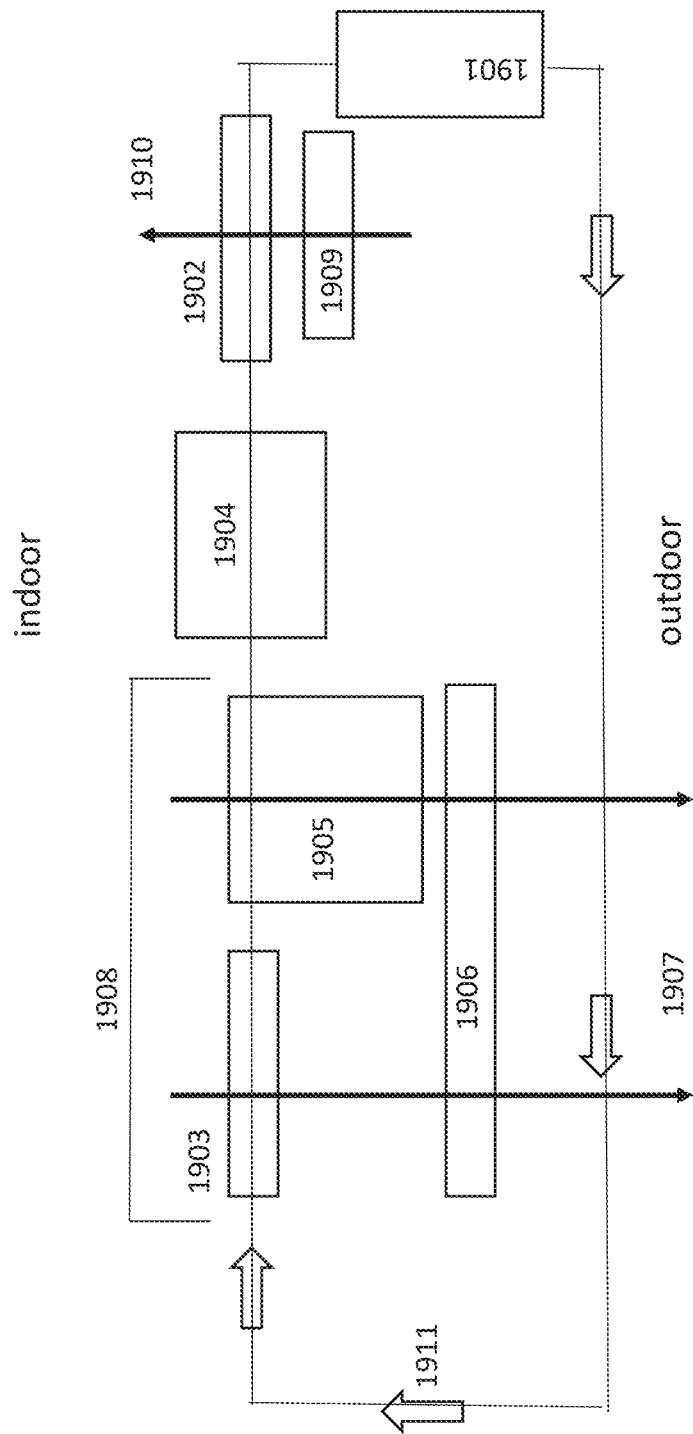
FIG. 19 schematically illustrates an example configuration for a combined cooling and heating system with a primary loop only that includes a thermoelectric device where thermoelectric waste heat is rejected to fluid flow parallel to condenser/gas cooler waste heat that also includes an fluid handling valve.

FIG. 19 schematically illustrates another combined HVAC system. In this configuration, the system has heat rejected from the thermoelectric device 1905 to air 1907 in parallel to heat rejection to air 1907 from condenser 1903. The thermoelectric device 1905 is a refrigerant-to-air device in a cross-flow configuration. No additional glycol/water loop with pump is needed. An air handling valve 1908 may be needed to block heat rejection air flow from inside. Fans 1906 and 1909 are reversible. Air conditioning mode is shown. For heating mode, air handler 1908 moves to cover evaporator 1902 and opens up air flow 1907 indoors from thermoelectric device 1905 and condenser/gas cooler 1903. In heating mode, fans 1906 and 1909 switch flow direction. Additional components of this configuration include compressor 1901 similar to compressor 101, expansion valve 1904 similar to expansion valve 104, and refrigerant flow 1911 similar to refrigerant flow 109. Air flow 1910 is forced by fan 1909 in a similar manner as described with reference to FIG. 1.

Figure 20:
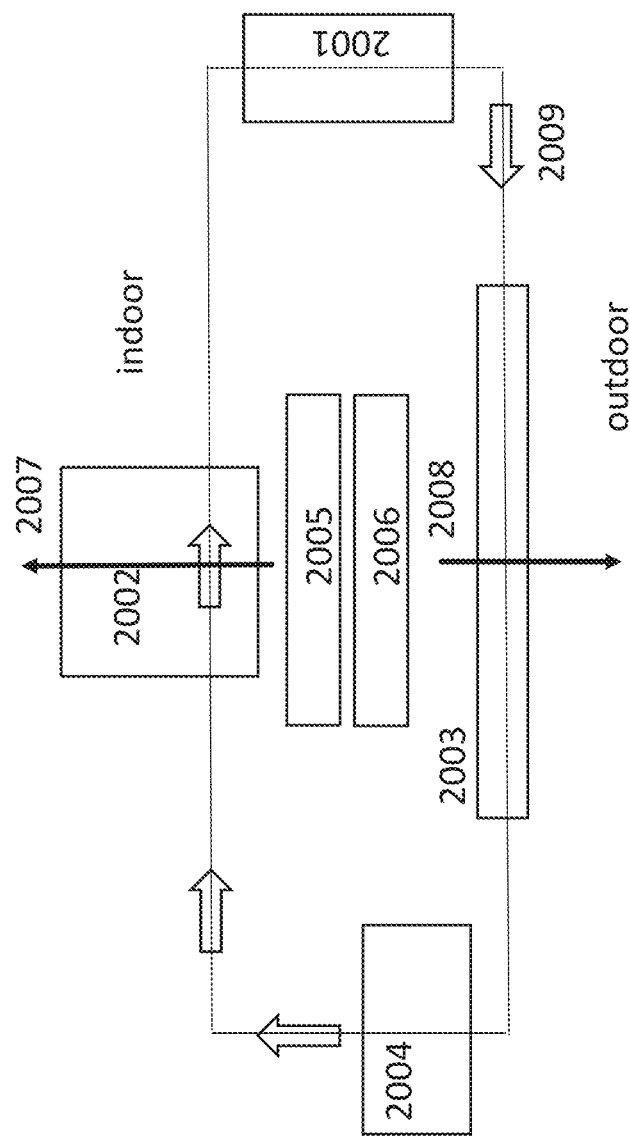
FIG. 20 schematically illustrates an example configuration for a cooling only system with a primary loop only that includes a thermoelectric device as a second stage.

FIG. 20 schematically illustrates another air conditioning only configuration, where the thermoelectric device 2002 is added to the basic vapor compression cycle for air conditioning as a second stage. The thermoelectric device 2002 in this configuration is refrigerant to air. Additional components of this configuration include compressor 2001 similar to compressor 101, condenser/gas cooler 2003 similar to condenser/gas cooler 103, expansion valve 2004 similar to expansion valve 104, fans 2005 and 2006 similar to fans 106 and 107, and refrigerant flow 2009 similar to refrigerant flow 109. Air flows 2007 and 2008 are forced by fan 2005 and 2006 in a similar manner as described with reference to FIG. 1.

Figure 21:
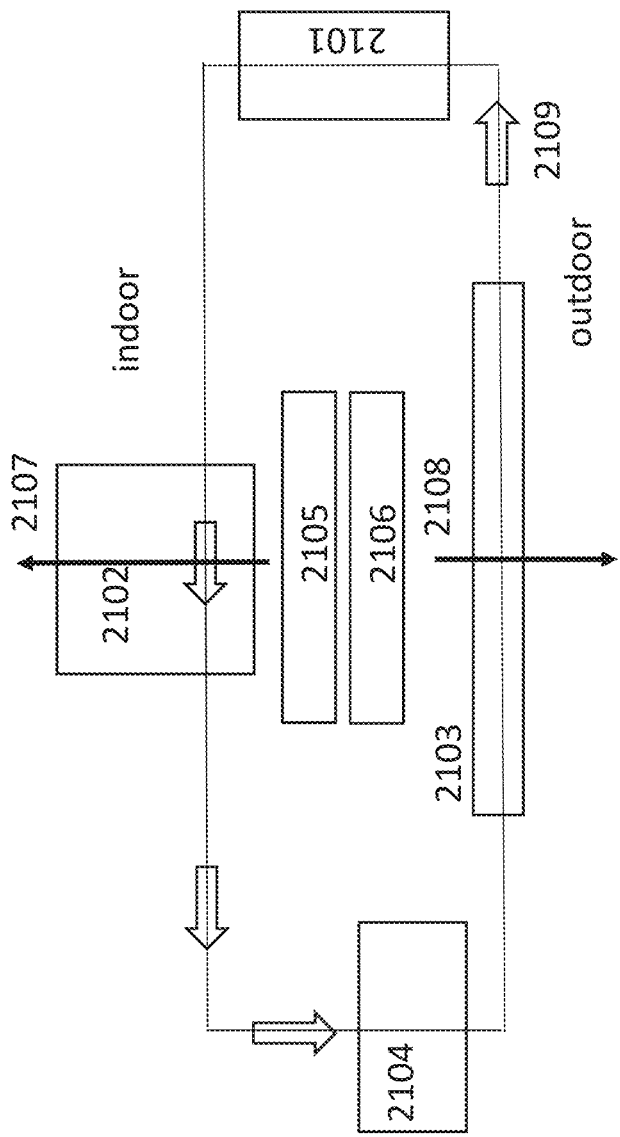
FIG. 21 schematically illustrates an example configuration for a heating only system with a primary loop only that includes a thermoelectric device as a second stage.

FIG. 21 schematically illustrates a similar configuration to FIG. 20. This configuration is for heating only. Refrigerant flow 2109 is reversed from FIG. 20. Additional components of this configuration include compressor 2101 similar to compressor 101, evaporator 2103 similar to evaporator 102, expansion valve 2104 similar to expansion valve 104, thermoelectric device 2102 similar to thermoelectric device 2002, and fans 2105 and 2106 similar to fans 2005 and 2006. Air flows 2107 and 2108 are forced by fan 2105 and 2106 in a similar manner as described with reference to FIG. 1.

Figure 22:
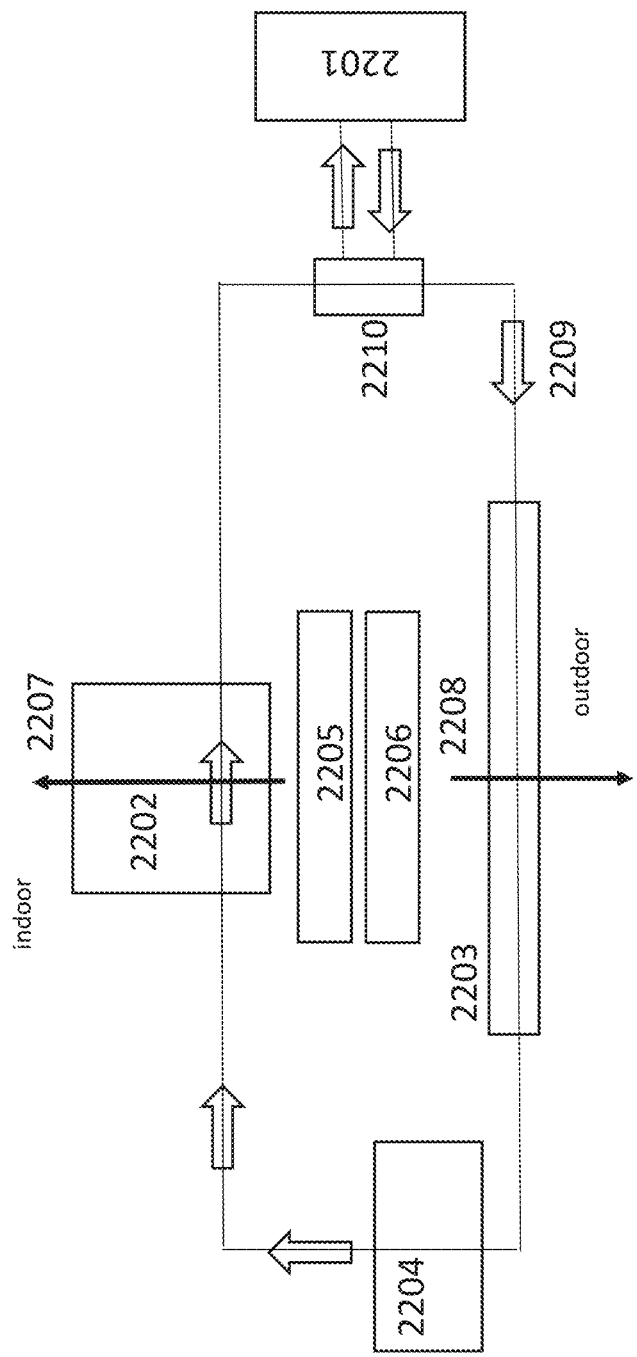
FIG. 22 schematically illustrates an example configuration for a combined cooling and heating system with a primary loop only that includes a thermoelectric device as a second stage and includes a four-way valve and bi-flow expansion valves.

FIG. 22 schematically illustrates similar to the configuration in FIG. 20. This configuration can operate in both air conditioning and heating modes. The standard expansion valve is replaced with a bi-flow expansion valve 2204. A 4-way valve 2210 is added to enable reversal of refrigerant flow 2209. The thermoelectric device 2202 electrical current direction is also reversed when moving from air conditioning to heating mode. Air conditioning mode is shown. In heating mode, refrigerant flow 2209 is reversed and the condenser/gas cooler 2203 becomes the evaporator. Additional components of this configuration include compressor 2201 similar to compressor 101 and fans 2205 and 2206 similar to fans 2005 and 2006. Air flows 2207 and 2208 are forced by fan 2205 and 2206 in a similar manner as described with reference to FIG. 1.

Figure 23:
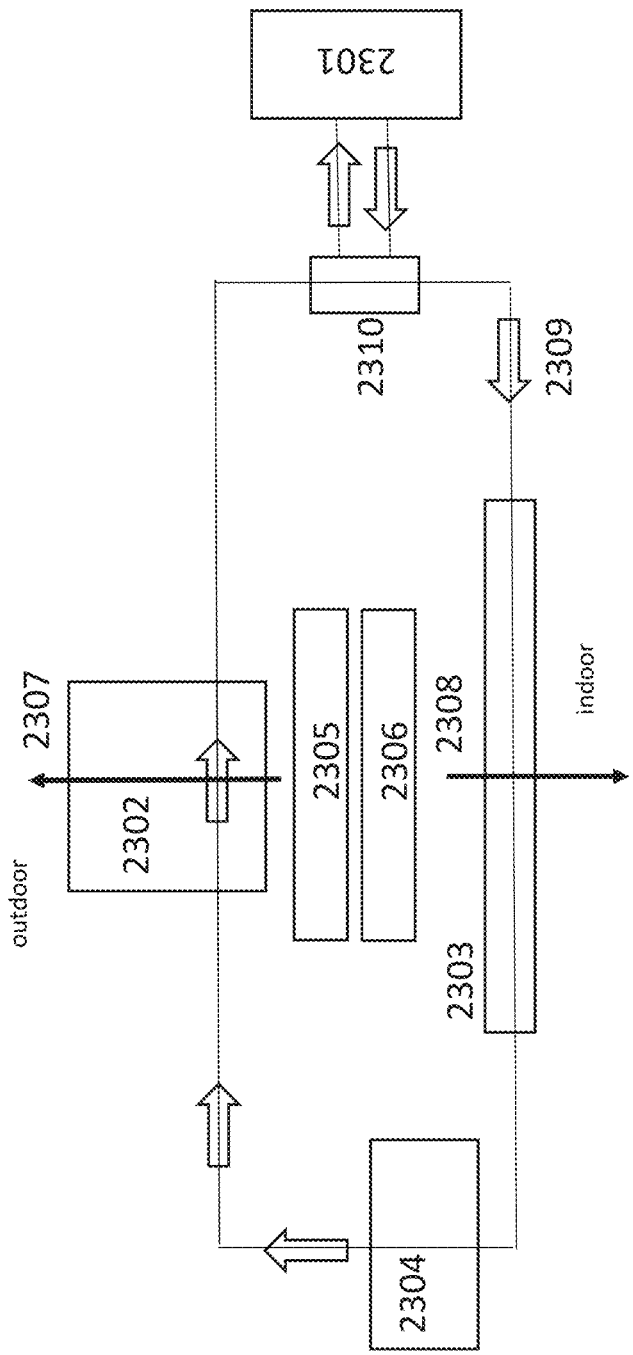
FIG. 23 schematically illustrates an example configuration for a combined cooling and heating system with a primary loop only that includes a thermoelectric device as a second stage and includes a four-way valve and bi-flow expansion valves.

FIG. 23 schematically illustrates a system configuration that modifies FIG. 22 such that the thermoelectric device is in the outdoor stage instead of the indoor stage. Heating mode is shown. In air conditioning mode, refrigerant flow 2309 is reversed and the evaporator 2303 becomes the condenser/gas cooler. The thermoelectric device 2302 electrical current direction is also controlled to be reversed when moving from heating to air conditioning mode. Additional components of this configuration may include compressor 2301 configured similarly as compressor 101, bi-flow expansion valve 2304 configured similarly as bi-flow expansion valve 2204, fans 2305 and 2306 configured similarly as fans 2005 and 2006, four-way valve 2310 configured similarly as four-way valve 2210, and a control system such as described elsewhere herein. Air flows 2307 and 2308 may be forced by fans 2305 and 2306 in a similar manner as described with reference to FIG. 1.

FIG. 24 is a configuration matrix that shows example attributes of each of the configurations described with reference to FIGS. 1-23. Configurations that are cooling only do not have the capability of heating; refrigerant flow is in one direction and the evaporator and condenser/gas cooler are fixed; and no four-way valve or bi-flow expansion valves are needed. Configurations that are heating only do not have the capability of cooling; refrigerant flow is in one direction and the evaporator and condenser/gas cooler are fixed; and no four-way valve or bi-flow expansion valves are needed.

Configurations that combine cooling and heating can be operated in both cooling and heating modes and may be referred to as combined cooling and heating systems. Where such systems are used to provide air conditioning and air heating, they may be referred to as HVAC systems or as combined HVAC systems. However, it will be appreciated that the present systems are not limited to use in air conditioning and air heating. As illustrated in FIG. 24, in combined heating and cooling configurations, refrigerant flow changes direction with the aid of an additional four-way valve and bi-flow expansion valves configured to provide expansion no matter in which direction the refrigerant flows. Configurations that are primary loop only do not include a secondary loop. The TE device for these configurations may be refrigerant-to-air. Configurations that have a secondary loop may be configured such that the TE device is refrigerant-to-fluid (typically glycol/water). Additional liquid-air heat exchangers may be added to transfer heat from the secondary loop fluid to the air stream on the evaporator and condenser/gas cooler sides. The secondary loop may include an additional pump to recirculate the fluid.

As illustrated in FIG. 24, for a combined heating and cooling system, the secondary loop may include two 3-way valves to direct the waste heat to the proper liquid-air heat exchanger. Some configurations may have TE waste heat rejected to the air before the condenser/gas cooler. Some configurations may have the TE waste heat rejected to the air after the condenser/gas cooler. Some configurations may be configured to provide the ability to adjust (using a control system) whether TE waste heat is rejected before or after the condenser/gas cooler depending on the operating conditions and/or refrigerant type. Some configurations have TE waste heat rejected to the air separate from the condenser/gas cooler, the TE provides the main heating only, and some have TE waste heat rejected to the air in parallel to the condenser/gas cooler. Some configurations add a secondary liquid (e.g., glycol/water) loop to prevent or inhibit the condenser/gas cooler from rejecting heat directly to air. This configuration may reduce or obviate the need for a four-way valve and bi-flow expansion valves. Fluid and refrigerant flow directions do not necessarily need to change when operation changes from cooling to heating. Fan/air flow direction may be controlled to change instead. Some configurations may include an air handling valve and fan/air flow direction change as opposed to a four-way valve and bi-flow expansion valves to provide cooling and heating capabilities. Some configurations may include a split TE device, e.g., in order to eliminate the need for two 3-way valves, a bi-flow expansion valve, and a reversing pump. Two separate liquid (e.g., glycol/water) loops, each with a standard pump, may be included. Some configurations use the TE device as a second stage, eliminating either the evaporator or condenser/gas cooler. The thermoelectric devices in all configurations may include conventional thermoelectric elements, DTP thermoelectric elements, or any suitable combination thereof.

Figure 25:
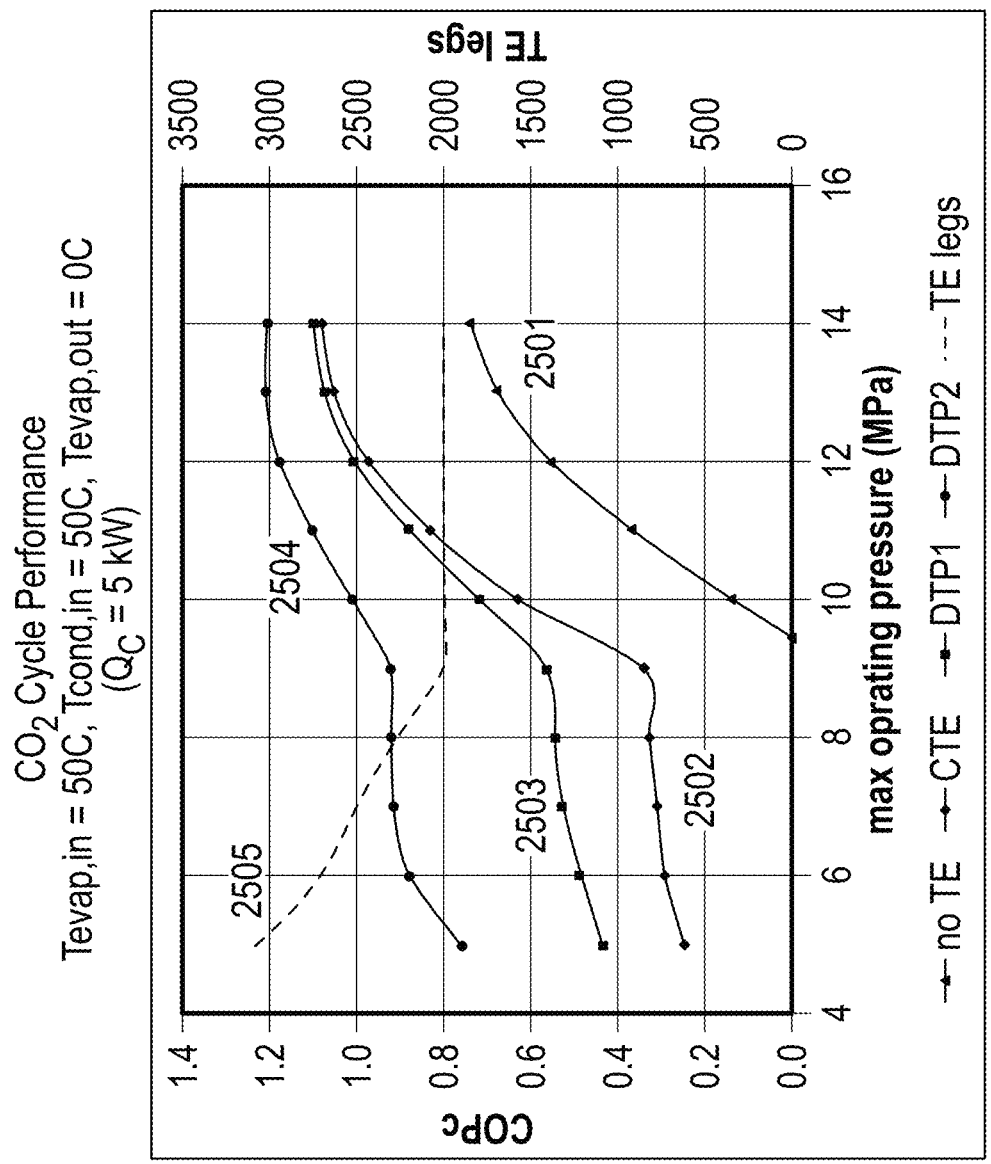
FIG. 25 shows a graph of how an example system that uses $CO_2$ as a refrigerant can improve COP and reduce operating pressure.

FIG. 25 shows a graph of how the system can improve COP and reduce operating pressure. This is particularly important for $CO_2$, which often operates at transcritical pressures that can exceed 15 MPa, and which may require a more robust and costly system and further safety precautions. The curve 2501 for a baseline system without a thermoelectric device shows that 9.4 MPa is the minimum operating pressure that such a system can be operated at with $CO_2$ as the refrigerant and at 50 C ambient with the evaporator outlet temperature of 0° C. Curve 2502 which represents conventional thermoelectric device shows improvement in COP at 14 MPa over curve 2501 and shows that the system can operate down to at least 5 MPa. Curve 2503 represents a thermoelectric device which includes DTP material. It is a an example thermoelectric device with DTP including available materials, while curve 2504 which represents a thermoelectric device with DTP that includes a still larger Seebeck coefficient range and lower interfacial resistance. Curve 2503 shows further improvement in COP compared to curve 2502 at operating pressures below 9.4 MPa. Curve 2504 shows improvement in COP compared to curve 2502 and curve 2503 for all operating pressures. Curve 2505 shows the number of thermoelectric legs used in the thermoelectric devices at each operating pressure. A larger number of thermoelectric legs used to supply an example cooling capacity of 5 kW for this design condition. DTP improves COP and/or reduces size of thermoelectric subcooler, particularly at lower operating pressures. If desired, the system can be controlled so as always to be operated at subcritical pressures (<7.4 MPa for $CO_2$). Systems without the thermoelectric subcooler cannot do this as they do not have the additional level of pressure control that the thermoelectric subcooler provides. DTP has the potential in these conditions to improve COP compared to CTE by >3× for the same size device. DTP can also provide a reduction in thermoelectric size compared to CTE at the same COP. FIG. 25 uses $CO_2$ as the refrigerant for the vapor compression cycle. It will be appreciated that DTP also reduces the thermoelectric subcooler size and/or improves COP for R1234yf cycle, leading to the need for less R1234yf refrigerant. Similar performance improvements can also be found using still other refrigerants such as those listed elsewhere herein. By being able to control operating pressure, the thermoelectric device may eliminate the need for further over-pressure protections such as check valves, and may help to reduce or minimize the wall thickness of the pipes and tubing. The heat pump system may operate subcritically for all ambient temperatures. The heat pump system can also operate both subcritically and transcritically, selectably under control of a control system, depending on the conditions.

Figure 26:
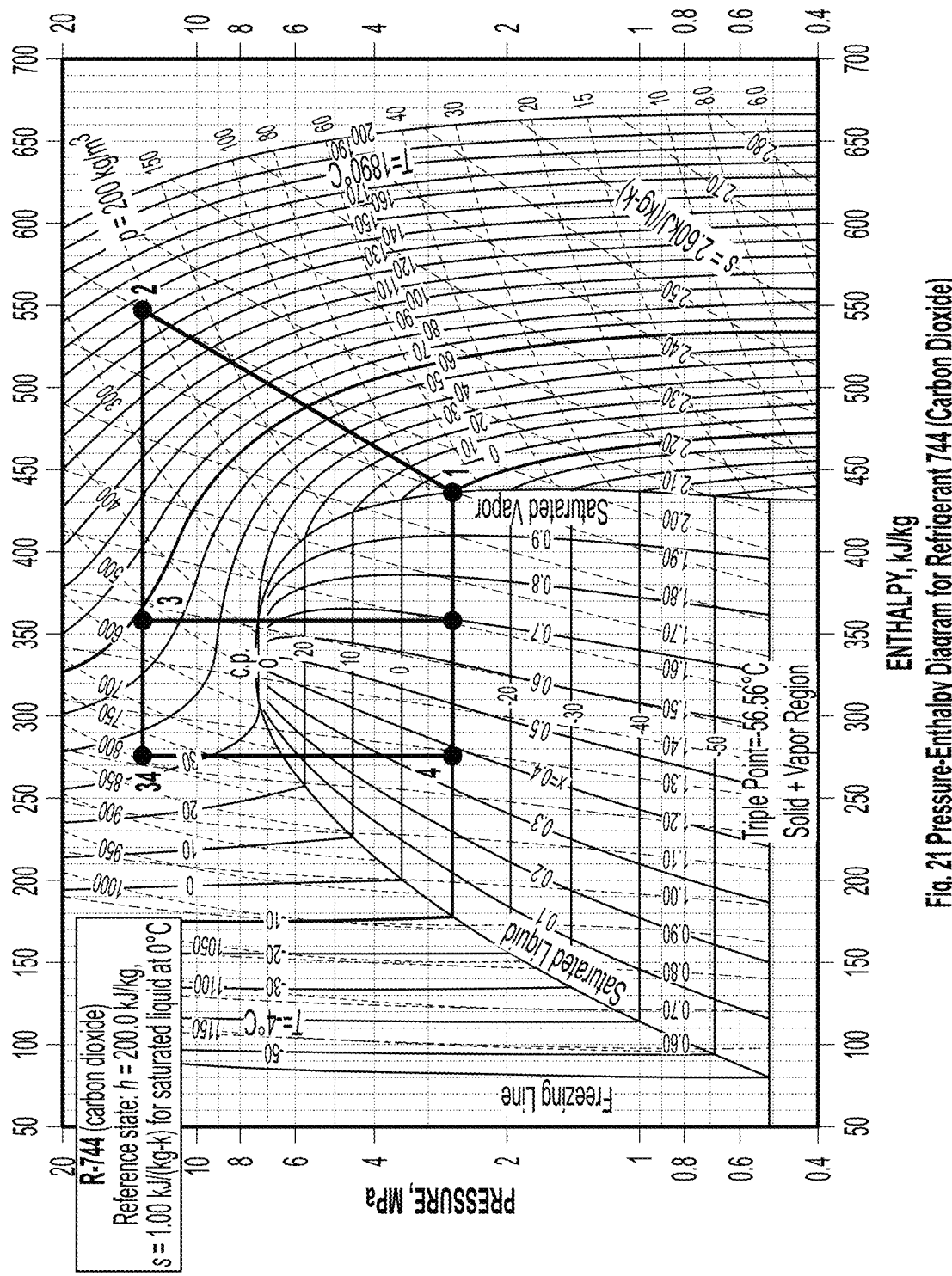
FIG. 26 shows a pressure vs. enthalpy diagram for R744 ($CO_2$) refrigerant.

FIG. 26 shows a pressure vs. enthalpy diagram for R744 ($CO_2$) refrigerant. Overlaid on the diagram is an example of how the addition of a thermoelectric subcooler can increase the capacity and COP of a vapor compression cycling that uses $CO_2$ as a refrigerant. Cooling capacity may be expressed as Qc_tot=mdot*(H1−H4). Refrigerant is cooled below ambient from T3 to T34. mdot is reduced due to the increase in (H1−H4). Compressor work is reduced, W=mdot*(H2−H1). Increases in COP in both heating and cooling over standard cycle are observed. Increases in heat capacity by reducing refrigerant mass flow needed to achieve a target heat output is observed. Reducing operating pressure of standard $CO_2$ cycle, which reduces need for other forms of pressure control, improves safety, and reduces cost. Ability is provided to adjust capacity without a variable speed compressor. The present systems can be used with various refrigerants, including R1234yf and $CO_2$.

Figure 27:
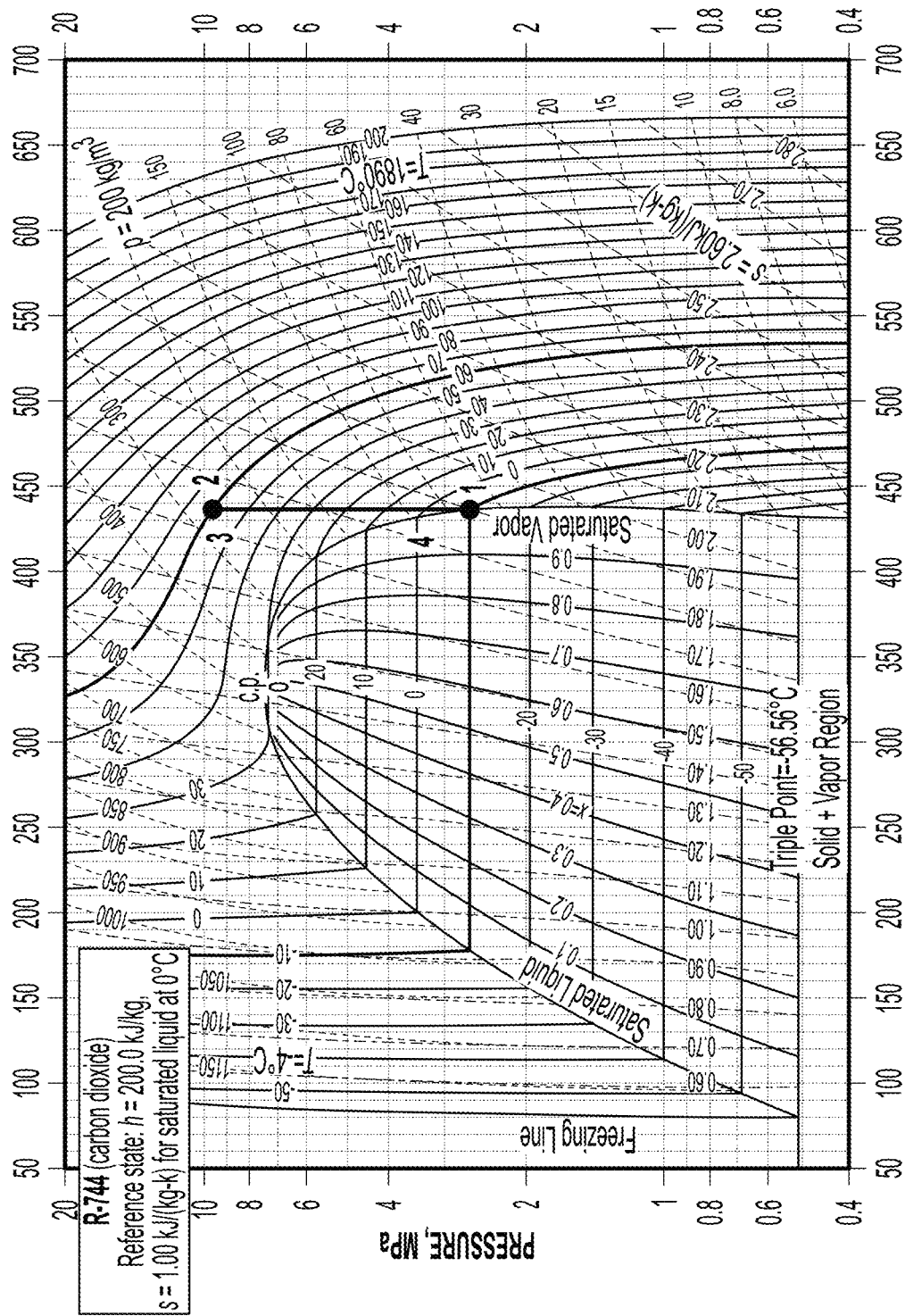
FIG. 27 shows a pressure vs. enthalpy diagram for R744 ($CO_2$) refrigerant.

FIG. 27 shows a pressure vs. enthalpy diagram for R744 ($CO_2$) refrigerant. Overlaid on the diagram is an example of how the addition of a thermoelectric subcooler can improve performance and reduce pressure limitations for a vapor compression cycling that uses $CO_2$ as a refrigerant. With no TE at 50° C. ambient, cycle has min operating pressure of 9.4 MPa with P2≈P3 and P1≈P4. Since H4≈H1, all of the capacity is created by increasing mdot. TE can or must provide all capacity increase. Running the compressor at higher power, even up to 20 MPa does not provide as much capacity (H1−H4) as a TE subcooler. At 20 MPa, H4≈325 kJ/kg. A TE can reduce H4 to below 200 kJ/kg.

Figure 28:
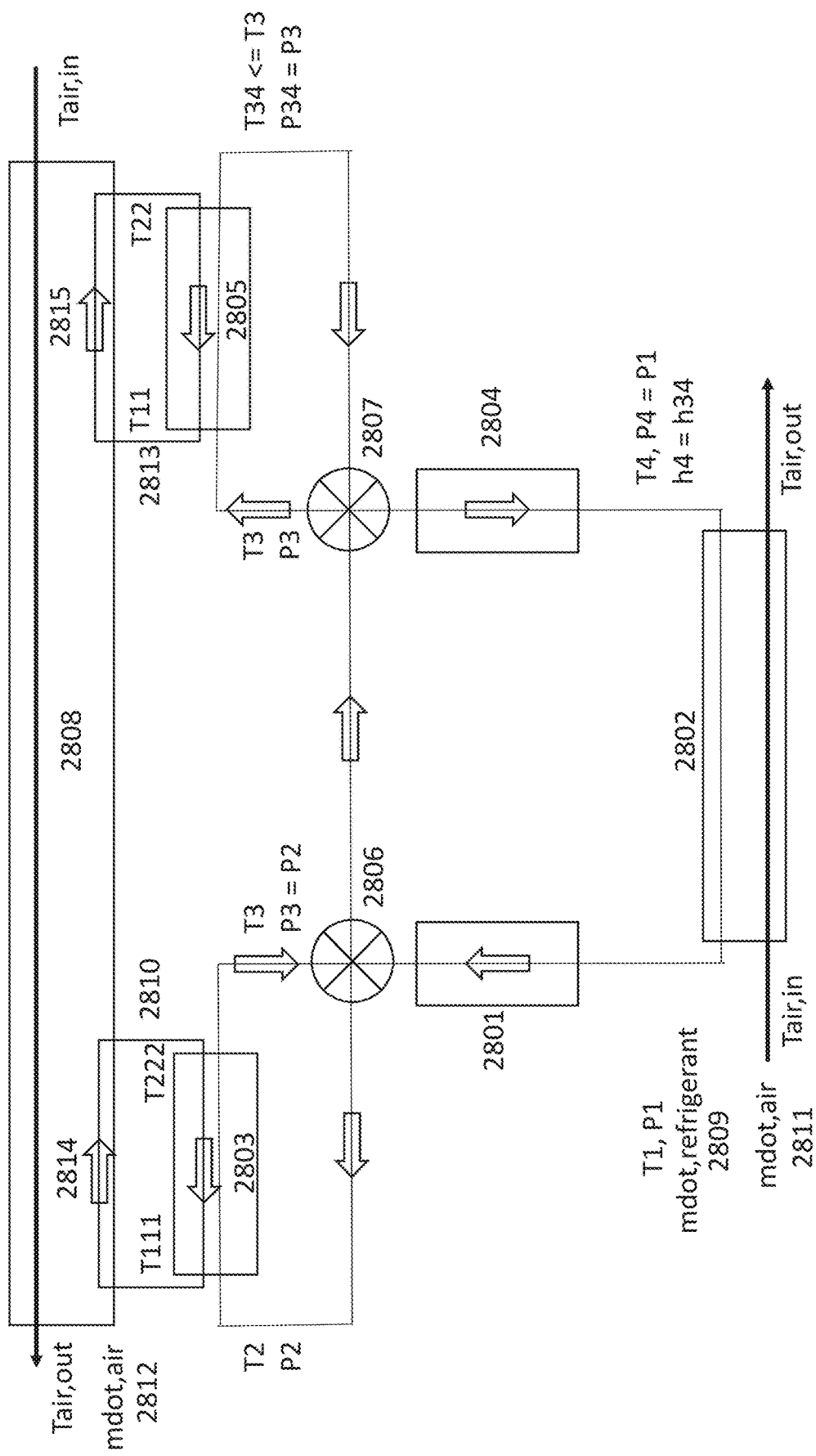
FIG. 28 schematically illustrates an example vapor compression cycle with thermoelectric subcooler.

FIG. 28 schematically illustrates a system for a vapor compression cycle with thermoelectric subcooler 2805 added. The thermoelectric subcooler 2805 may include conventional thermoelectric elements, DTP thermoelectric elements, or any suitable combination thereof. Refrigerant flows 2809 from point 1 through the compressor 2801 to point 2. From point 2, the refrigerant 2809 goes through the gas cooler (or condenser) 2803 to point 3. From point 3, the refrigerant 2809 goes through thermoelectric subcooler 2805 to point 34. From point 34, the refrigerant 2809 goes through the expansion valve 2804 to point 4. Flow direction is noted by the arrows. A valve 2806 after the compressor may be controlled to change whether flow goes to point 2 or point 3 first. Similarly, a valve 2807 before thermoelectric subcooler 2805 may be controlled to change whether flow goes to point 3 or point 34 first. Pressure (P) at point 3 is equal to pressure at point 2. Pressure at point 34 is equal to pressure at point 3. Temperature (T) at point 34 is less than or equal to the temperature at point 3. Enthalpy (h) at point 4 is equal to enthalpy at point 34. Pressure at point 4 is equal to pressure at point 1. Air 2811 cools as it flows through the evaporator 2802, transferring heat to refrigerant 2809, which is changing phase from liquid to gas. In between the gas cooler/condenser 2803 and air stream 2812, there is an intermediate fluid circuit 2810, whose coolant 2814 runs counter flow to both refrigerant 2809 through the gas cooler/condenser 2803 and the air flow 2812. A similar intermediate fluid circuit 2813 is between the thermoelectric subcooler 2805 and air stream 2812. Coolant 2815 of circuit 2813 also runs counter flow to both refrigerant 2809 through the thermoelectric subcooler 2805 and the air flow 2812. Liquid-air heat exchanger 2808 transfers the heat from the fluids in components 2810 and 2813 to the air 2812.

Figure 29:
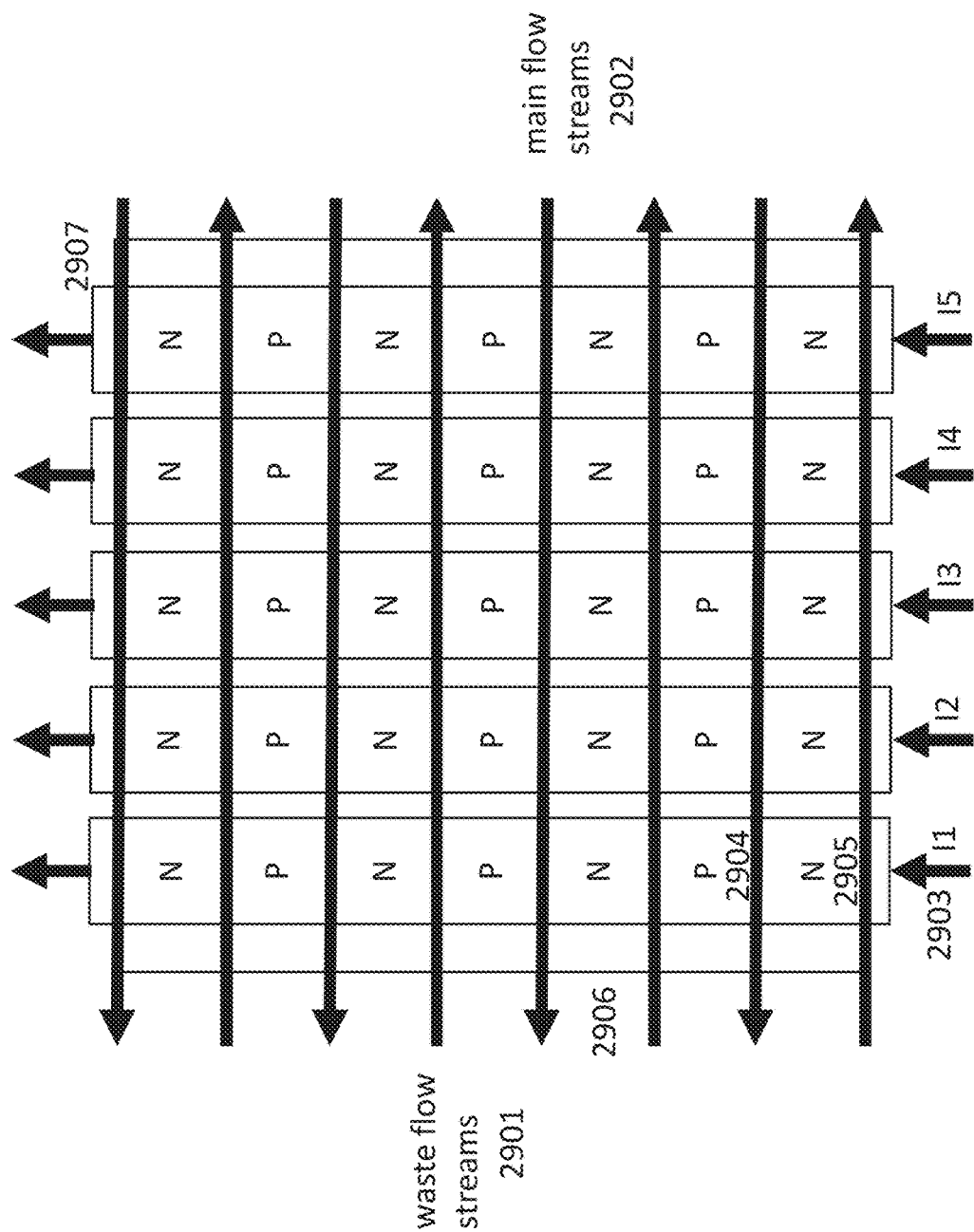
FIG. 29 schematically illustrates an example configuration for thermoelectric elements integrated into heat exchange elements.

FIG. 29 schematically illustrates an example scalable, low-cost thermoelectric device with cold and hot flow components integrated into design that more than doubles the effectiveness of current thermoelectric solutions at a fraction of the cost. This is one example of a thermoelectric device that can be used in the present hybrid heat pump systems such as described elsewhere herein. The thermoelectric device can incorporate conventional thermoelectric or DTP thermoelectric elements. The device has the following benefits: DTP thermoelectric material maximizes cost-effectiveness of module, thermally isolated elements improves COP by an approximate factor of two, multiple currents for further improved COP with extended range, reduced electrical contact resistance by eliminating soldering and plating, reduced thermal contact resistance by eliminating external heat exchangers, ceramic substrates, and thermal interface materials, high heat density configuration for lower TE material usage and higher thermal capacity, low-cost, scalable manufacturing method which eliminates soldering steps and an order of magnitude of parts, robust and durable structure potted, e.g., in flexible silicone 2906 with vacuum-filled glass spheres for improved thermal insulation, and ability to have variable thermoelectric thicknesses for improved optimization. Each thermoelectric row 2907 can be operated at a separate current 2903. Each thermoelectric row 2907 includes alternating P 2904 and N 2905 elements or legs. The figure shows five thermoelectric rows 2907 with independent current 2903 for each stage, although it should be appreciated that any suitable number of rows may be used. Thermoelectric rows 2907 can be "potted" together with low thermal conductivity potting material, such as silicone 2906 optionally with vacuum-filled glass spheres mixed in to further reduce thermal conductivity. The more p-n junctions in a thermoelectric row 2907, the higher the capacity. Main flow 2902 (first air flow) and waste flow 2901 (second air flow) may be parallel streams in a counterflow configuration. Mandrels may be used as well when the thermoelectric rows 2907 optionally are "potted" together to form holes allowing flow of air from one row to another.

Figure 30:
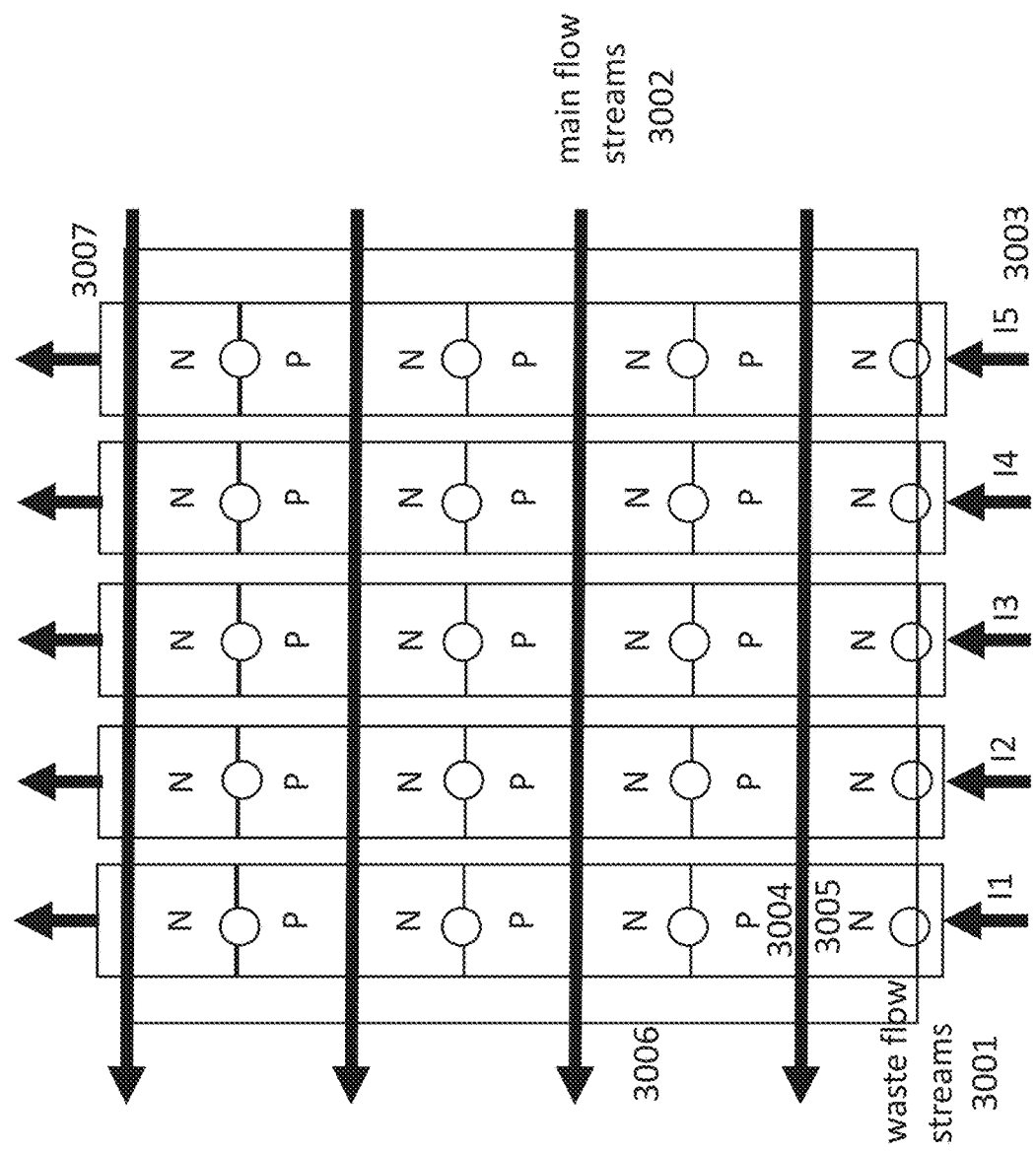
FIG. 30 schematically illustrates an example configuration for thermoelectric elements integrated into heat exchange elements.

FIG. 30 schematically illustrates an alternative example configuration to that illustrated in FIG. 29. The configuration illustrated in FIG. 30 has the main streams 3002, waste streams 3001, and currents 3003 all in different planes so that manifolding can be easier. This configuration is further improved by using multiple planes of thermoelectric rows 3007 creating a 3D block of thermoelectric rows 3007 which would still have manifolds for main 3002, waste 3001, and current 3003 in different planes. Flow would be crossflow instead of counterflow in this configuration. Turbulators (not shown) can be added, e.g., to holes, to improve heat transfer. Additional components of this configuration include p-type elements 3004 configured similarly as p-type elements 2904, n-type elements 3005 configured similarly as n-type elements 2905, and potting material 3006 configured similarly as potting material 2906.

Figure 31:
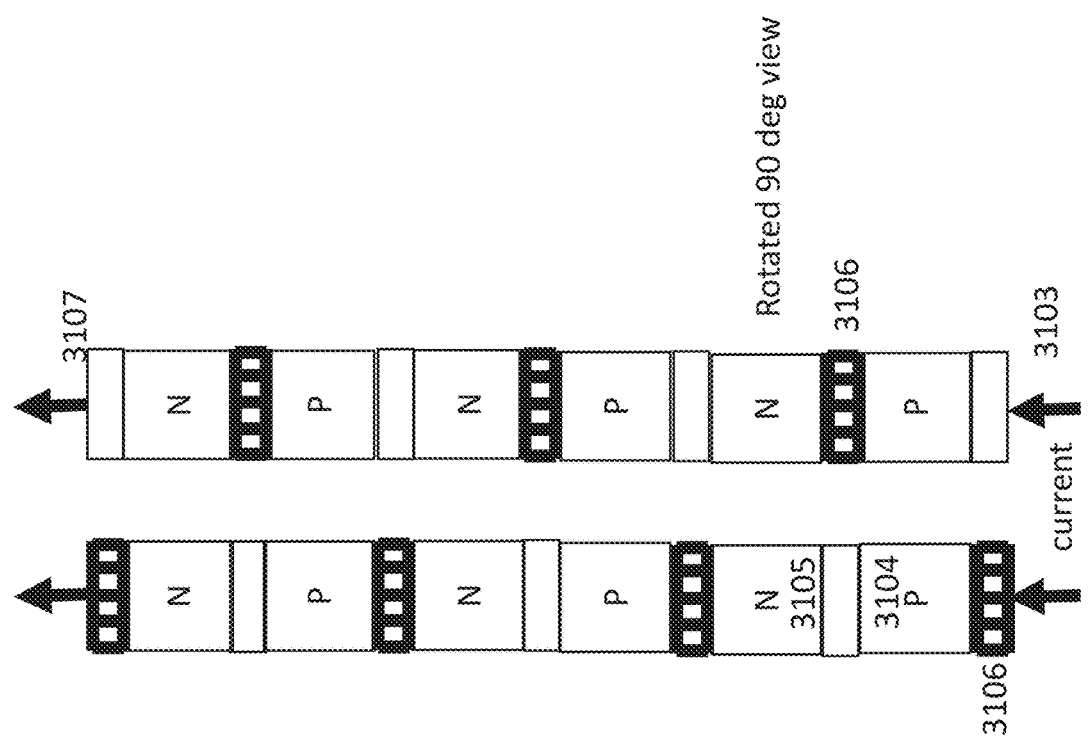
FIG. 31 schematically illustrates an example configuration for thermoelectric elements integrated into heat exchange elements.

FIG. 31 schematically illustrates another alternative example configuration for a thermoelectric row 3107 including p-type 3104 and n-type 3105 elements. In some examples, p-, n-, and metal (e.g., nickel, copper, or aluminum) powders may be layered in multiple layers and pressed together in a single ingot. The ingot then may be diced into thermoelectric rows 3107. Thermoelectric rows may be manufactured with contacts on each end. Electrical current 3103 may flow from bottom to top. In some examples, main fluid flow may flow perpendicular to current flow through sections 3106, which may be made of metal. Waste flow also may flow perpendicular to current 3103 flow (and 90 deg rotated from main flow) through sections 3106, which may include or may be made of metal or other electrically conducting material. Electrical current flows 3103 through main and waste flow sections 3106. Hole(s) in sections 3106 optionally may be created by removable mandrels during the pressing process as one method of manufacture. Dielectric coating optionally may be used in the holes to provide electrical isolation from flow.

Figure 32:
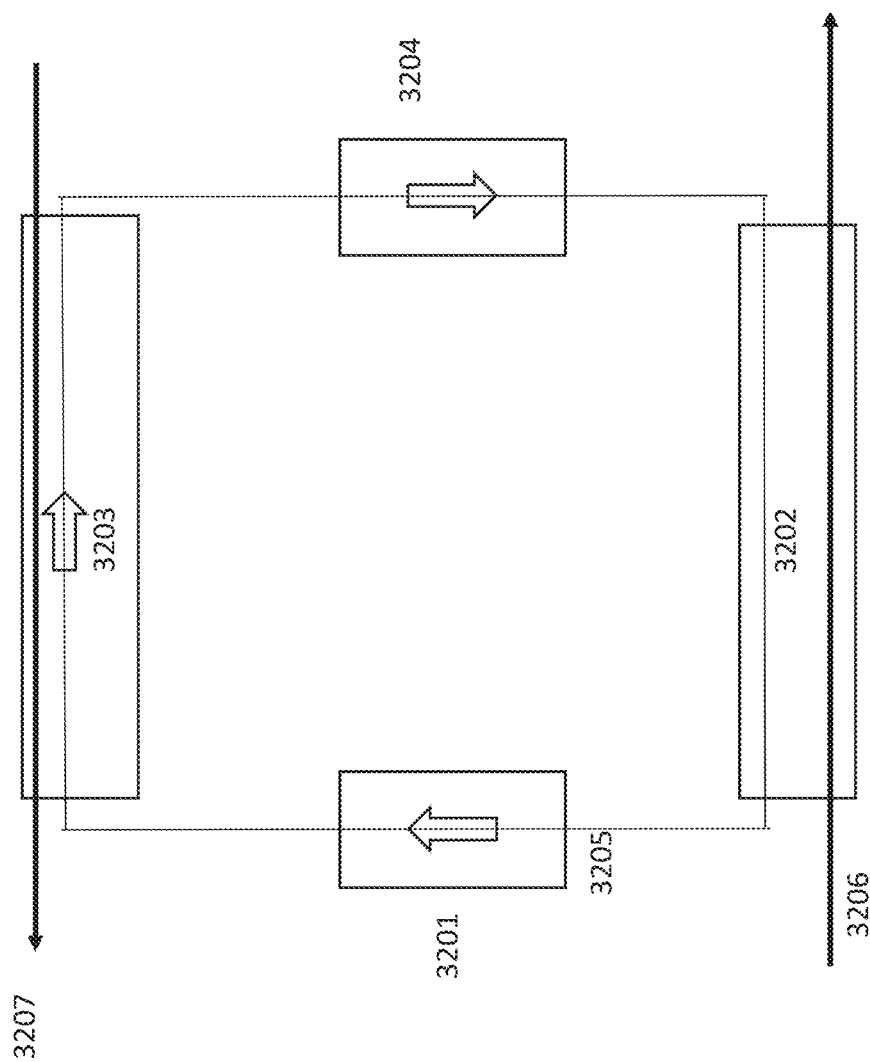
FIG. 32 schematically illustrates an example configuration of a vapor compression cycle with a thermoelectric device as the high temperature stage.

FIG. 32 schematically illustrates another example configuration that combines a thermoelectric device with a vapor compression system. This system, along with those shown in FIGS. 33-40, can be used for HVAC and other heat pump applications, but may also or alternatively be used for refrigeration, freezer, and ultra-cold freezer applications. The example illustrated in FIG. 32 is a two-stage system with a thermoelectric hot stage 3203 and a vapor compression cold stage. The vapor compression cold stage includes a compressor 3201, evaporator 3202, expansion valve 3204, refrigerant 3205, air flow 3206 and air flow 3207. A control system may be included such as described elsewhere herein. The condenser for the vapor compression system is a part of the thermoelectric device 3203. The thermoelectric device 3203 may include conventional thermoelectric elements, DTP thermoelectric elements, or any suitable combination thereof. The system can provide improvement for refrigerants for ultra-low (−40° C. to −86° C.) and low temperature (0° C. to −40° C.) applications (evaporator temperature less than or equal to 0° C.) including but not limited to systems that use ethane, ethylene, propane, propylene, $CO_2$, or ammonia.

Figure 33:
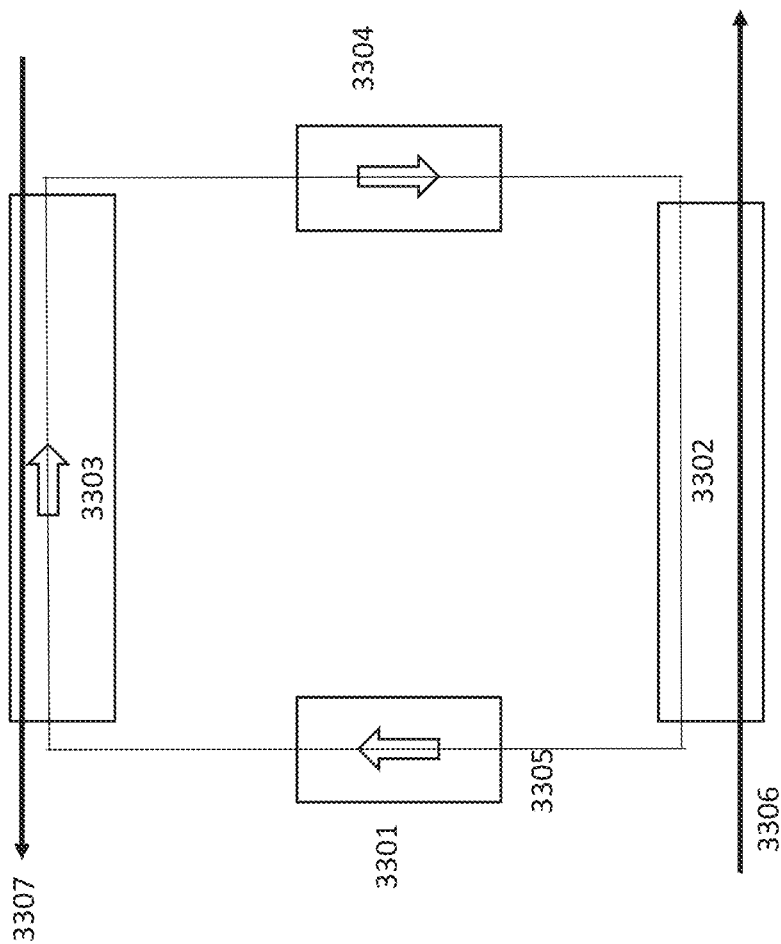
FIG. 33 schematically illustrates an example configuration of a vapor compression cycle with a thermoelectric device as the cold temperature stage.

FIG. 33 schematically illustrates another configuration that combines a thermoelectric device with a vapor compression system. It is a two-stage system with a thermoelectric cold stage 3302 and a vapor compression stage. The vapor compression stage includes a compressor 3301, condenser/gas cooler 3303, expansion valve 3304, refrigerant 3305, air flow 3306 and air flow 3307. A control system may be included such as described elsewhere herein. The evaporator for the vapor compression system is a part of the thermoelectric device 3302. The thermoelectric device 3302 may include conventional thermoelectric elements, DTP thermoelectric elements, or any suitable combination thereof. The system can provide improvement for refrigerants for greater than or equal to medium temperature applications (evaporator temperature between 0° C. and 20° C.) including but not limited to systems that use refrigerants such as R134a, R1234yf, Iso-butane, propane, propylene, $CO_2$, or ammonia.

Figure 34:
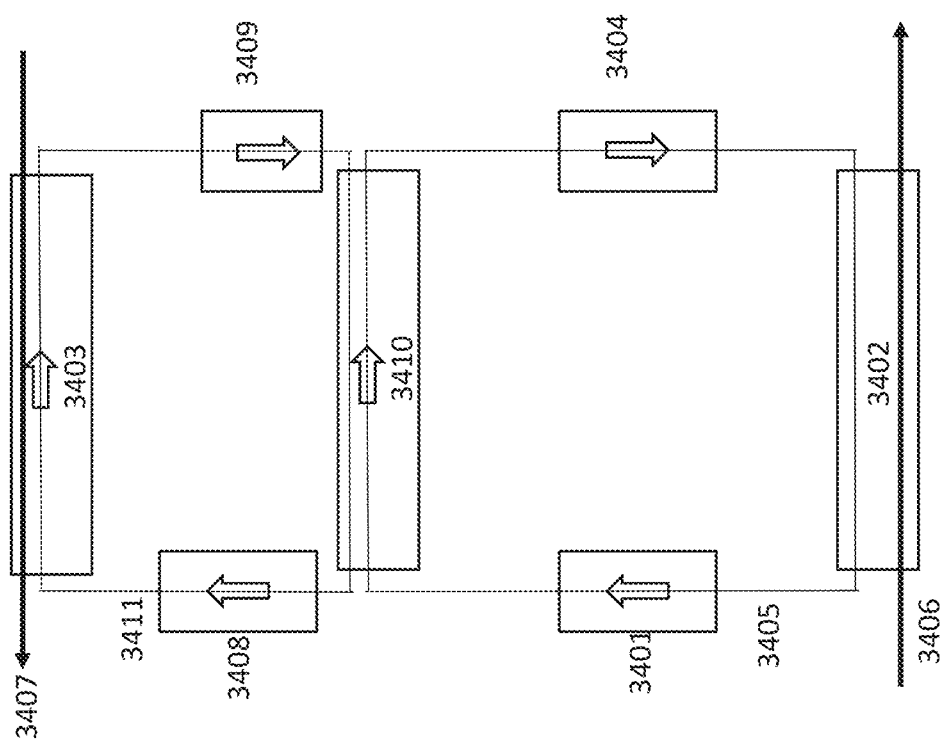
FIG. 34 schematically illustrates an example configuration of a vapor compression cycle with a thermoelectric device as an intermediate stage.

FIG. 34 schematically illustrates another example configuration that combines a thermoelectric device with a vapor compression system. is the system illustrated in FIG. 34 includes a thermoelectric intermediate stage 3410. The vapor compression system includes compressors 3401 and 3408, evaporator 3402, condenser/gas cooler 3403, expansion valves 3404 and 3409, refrigerant loops 3405 and 3411, air flow 3406 and air flow 3407. A control system may be included such as described elsewhere herein. The thermoelectric device 3410 is the condenser for the cold stage and the evaporator for the hot stage. The thermoelectric device 3410 may include conventional thermoelectric elements, DTP thermoelectric elements, or any suitable combination thereof. The nonlimiting configuration illustrated in FIG. 34 may provide three stage heat pumping with the ability to actively adjust intermediate temperatures between vapor compression stages.

Figure 35:
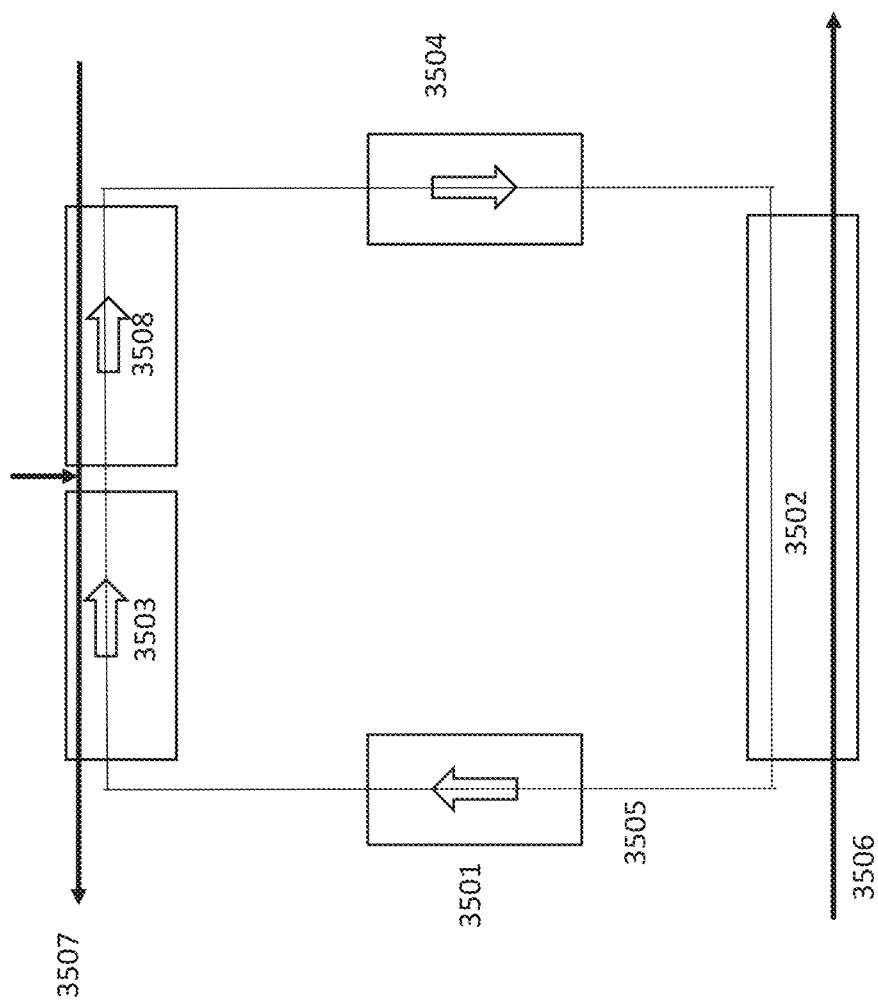
FIG. 35 schematically illustrates an example configuration of a vapor compression cycle with a thermoelectric device as the high temperature stage and a separate thermoelectric subcooler.

FIG. 35 schematically illustrates an example system configured similarly as that illustrated in FIG. 32 with the addition of a thermoelectric subcooler 3508 added between the thermoelectric device 3503 and the expansion valve 3504. The thermoelectric components 3503 and 3508 handle full capacity split into two parts to provide higher COP in the thermoelectric components. Such configuration may improve performance relative to that of FIG. 32. The thermoelectric devices 3503 and 3508 may include conventional thermoelectric elements, DTP thermoelectric elements, or any suitable combination thereof. Additional components for this configuration include compressor 3501 configured similarly as compressor 3401, evaporator 3502 configured similarly as evaporator 3402, and refrigerant loop 3505 configured similarly as refrigerant loop 3405. A control system may be included such as described elsewhere herein. Air flow 3507 is injected before component 3508 in counter-flow to refrigerant 3505 and in between components 3503 and 3508. Air flow 3506 goes through evaporator 3502.

Figure 36:
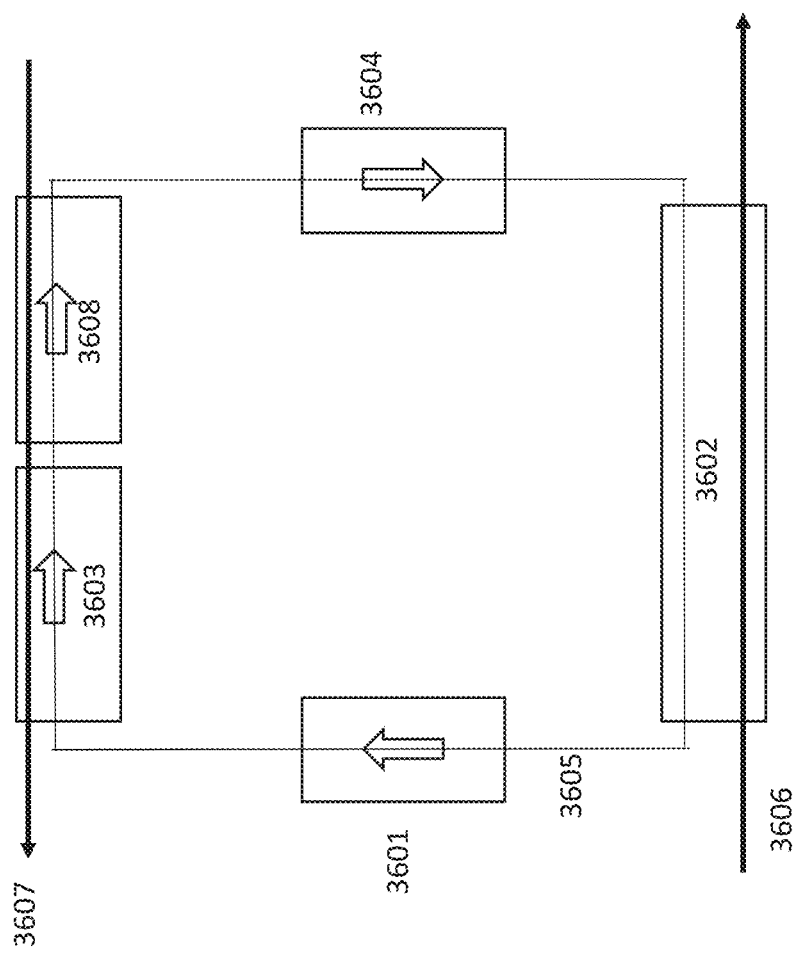
FIG. 36 schematically illustrates an example configuration of a vapor compression cycle with a thermoelectric device as the cold temperature stage and a separate thermoelectric subcooler.

FIG. 36 illustrates an example system configured similarly as those illustrated in FIGS. 33 and 35. The system illustrated in FIG. 36 includes a conventional condenser/gas cooler 3603 instead of the thermoelectric device in FIG. 35 and has a thermoelectric device 3602 instead of a conventional evaporator. This system can provide improvement for refrigerants for greater than or equal to medium temperature applications (evaporator temperature between 0° C. and 20° C.) including but not limited to R134a, R1234yf, Iso-butane, propane, propylene, $CO_2$, and ammonia. This system may improve performance relative to that of the system illustrated in FIG. 33. The thermoelectric device 3602 handles full cooling capacity of the system. The thermoelectric subcooler 3608 does not handle full cooling capacity of the system. Additional components for this configuration include compressor 3601 configured similarly as compressor 3501, expansion valve 3604 configured similarly as expansion valve 3504, and refrigerant loop 3605 configured similarly as refrigerant loop 3505. A control system may be included such as described elsewhere herein. Air flows 3606 and 3607 perform in a similar fashion to air flows 3506 and 3507.

Figure 37:
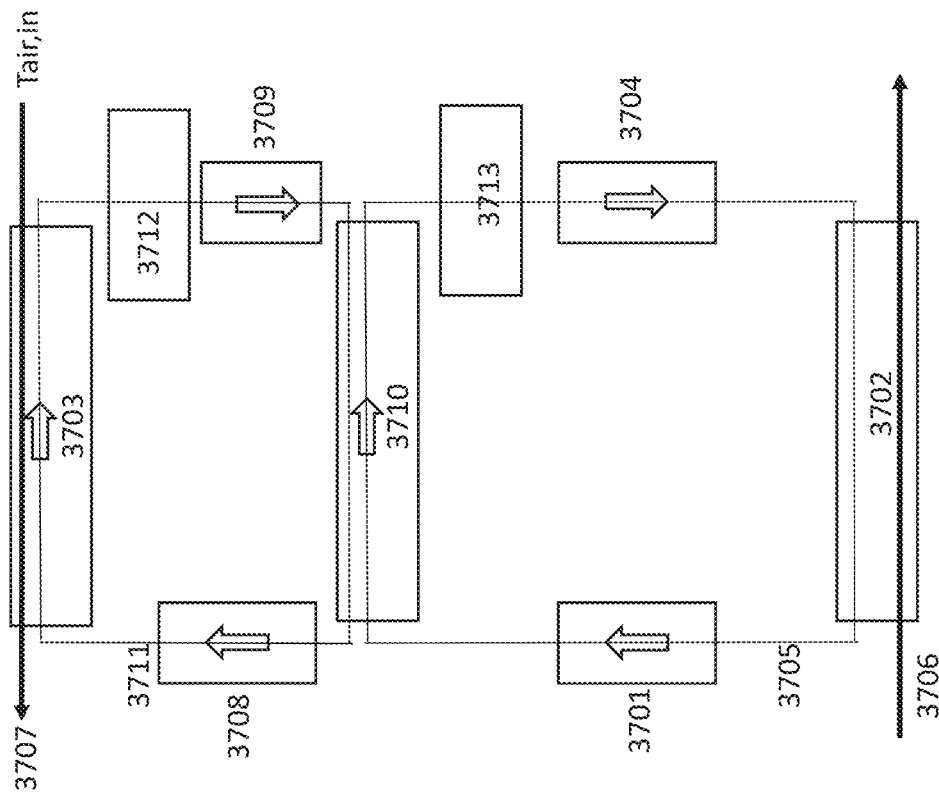
FIG. 37 schematically illustrates an example configuration of a vapor compression cycle with a thermoelectric subcooler in both the high temperature and low temperature stages with a heat exchanger in the intermediate stage.

FIG. 37 schematically illustrates an example system configured similarly as that illustrated in FIG. 34. The system illustrated in FIG. 37 has an intermediate heat exchanger 3710 instead of a thermoelectric intermediate stage. There is also a thermoelectric subcooler 3712 after condenser/gas cooler 3703 and a thermoelectric subcooler 3713 after intermediate heat exchanger 3710. Thermoelectric components 3712 and 3713 do not handle full cooling capacity of the system. Adding DTP subcooling to a propane hot vapor compression stage and a ethane cold vapor compression stage can improve COP, for example by 15-20% for an evaporator temperature equaling −86° C. and a condenser temperature equaling 40° C. Additional components for this configuration may include compressors 3701 and 3708 configured similarly as compressors 3401 and 3408, evaporator 3702 configured similarly as evaporator 102, expansion valves 3704 and 3709 configured similarly as expansion valve 104, refrigerant loops 3705 and 3711 configured similarly as refrigerant loop 109. A control system may be included such as described elsewhere herein. Air flows 3706 and 3707 may perform in a similar fashion to air flows 3506 and 3507.

Figure 38:
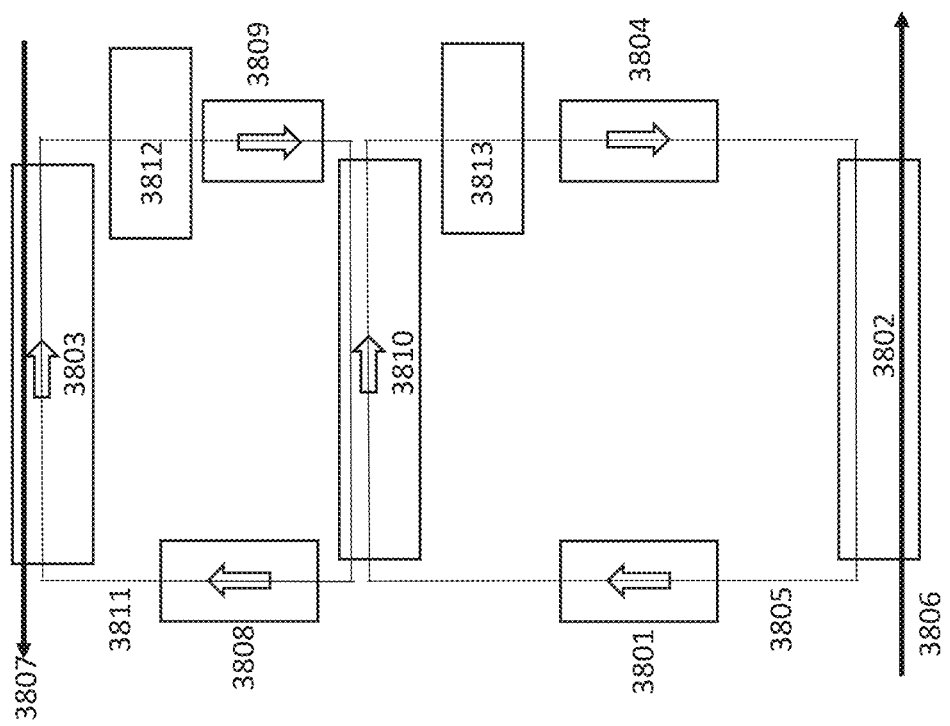
FIG. 38 schematically illustrates an example configuration of a vapor compression cycle with a thermoelectric subcooler in both the high temperature and low temperature stages with a thermoelectric device in the intermediate stage.

FIG. 38 schematically illustrates an example system configured similarly as that illustrated in FIG. 37. The system illustrated in FIG. 38 has a thermoelectric intermediate stage 3810 instead of an intermediate heat exchanger. The addition of the thermoelectric subcoolers 3812 and 3813 may improves performance relative to that of the system illustrated in FIG. 34. The thermoelectric intermediate stage 3810 handles full cooling capacity. The thermoelectric subcooler components 3812 and 3813 do not handle full cooling capacity. Additional components for this configuration may include compressors 3801 and 3808 configured similarly as compressor 101, evaporator 3802 configured similarly as evaporator 102, condenser/gas cooler 3803 configured similarly as condenser/gas cooler 103, expansion valves 3804 and 3809 configured similarly as expansion valve 104, refrigerant loops 3805 and 3811 configured similarly as refrigerant loop 109. A control system may be included such as described elsewhere herein. Air flows 3806 and 3807 may perform in a similar fashion to air flows 3506 and 3507.

Figure 39:
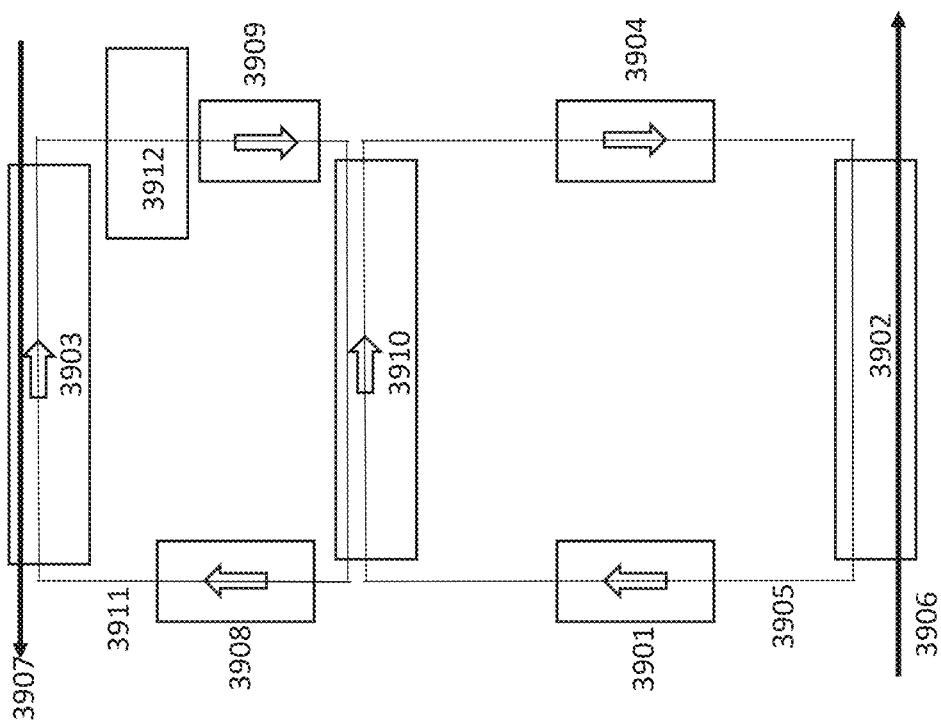
FIG. 39 schematically illustrates an example configuration of a vapor compression cycle with a thermoelectric subcooler in the high temperature only with a thermoelectric device in the intermediate stage.

FIG. 39 schematically illustrates an example system configured similarly as that illustrated in FIG. 38. The system illustrated in FIG. 39 does not have a thermoelectric subcooler after the thermoelectric intermediate stage 3910. Additional components for this configuration may include compressors 3901 and 3908 configured similarly as compressor 101, evaporator 3902 configured similarly as evaporator 102, condenser/gas cooler 3903 configured similarly as condenser/gas cooler 103, expansion valves 3904 and 3909 configured similarly as expansion valve 104, refrigerant loops 3905 and 3911 configured similarly as refrigerant loop 109, and thermoelectric subcooler 3912 configured similarly as thermoelectric subcooler 3812. A control system may be included such as described elsewhere herein. Air flows 3906 and 3907 may perform in a similar fashion to air flows 3506 and 3507.

Figure 40:
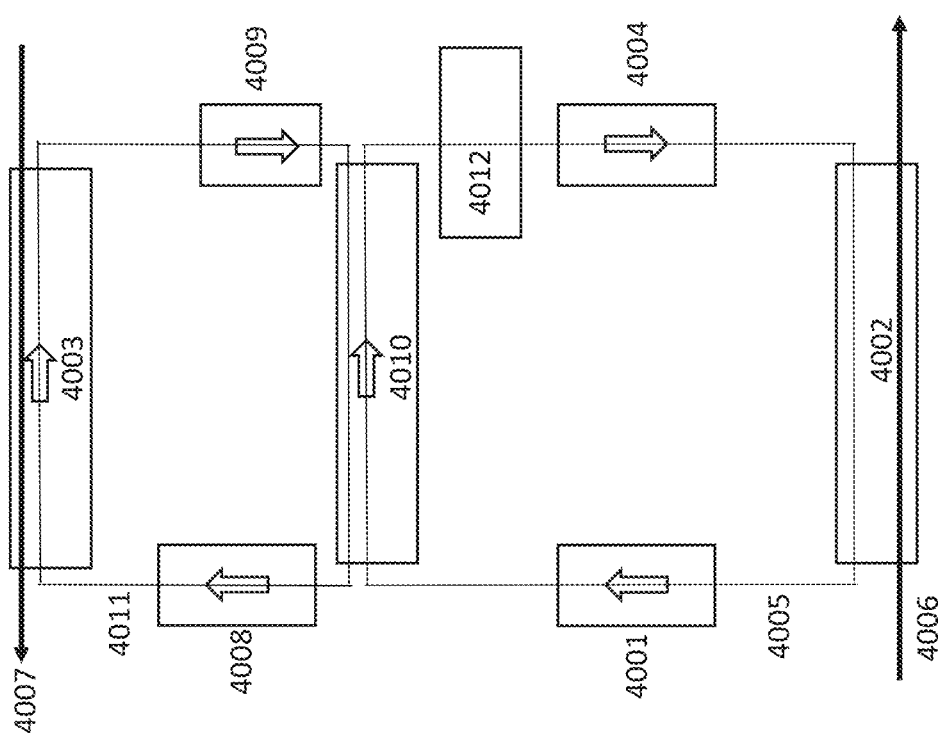
FIG. 40 schematically illustrates an example configuration of a vapor compression cycle with a thermoelectric subcooler in the low temperature only with a thermoelectric device in the intermediate stage.

FIG. 40 schematically illustrates an example system configured similarly as that illustrated in FIG. 38. The system illustrated in FIG. 40 does not have a thermoelectric subcooler after the condenser/gas cooler 4003. Additional components for this configuration may include compressors 4001 and 4008 configured similarly as compressor 101, evaporator 4002 configured similarly as evaporator 102, thermoelectric intermediate stage 4010 configured similarly as thermoelectric intermediate stage 3910, expansion valves 4004 and 4009 configured similarly as expansion valve 104, refrigerant loops 4005 and 4011 configured similarly as refrigerant loop 109, and thermoelectric subcooler 4012 configured similarly as thermoelectric subcooler 3812. A control system may be included such as described elsewhere herein. Air flows 4006 and 4007 may perform in a similar fashion to air flows 3506 and 3507.

As noted elsewhere herein and emphasized again here, the present heat pump systems and vapor cycles suitably may be adapted for use in lowering the enthalpy of any suitable fluid, such as any suitable gas or any suitable liquid. Accordingly, although some of the above examples particularly describe changing the enthalpy of air (e.g., for use in air conditioning or air heating), such examples may be used to change the enthalpy of any suitable fluid, such as a gas other than air, or such as a liquid, e.g., water or an industrial fluid.

Figure 41:
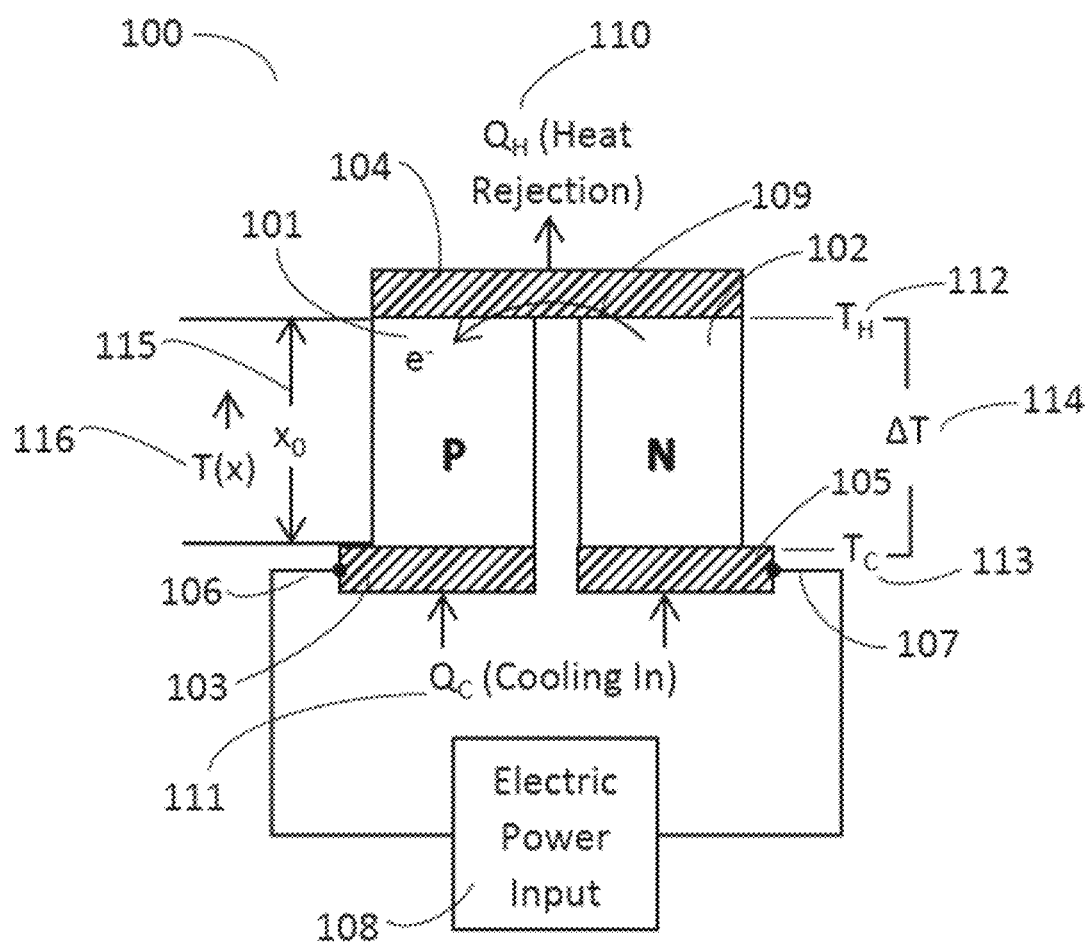
FIG. 41 schematically illustrates an example TE couple.

Additionally, as provided herein, to design more efficient and higher capacity TE systems, it may be advantageous to develop a more comprehensive description of the processes and properties that affect TE device performance than previously available. As background, FIG. 41 schematically illustrates an example CTE couple 100 including a p-type element 101, and n-type element 102, cold side electrodes 103 and hot side electrode 104. A power supply 108 connected to cold side electrodes 103 at position 106 and position 107 produces an electron flow 109 in the direction indicated when voltage is applied. The elements each have a length $x_0$ 115. When TE system 100 is in operation, the hot side is at temperature $T_H$ 112 and the cold side at a temperature $T_C$ 113, at a temperature differential DT 114, produce temperature profile $T(x)$ 116 within the legs 101 and 102 and extract thermal power $Q_C$ 111 at the cold side and reject heat $Q_H$ 110 at the hot side.

TE system 100 is the basic model used herein to describe CTE and DTP TE systems.

To address factors affecting performance that extend beyond the design and computational models that are used in traditional CTE TE system design, newly developed comprehensive basic equations that govern DPT TE system design are provided herein. Solutions to these equations are employed to develop the design of new DTP TE devices with improved performance. Throughout the discussion that follows, the performance of the new DTP TE systems is compared to that of the CTE designs taught in the literature and in commercial product application notes.

In some examples, the present DTP thermoelectric system designs are based on new material design considerations that are believed to be fundamentally different than those produced using CTE material system designs.

The underpinnings of TE device performance improvements may be best understood by considering the fundamental one-dimensional transport equation that governs performance of a thermoelectric device:

$$\frac{d}{dx}\left[\lambda(x)\frac{dT(x)}{dx}\right] - T(x)j(x)\frac{dS(x)}{dx} = -j(x)^2\rho(x). \tag{1}$$

Figure 42:
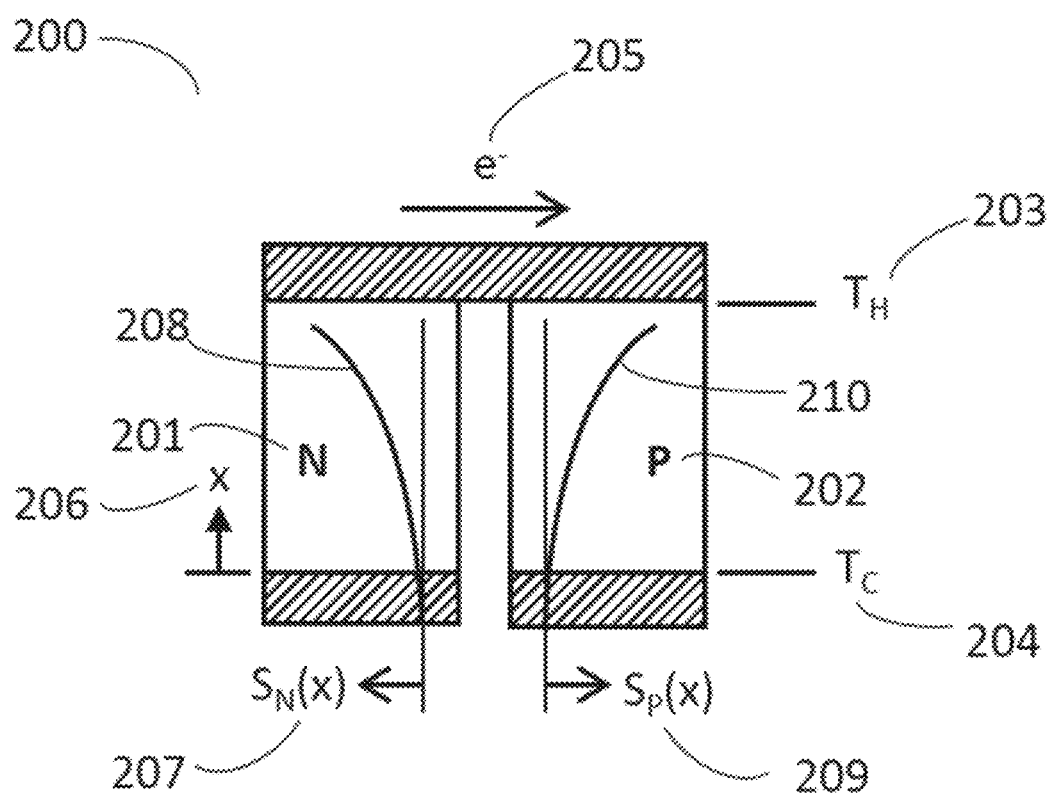
FIG. 42 schematically illustrates an example magnitude of the Seebeck coefficient as a function of distance in the direction of current flow for an example DTP TE element.

In equation 1, x is the primary direction of current flow (as distinguished from other, e.g., diffusive, directions of current flow), $\lambda(x)$ is the TE material thermal conductivity which can vary with position x, $T(x)$ is the temperature in the TE element as a function of x, $j(x)$ is the current density, $S(x)$ is the Seebeck coefficient as a function of x, and $\rho(x)$ is the electrical resistance as a function of x. FIG. 42 schematically illustrates an example DTP TE couple 200 including TE elements 201 and 202, a hot side $T_H$ 203, a cold side $T_C$ 204 and electron flow 205. Position x 206 is the distance from the cold side $T_C$ 204. In this example, for explanatory purposes, both the n-type TE element 201 and the p-type element 202 are assumed to be of equal length and constant width and thickness. Here, and in the remainder of this analysis (unless stated otherwise), properties vary only with x. For nonlimiting example configurations for DTP TE couple 200, see International Patent Application No. PCT/US2020/016247, filed on Jan. 31, 2020 and entitled "Thermoelectric Elements and Devices with Enhanced Maximum Temperature Differences Based on Spatially Varying Distributed Transport Properties," the entire contents of which are incorporated by reference herein. In some examples, DTP TE couple 200 may be used in heat pump systems such as described in greater detail elsewhere herein, e.g., with reference to FIGS. 1-40.

In CTE TE systems, the same TE material is used throughout each TE element length. Thus, the Thompson term, $$T(x)j(x)\frac{dS(x)}{dx}$$

in Equation (1) becomes zero since S, the Seebeck coefficient for the same material, is constant and does not change with position x. Since uniform properties are assumed in nearly all current textbooks and supplier literature that cover TE device design, in presentations where TE equations are derived, the Thompson term does not appear in the initial equation. See, for example Angrist, Direct Energy Conversion, 4th ed., Boston: Allyn and Bacon, Inc. (1982), the entire contents of which are incorporated by reference herein. The resulting simpler expressions for COP, Max DT, temperature profile and other derived expressions used herein are called CTE solutions.

In the DTP governing equations provided herein, the Thompson term is retained, and transport properties are changed in the primary direction of current flow x in accordance with advantageous design rules that result from the more comprehensive DTP formulation. These newly presented equations form the basis for a more complete and useful set of solutions to Equation (1), and the solutions to these equations provide for and enable designs that increase device performance.

If the terms in equation (1) are rearranged, when current flows, the Thompson term and the Joule heating term are seen to partially offset each other:

$$\frac{d}{dx}\left[\lambda(x)\frac{dT(x)}{dx}\right] - T(x)j(x)\frac{dS(x)}{dx} + j(x)^2\rho(x) = 0. \quad (2)$$

The Thompson term is a linear function of current density, j, while the Joule heating term contains current density squared ($j(x)^2\rho(x)$), so it may be understood that these terms completely offset one another at each location, x, at zero current density and at a non-zero value of current density. The terms will partially offset each other at all other current densities.

As provided herein, the Thompson term magnitude may be chosen (subject to physical material limitations) to offset the Joule heating term, and/or to optimize COP, and/or to optimize any other desired operating metric or combination of desired operating metrics. Subject to constant ZT throughout the TE element, where ZT refers to the thermoelectric figure of merit ($ZT=S^2/(\lambda\rho)$), the optimum performance may be achieved in DTP systems when, at optimum TE efficiency, the temperature profile within the TE element is:

$$T(x) = T_C\left(\frac{T_H}{T_C}\right)^{\frac{x}{x_0}} = T_C e^{D\frac{x}{x_0}} \quad (3)$$

where $T_C$ is the cold end temperature, $T_H$ is the hot end temperature, $x_0$ is the TE element length, and $$D = \ln\left(\frac{T_H}{T_C}\right)$$

and the transport properties. S(x), λ(x), and ρ(x) continuously vary with position along the element length in the following fashion:

$$S(\varepsilon, x) = S_C e^{A(\varepsilon)\frac{x}{x_0}} \text{ where } A(\varepsilon) = \frac{ZT\varepsilon^2 + \ln^2\left(\frac{T_H}{T_C}\right)}{ZT\varepsilon - \ln\left(\frac{T_H}{T_C}\right)} \quad (4)$$

$$\lambda(\varepsilon, x) = \lambda_C e^{B(\varepsilon)\frac{x}{x_0}} \text{ where } B(\varepsilon) = \frac{ZT\varepsilon^2 + \ln^2\left(\frac{T_H}{T_C}\right)}{ZT\varepsilon - \ln\left(\frac{T_H}{T_C}\right)} \quad (5)$$

$$\rho(\varepsilon, x) = \rho_C e^{C(\varepsilon)\frac{x}{x_0}} \text{ where } C(\varepsilon) = \frac{\varepsilon + \ln\left(\frac{T_H}{T_C}\right)}{1 - \frac{\ln\left(\frac{T_H}{T_C}\right)}{ZT\varepsilon}}. \quad (6)$$

As provided herein, the temperature profile presented in Equation (3) may be used to design and implement the optimum profile within a TE element with constant ZT. Also, Equations (4), (5) and (6) may be used in the thermoelectric element design, for example to select appropriate material properties within the thermoelectric leg that change in the direction of current flow that provide as close to optimal of a solution to these equations, within the constraints of real-world material systems, cost constraints, and the like, as noted elsewhere herein.

FIG. 42 schematically illustrates a notional indication of example (e.g., optimum) Seebeck profiles 208 and 210 as a function of distance from the cold end 204. In some examples, the thermal conductivity and electrical resistivity may have a similar profile form, that is, they increase smoothly in magnitude in a nonlinear fashion toward the hot end 203.

Figure 43:
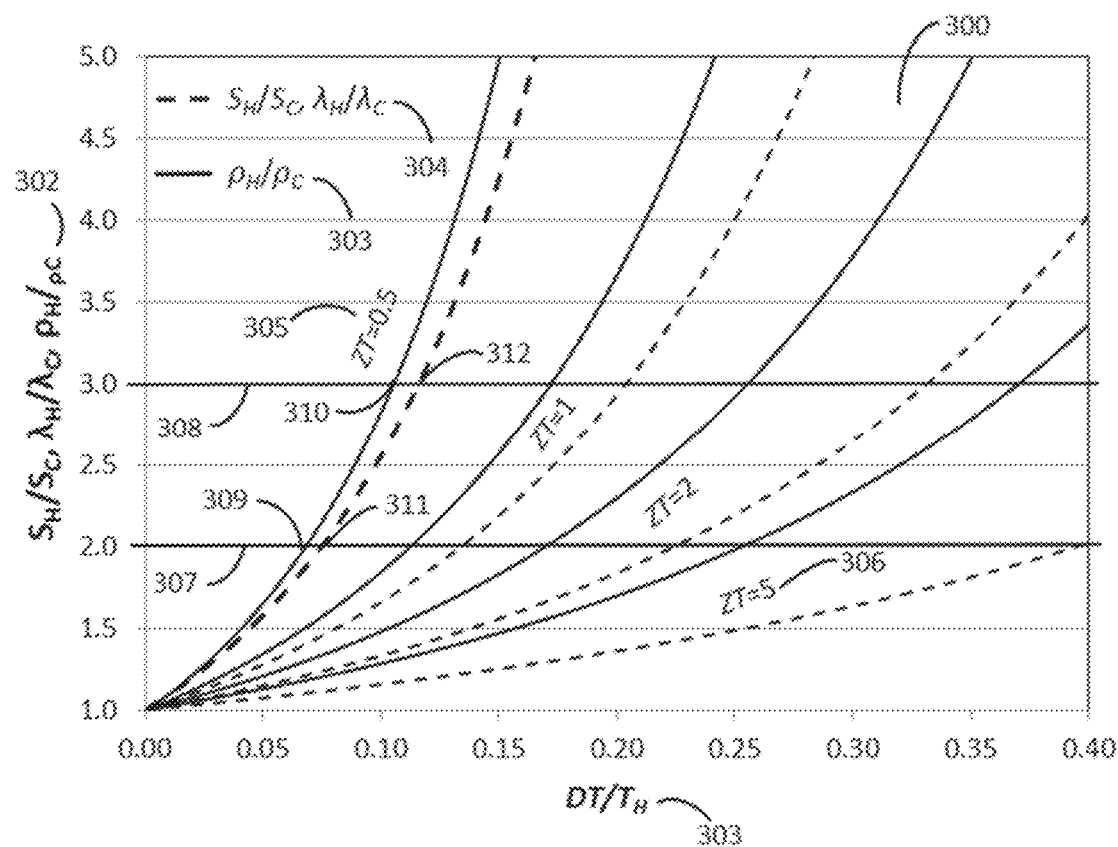
FIG. 43 is a plot of the variation of Seebeck coefficient, thermal conductivity and electrical resistivity in the direction of current flow in example DTP TE elements as a function of $DT/T_H$.

FIG. 43 is a plot of the variation of Seebeck coefficient, thermal conductivity, and electrical resistivity in the direction of current flow in example DTP TE elements as a function of $DT/T_H$. More specifically, FIG. 43 presents a graph 300 of the ratio of transport properties at the hot to cold ends derived from Equations (4), (5) and (6). In FIG. 43, the horizontal axis 303 is $DT/T_H$ the ratio of hot side to cold side temperature differential (DT) to the hot side temperature ($T_H$). The vertical axis 302 are the ratios of each of the hot to cold side for each of the three transport properties. The ratios 304 for Seebeck coefficient and thermal conductivity are the same. The ratio for electrical resistivity 303 is lower. Ratios are presented for several example values of ZT ranging from ZT=0.5 (curve 305) to ZT=5.0 (curve 306). Horizontal line 307 indicates at a ratio of 2.0, and represent the ratios obtainable for some example TE material systems. As an example, horizontal line 307 intercepts ZT curve 305 at a resistivity ratio 303 at point 309. Thus subject to a maximum obtainable resistivity ratio of 2.0, the maximum $DT/T_H$ 303 for which optimum DTP performance can be realized is about 0.07. Similarly, ZT=0.5 305 intercepts horizontal line 308 at point 310, and thus for a realizable resistivity ratio 303 of 3.0, the maximum $DT/T_H$ 303 for which optimum TE performance can be realized is about 0.11. Other limitations result from corresponding realizable transport ratios 304 at points 311 and 312. To fully express the capability of DTP and achieve a hypothetical optimum performance, all three transport properties must follow these relationships. Therefore, in producible (real-world) TE systems, the transport properties of TE designs should approximate the ideal DTP values as closely as production and material considerations, cost, and usage may allow.

Figure 44:
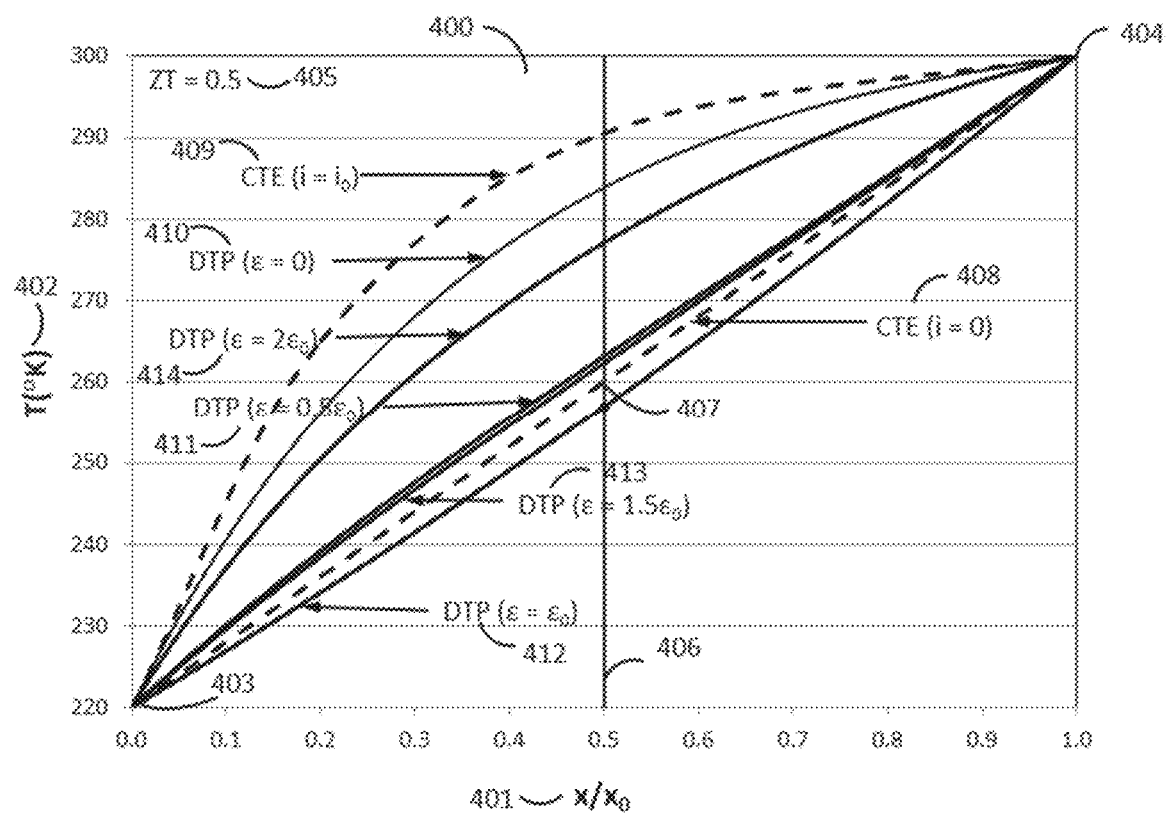
FIG. 44 is a plot of temperature profiles within example CTE and DTP TE elements for a representative variety of operating currents.

The importance of controlling transport properties, and hence producing DTP TE elements in TE couples can be shown by referring to FIG. 44 which shows typical temperature profiles for example couples such as CTE couple 100 of FIG. 41 and DTP TE couple 200 of FIG. 42 at several operating currents. Temperature profile graph 400 has horizontal axis $x/x_0$ 401, the position in the direction of current flow and vertical axis TE element temperature 402. In this example, the TE element cold end temperature 403 is 220 K and the hot end temperature 404 is 300 K. Plots are presented for ZT=0.5 405 with dashed curves 408 and 409 given for temperature profiles at zero current 408 and the current that produces the highest efficiency 409. Similarly, curves 410, 411, 412, 413 and 414 present example DTP TE element temperature profiles for currents ranging from zero (that is, ε=0) to two times the current that produces optimum efficiency (ε=2ε$_0$). Vertical line 406 identifies the midpoint along the TE element length 401. For example, point 407 indicates that a CTE TE element temperature at its midpoint is 260 K. The profile at zero current is linear because CTE properties do not change with position or temperature. As current increases, Joule heating adds a parabolic component to the profile. The profile at optimum COP (i.e. when i=i$_0$) 409 indicates the amount the temperature profile is distorted when typical current flows through a TE element. With DTP TE elements, and the assumption that transport properties are temperature independent, (but position dependent), the profile at zero current 410 is not linear because the thermal conductivity of the TE material varies along the element length in a programmed fashion. At small values of the current, ε, the Thompson term dominates, and the temperature profile 411 becomes increasingly less distorted and at optimal operating current ε$_0$, the temperature profile 412 becomes the ideal file in accordance with Equation (3) and is slightly concave upward. At that condition, the Thompson term and the Joule heating term cancel each other so that the profile is optimum. At greater current 413 and 414 the temperature profile becomes concave downward since Joule heating dominates.

Figure 45:
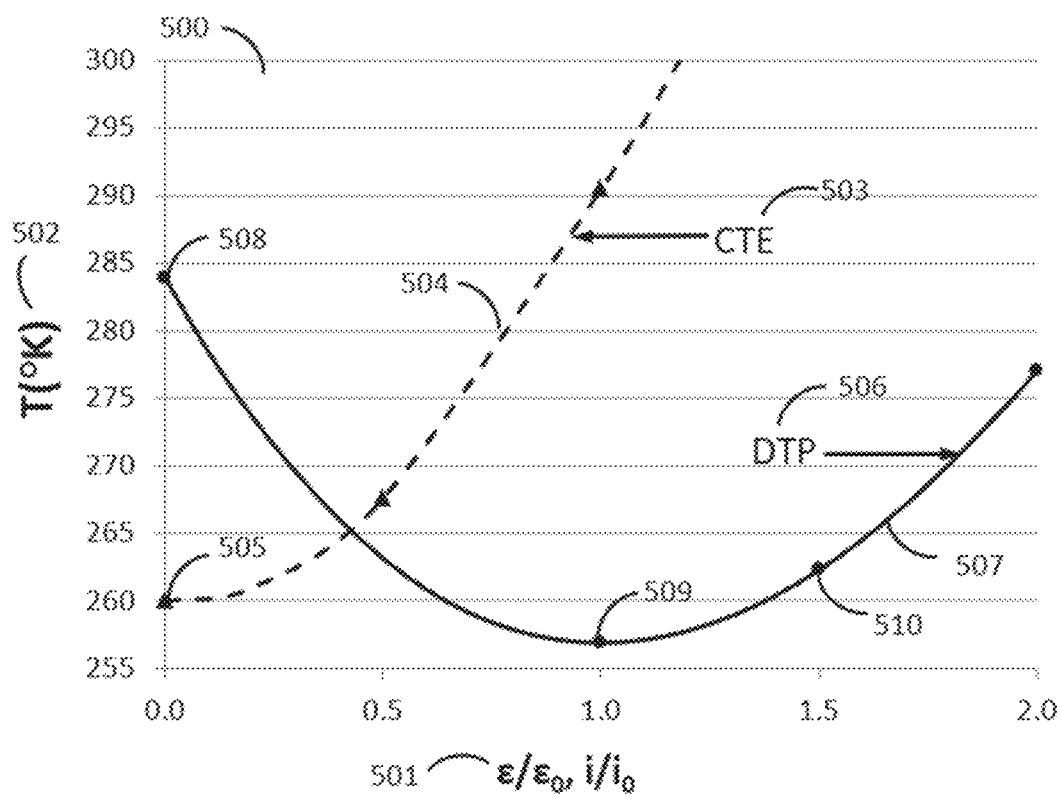
FIG. 45 is a plot depicting the temperature profile at the center point of example CTE and DTP TE elements as a function of position along the element length for different operating currents.

FIG. 45 is a plot depicting TE element midpoint temperature as a function of current. The horizontal axis, 501 is the ratio of both CTE and DTP currents to their respective currents that produce peak efficiency (COP). The vertical axis 502 is the temperatures at the midpoint for both the example CTE and DTP TE elements modeled in FIG. 44, that is, the temperature on line 406 of FIG. 44. Dashed temperature plot 504 presents the midpoint temperature for CTE TE elements (under the conditions associated with FIG. 44). Similarly, solid curve 506 is the plot for a DTP element. Points 505 and 508 are temperatures 504 and 507 respectively for the example CTE 503 and DTP 507 TE elements at zero current. As currents 501 increase, CTE midpoint temperature 504 increases due to Joule heating, while DTP midpoint temperature 506 decreases due to the dominance of the Thompson effect over Joule heating, reaching a minimum and the optimum temperature profile at current 501 value of 1.0 509. The DTP profile 506 becomes less distorted from the ideal profile as current increases. Large distortions of DTP profile 506 occur at higher current 501 that with the CTE profile 504, so DTP TE elements can be operated efficiently at higher currents 501. As a result, cooling capacity, which increases with input current, can be higher. Further, the DTP optimum midpoint temperature, 509 is not reached by CTE profile 505, at any current. Thus, efficiency of CTE TE elements will be lower and therefore DTP efficiency will be greater than for CTE systems. While FIGS. 44 and 45 are specific examples, they represent the relative characteristics of CTE and DTP systems more generally, and it can be stated that for ideal CTE and DTP systems, DTP systems will have higher peak efficiency (COP) and will have higher cooling capacity.

The basic transport equations for CTE and the new transport equations for DTP govern the efficiency and cooling capacity of the respective thermoelectric systems they describe. In CTE devices, the cooling capacity as a function of current is:

$$q_{CCTE}(i) = \lambda\left(ZT_C^2 i\left(1 - \frac{i}{2}\right) - \Delta T\right) \tag{7}$$

which leads to a maximum cooling capacity of:

$$q_{CCTE}(i_{MAX}) = \lambda\left(\frac{ZT_C^2}{2} - \Delta T\right). \tag{8}$$

The maximum COP may be expressed as:

$$COP_{CCTE}(i_0) = \frac{T_C}{\Delta T}\left(\frac{M_A - \frac{T_H}{T_C}}{M_A + 1}\right) \tag{9}$$

and COP as a function of current, i, may be expressed as:

$$COP_{CCTE}(i) = \frac{q_{CCTE}(i)}{q_{HCTE}(i) - q_{CCTE}(i)}, \tag{10}$$

in which:

$$q_{HCTE}(i) = \lambda\left(ZT_C T_H\left(1 + \frac{i}{2}\right) - \Delta T\right). \tag{11}$$

In DTP systems, the newly developed cooling capacity equation as a function of current is:

$$q_{CDTP}(i) = T_C \lambda_C \left[ZTi - \ln\left(\frac{T_H}{T_C}\right)\right]. \tag{12}$$

Note that for DTP, there is no theoretical maximum cooling capacity since the current, c, is unbounded. However, in attainable designs in the real world, there will be a practical maximum subject to the limitations in the range of Seebeck and the other transport properties that are available with a high ZT as noted in the discussion of FIG. 43.

The COP of the newly developed DTP cooling system does have a peak value:

$$COP_{CDTP}(\varepsilon_0) = \frac{1}{\left(\frac{T_H}{T_C}\right)^{\left(\frac{M+1}{M-1}\right)} - 1}. \tag{13}$$

The COP as a function of current may be expressed as:

$$COP(\varepsilon) = \frac{q_{CDTP}(\varepsilon)}{q_{HDTP}(\varepsilon) - q_{CDTP}(\varepsilon)}, \quad (14)$$

where:

$$q_{HDTP}(\varepsilon) = T_H \lambda_C e^{A(\varepsilon)} \left( ZT\varepsilon - \ln\left(\frac{T_H}{T_C}\right) \right)$$

Figure 46:
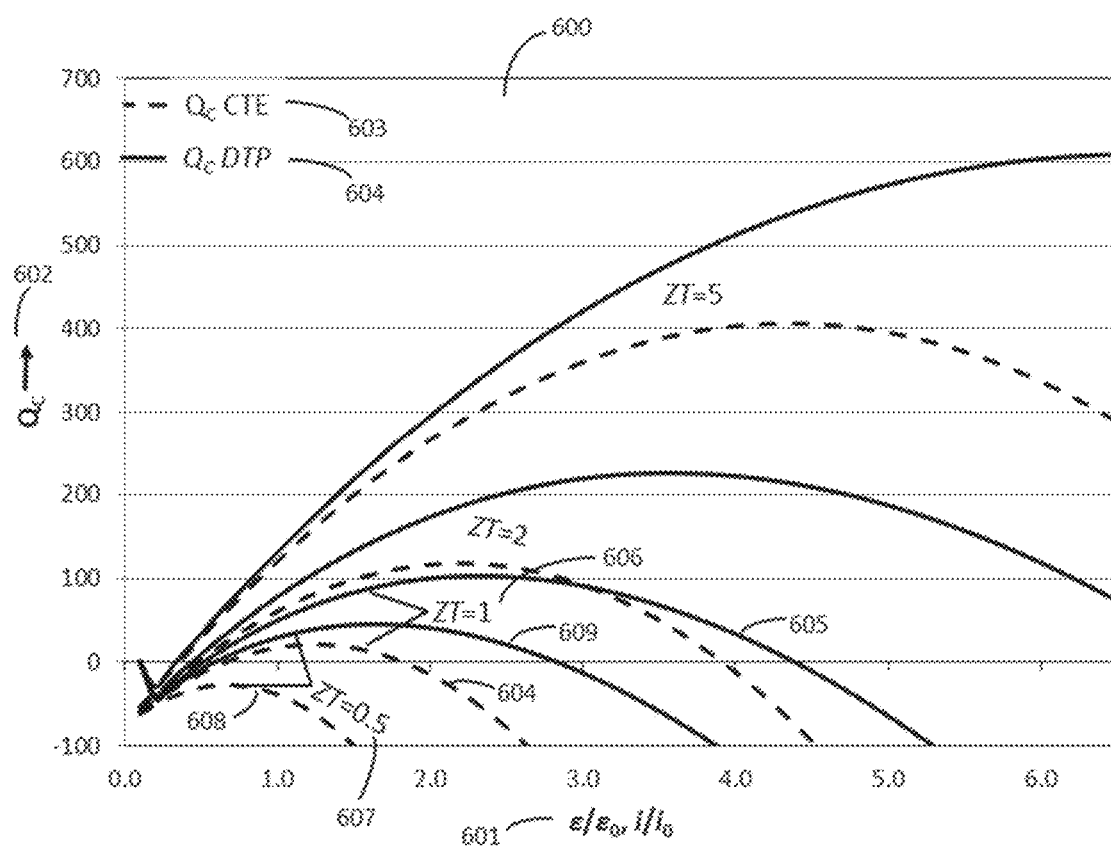
FIG. 46 is a plot depicting example CTE and DTP TE couple cooling capacity as a function of input current for a representative DT and ZTs (figure of merit $ZT=S^2/(\lambda\rho)$).

FIG. 46 presents graph 600 in which the horizontal axis 601 is the ratio of both CTE and DTP currents to their respective currents that produce peak efficiency (COP) and a vertical axis 602 is cooling capacity, $Q_C$ for couples such as example CTE couple 100 of FIG. 41 and example DTP TE couple 200. CTE cooling capacities are curves 603 and DTP cooling capacity curves are 604. Results are shown for several ZTs. The curves are representative of TE systems operating near Max DT. CTE curve 604 shows the cooling capacity 602 for CTE systems as a function of current. Similarly, DTP curve 605 shows cooling capacity for the same DT and ZT values. The computations demonstrate that DTP 605 $Q_C$ values range of operating current 601 are always higher than CTE 604 values. Similarly, for ZT=0.5 607 DTP 609 $Q_C$ values range of operating current 601 are always higher than CTE 608 values. In this particular design case CTE values 608 are always less that zero, meaning that under this condition no cooling power $Q_C$ 602 is produced. In contrast, the corresponding DTP 609 TE device produces positive cooping power $Q_C$ 602. This result demonstrates the higher performance of the DTP system.

Figure 47:
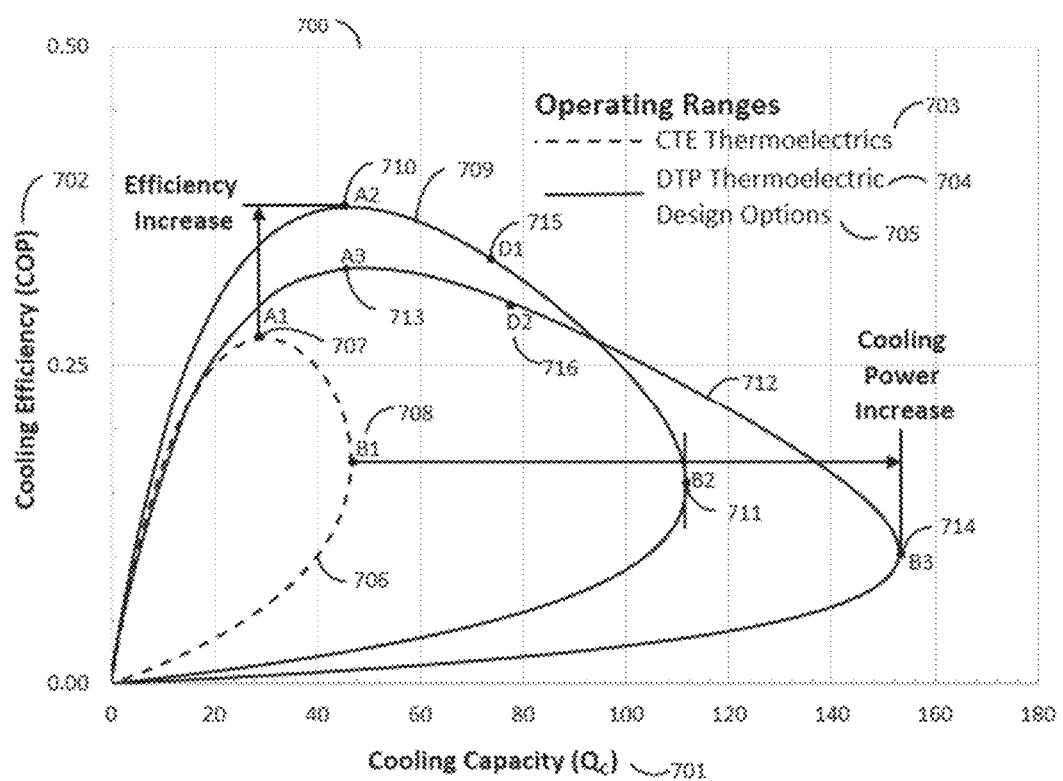
FIG. 47 is a plot depicting the relationship between COP and cooling capacity for example CTE and DTP TE elements in a typical operating condition.

FIG. 47 depicts properties of DTP systems that differ from those of CTE system couples such as CTE couple 100 of FIG. 41 and DTP TE couple 200. The graph represents a particular example of a descriptive operating condition. Horizontal axis 701 is cooling capacity, $Q_C$ and vertical axis 702 is COP. CTE operation range is denoted by curve 703 and DTP operating curves are 704 and 705 denote performance options for DTP TE systems. Curve 706 for CTE systems is a plot of the relationship between COP verses $Q_C$ for all currents for which a positive $Q_C$ is generated. As is evident, curve 706 is a closed loop with peak COP at point A1 707 and peak $Q_C$ at point B1 708. The CTE device operation is anywhere on curve 706. Similarly, loop curve for DTP TE system 709 has peak COP at point A2 710 and peak $Q_C$ at point B2 711. However, unlike CTE curve 706, DTP systems can have transport properties of different functional form with position (but only one such set of transport properties produces optimum COP), and so other performance curves, such as loop curve 712 are producible. In loop curve 712, peak COP point A3 is lower than the corresponding point A2 710 for loop curve 709, and the peak cooling capacity 801 at point B3 714 is greater than peak $Q_C$ (point B2 711) for design loop curve 709. In all, a broad range of loop curves are possible, each with a tradeoff of peak COP 702 and Peak $Q_C$ 701. Loop curve 709 design is preferable to that of loop curve 712 if maximum efficiency is the primary goal and loop curve 712 would be preferred if cooling capacity was most important. Thus, within the property limitations of TE materials, performance of DTP systems can be tailored to best meet the functional requirements of particular cooling applications. The ability to select design relationships between COP and $Q_C$ is a distinct feature of DTP design that is new to the art of TE device design.

Figure 48:
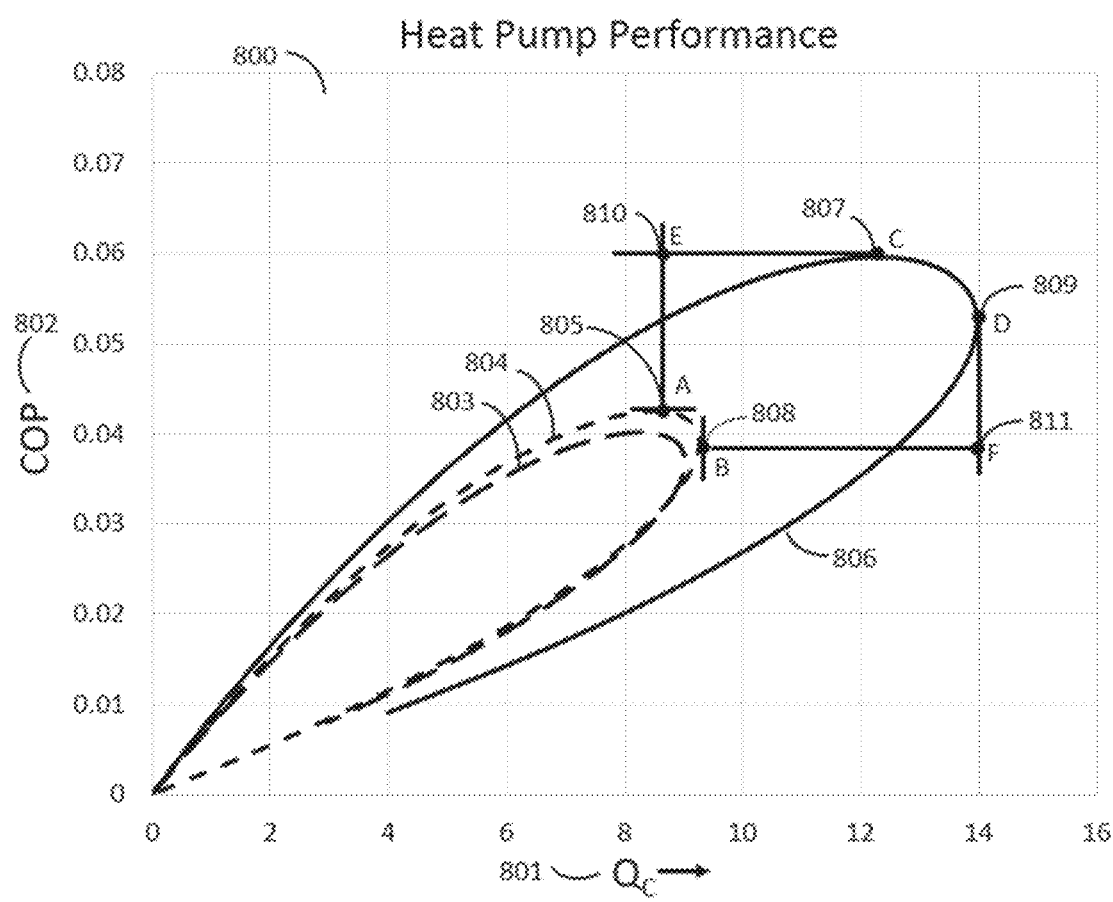
FIG. 48 is a plot comparing the design performance of example commercially available CTE elements and an example DTP TE element designed with commercially available TE materials.

FIG. 48 presents computations that describe the relative performance example high-performing commercially available TE CTE couples including different TE materials than each other, where the p-type leg includes a single homogeneous TE material and the n-type leg includes a different single homogeneous material, with that of an example DTP TE couple designed with the same TE materials which optimize COP by employing DTP design. Graph 800 has horizontal axis cooling capacity, $Q_C$ 801, and vertical axis 802 COP. Loop curve 803 is the computed performance of one of the CTE material systems. Loop curve 804 is a similar curve for the highest performing material. For loop curve 804, point A 805 denotes the highest attainable value of COP 802 and point B 808 the highest $Q_C$ 801. Loop curve 806 shows the properties of the best DTP design operating under the same conditions utilizing best commercially available TE materials. Loop Curve 806 has peak COP 802 at point C 807 and peak $Q_C$ 801 at point D 809. Comparing peak COP 802 from CTE loop curve 804 with DTP loop curve 806, the gain is depicted as point E 810 and the gain for peak $Q_C$ 801 as point F 811. Graph 800 displays the difference in DTP and CTE performance. As an example, for DTP system 806, the maximum COP 802 shown as point C 807 is about 0.060 while the maximum COP 802 of CTE system 804 at point A 805 is about 0.042. Thus, the COP for the DTP system 806 is greater than that of the CTE system 805 as is readily observed as the difference between the COP 802 value at point A 805 and the DTP curve value at point E 810. Similarly, for DTP system 806, the maximum $Q_C$ 801 shown as point D 809 is about 14.0 while the maximum $Q_C$ 801 of CTE system 804 at point B 808 is about 9.4. Thus, the value for $Q_C$ 801 for the DTP system 806 is greater than that of the CTE system 805 as is readily observed as the difference between the $Q_C$ 801 value at point B 805 and the DTP curve value at point F 811.

Figure 49:
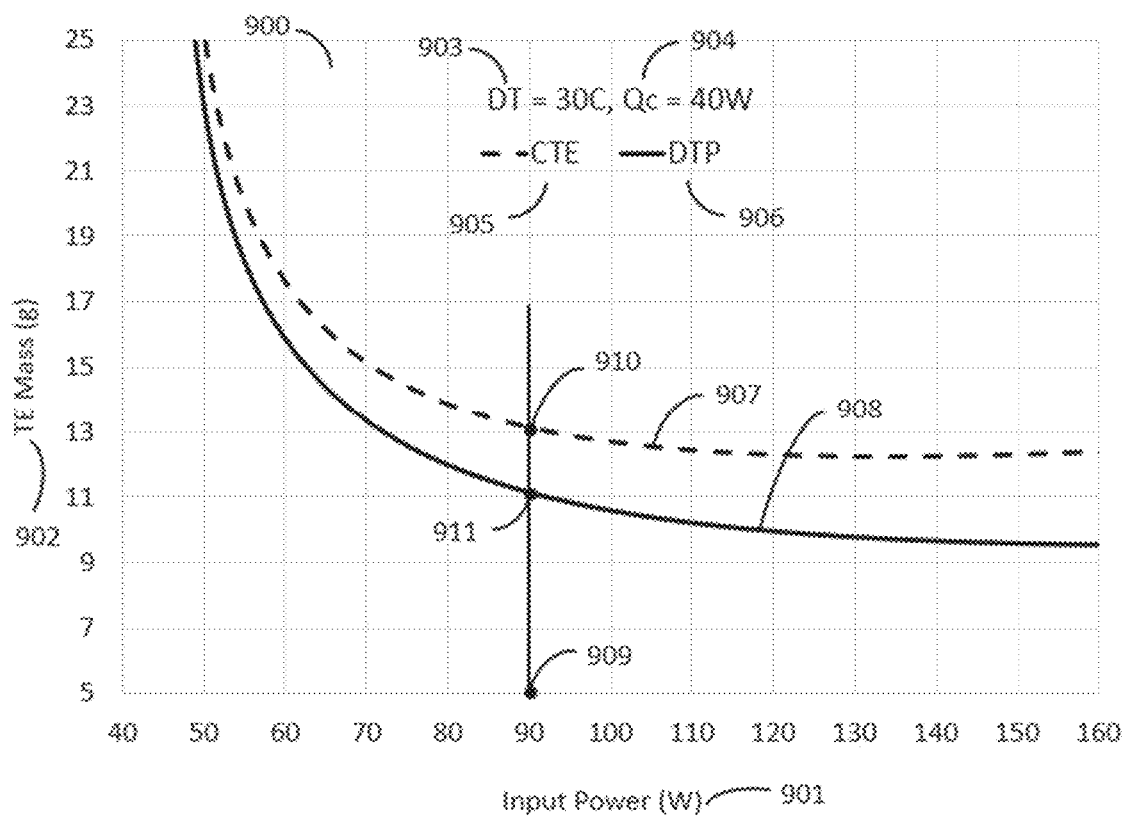
FIG. 49 is a plot comparing material usage of example CTE TE elements versus that of example DTP TE elements operating under the same conditions.

FIG. 49 depicts graph 900 with horizontal axis 901, input power and vertical axis 902, TE mass for DT=30° C. 903, $Q_C$=40 W for both CTE 905 and DTP 906 TE systems. Graph 900 is a specific example of the relative weights of the TE material requirements for the two system designs each operating at the same hot side and cold side temperature, each constructed of commercially available TE materials and each producing the same $Q_C$. Here, the relevant difference is CTE 905 compared to DTP 906. Curve 907 is the weight of TE material required of the CTE system and curve 908 is the weight for the corresponding DTP system. As an example, consider a design power input of 90 Watts point 909, with cooling output $Q_C$=40 W 904. CTE curve 908 requires an amount of TE material indicated by point 910 and similarly, point 911 indicates the amount of DTP material required. Thus, in this particular example about 15% less TE material is required to achieve the same performance with a DTP material as for a CTE material. The material reduction may, for example, result in the need for 15% fewer TE elements of the same size and weight. As such, in addition to the reduced material usage, beneficial reductions in size and weight are provided by the DTP system as compared to that of the CTE system. Other operating conditions would also display a range of material usage for DTP systems, with some showing small reductions and other considerably larger reductions.

The ability to reduce the mass of thermoelectric material utilized for a given thermal power output is a valuable attribute of DTP devices. For example, such a reduction in mass has the benefit to preserve and extend limited resources such as the amount of tellurium contained in conventional bismuth telluride TE material systems and in other TE material systems containing other costly, hard to obtain, or rare materials.

Figure 50:
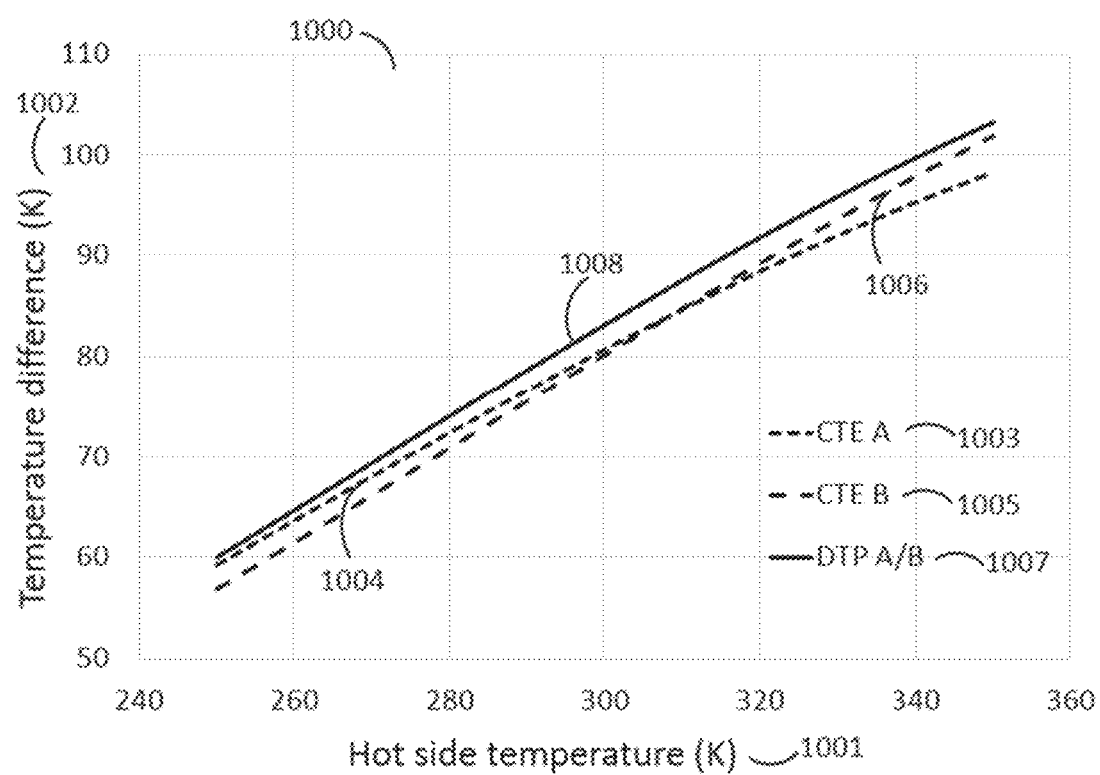
FIG. 50 is a plot comparing the performance of two example CTE TE elements, using respective materials, with the same two materials fabricated into an example DTP TE element.

FIG. 50 is another example of important differences between CTE and DTP TE couples. Graph 1000 has horizontal axis hot side temperature 1001 and vertical axis has maximum temperature difference (Max DT) 1002. In this example, CTE material system A 1003 is the commercial TE material that exhibits the highest Max DT for materials designed to operate with their hot side below room temperature. CTE material B 1005 exhibits the highest Max DT for materials designed to operate at high hot side temperatures curve 1006. Material A/B 1007, designed from materials A 1003 and B 1005 using DTP design principles, produces Max DT curve 1008. In Graph 1000, the conditions are that each of the three system designs operate in the same environment, at the same hot side temperature, are constructed from TE elements of the same height and the TE elements have the same contact resistance at end terminations. Graph 1000 shows that by using the same TE materials in an optimum DTP configuration, Max DT is greater for DTP curve 1008 over the entire operating range. Thus, employing DTP teachings, the same TE materials can produce greater Max DT performance over a broad range of operating conditions.

Figure 51:
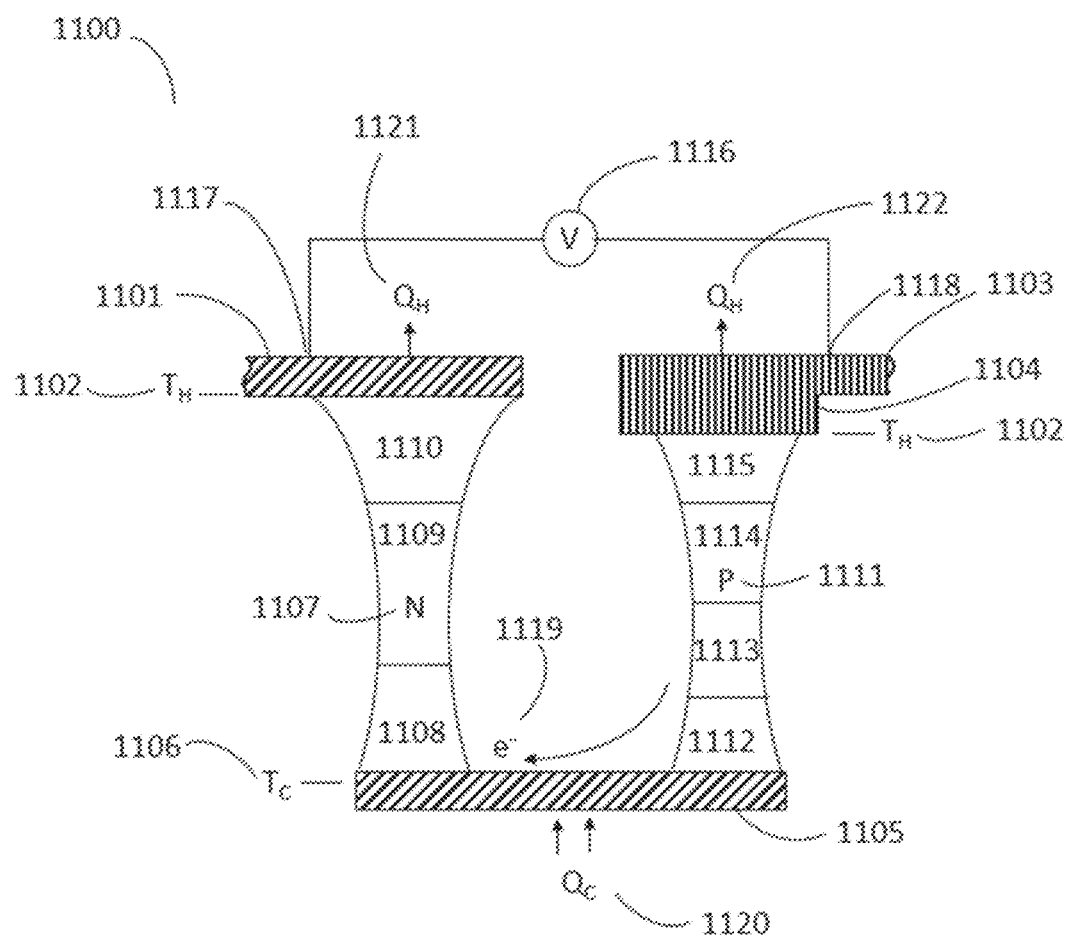
FIG. 51 schematically illustrates an example design option for a DTP TE couple.

To depict some of the freedoms in the design of DTP elements, FIG. 51 is a schematic of a TE couple 1100 including TE elements that vary in cross sectional area in the direction of current flow and the elements include different TE materials. TE couple 1100 has hot side electrodes 1101 and 1103 each at temperature $T_H$ 1102. Electrode 1103 is depicted as being a different thickness than electrode 1102. Cold side electrode 1105 is at temperature $T_C$ 1106. N-type TE element 1107 includes n-type TE material segments 1108, 1109 and 1110. P-type TE element 1111 includes p-type TE material segments 1112, 1113, 1114 and 1115. Electric power source 1116 is connected to hot side electrode 1101 though connection 1117 and to hot side electrode 1103 through connection 1118. In operation, when power is applied so that electrons 1119 flow in the direction shown, cold electrode 1105 absorbs thermal power $Q_C$ 1120 and rejects heat $Q_H$ 1121 and 1122 through hot side electrodes 1101 and 1103. Advantageously, the three n-type TE materials 1108, 1109 and 1110 that comprise n-type TE element 1107, each have Seebeck coefficients, thermal conductivities and electrical resistivities that, in magnitude, are progressively larger toward hot end 1102. Thus, while the TE materials within each individual TE segment, 1108, 1109 and 1110 have traditional TE material properties that do not vary, the entire n-type TE element 1107 functions as a DTP TE element. A similar description holds for p-type TE element 1111.

Simulations demonstrate that sufficient Thompson effect, which is generated at the boundaries where the segments connect, can produce a significant portion of the DTP effect if the transport properties varied continuously. For further details, see the following references authored by the present inventors, the entire contents of each of which references are incorporated by reference herein: Crane and Bell, "Maximum temperature difference in a single-stage thermoelectric device through distributed transport properties," International Journal of Thermal Sciences 154: 106404, pages 1-9 (2020); and Bell, "Optimally distributed transport properties can produce highest performance thermoelectric systems," Phys. Status Solidi A: 1900562, pages 1-7 (2019). As demonstrated, more segments can produce heat pumping performance closer to that of elements with continuously varying transport properties. For example, a TE element including 5 or more segments in general, can have nearly the same performance as that of a TE element fabricated from the same TE material system but with continuously vary transport properties.

Referring to FIG. 50, material system A/B is an example of a segmented DTP TE couple. In that embodiment, the DTP couple is designed using two segments (materials A and B) in each leg of the couple, The resulting Max DT, while greater than that of material A or B alone, could exhibit higher performance if several segments with properties between those of A and B could be used it its design.

Figure 52:
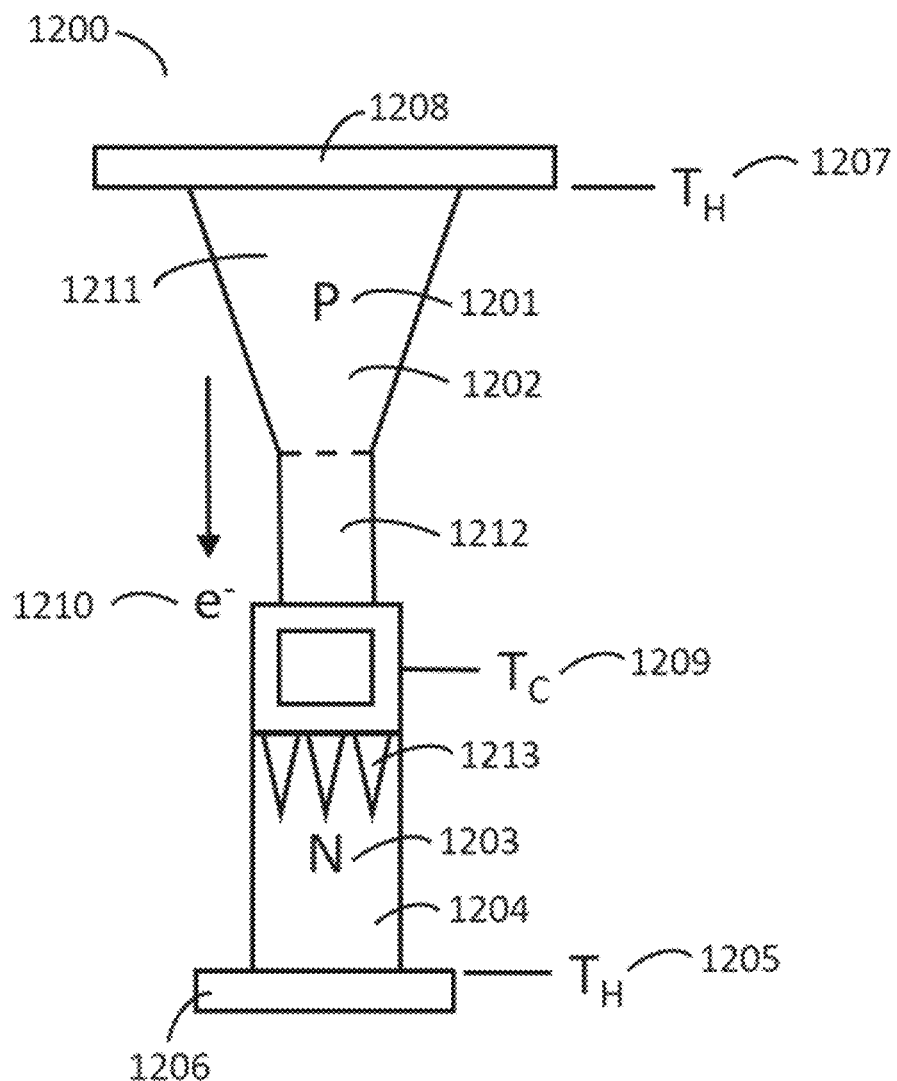
FIG. 52 schematically illustrates an example design option for a DTP TE element in a stack configuration.

FIG. 52 depicts a DTP TE couple arranged in a stack configuration. Stack TE schematic 1200 has a p-type TE element 1201 including segment 1202 and segment 1203. TE element 1201 is in electrical and thermal contact with hot side electrode 1204 at temperature 1205 and on the cold side to electrode 1206 at temperature 1207. Advantageously, the thermal and electrical contacts have interfacial resistances that are less than 2% of the TE element resistances. In some examples, n-type TE element 1208 is a monolithic DTP TE element. TE element 1208 is in good electrical and thermal contact with hot side electrode 1209 at hot side temperature 1210 and on the cold side electrode 1206 at cold side temperature 1207.

For explanatory purposes, and to demonstrate the range of design freedom that can be employs to optimize DTP TE couple design freedom, TE DTP couple 1200 is depicted as having a complex design. P-type TE element 1201 is shown as having a conical shape and is mated to cylindrically shaped segment 1203. More discussion of the effects of area change in the direction of current flow on DTP performance can be found in see the following reference authored by the present inventors, the entire contents of which reference are incorporated by reference herein: Crane and Bell, "Maximum temperature difference in a single-stage thermoelectric device through distributed transport properties," International Journal of Thermal Sciences 154: 106404, pages 1-9 (2020). (As one example, cross sectional area change can be employed to modify the relationship between thermal and electrical resistance to better optimize DTP performance). As noted above, N-type TE element 1208 has DTP structure. At its cold end it has slots 1212 extending downward into the body of n-type TE element 1208 to vary cross sectional area at the cold end.

Advantageously, cold electrode 1206 is fabricated from a material with high electrical and thermal conductance such as copper or silver. The hollow cold side electrode 1206 depicted can provide a temperature controlled environment for samples, electronic circuits, laser systems, sensors, and any other item of appropriate size requiring temperature control.

Stack design 1200 has different mechanical and heat loss performance characteristics than the couple design of FIG. 41. Advantageously, compressive loads are applied to hot electrodes 1204 and 1209 so that the system is under compressive load in operation. Some TE materials, such as Bismuth Telluride are physically weak and can fail under modest tensile or shear load, and therefore benefit from being appropriately loaded in compression. Further, stack design 1200 can better control parasitic losses, including those from thermal conduction and convection, electrical resistances and cold side radiant heating.

Figure 53:
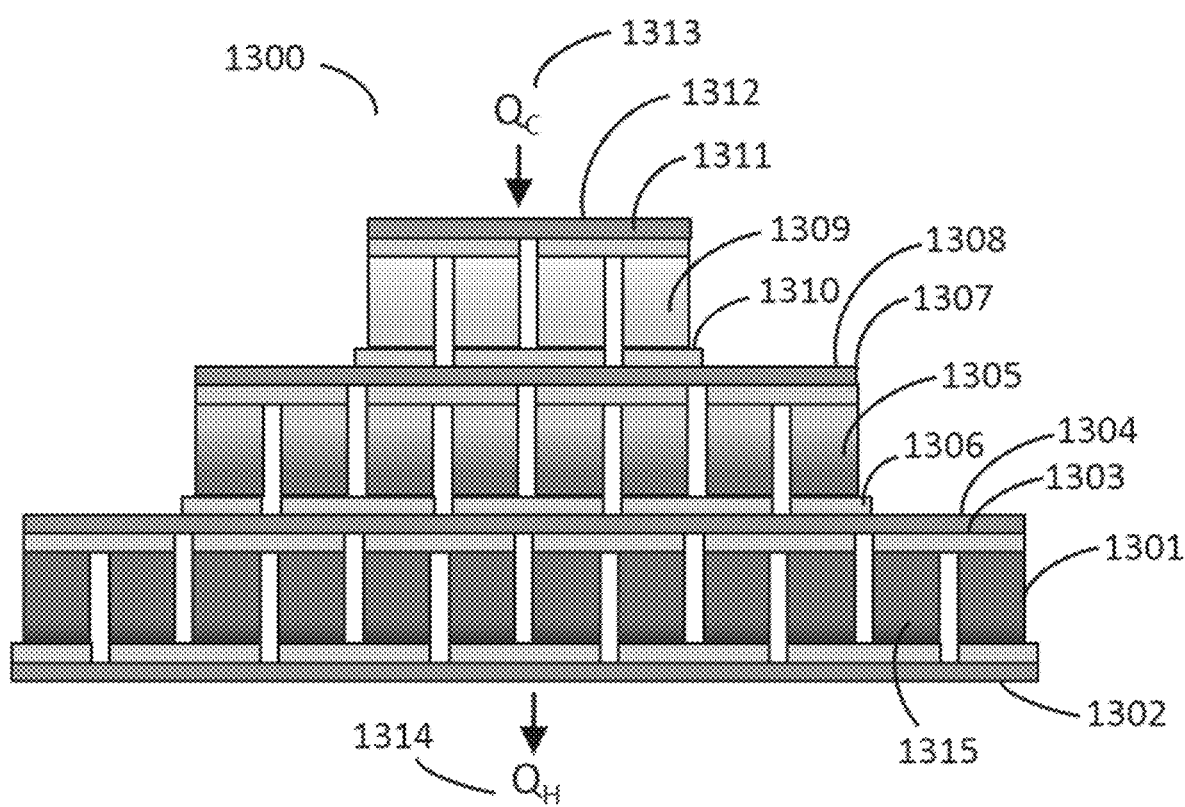
FIG. 53 schematically illustrates an example TE element cascade design.

FIG. 53 depicts a TE cascade 1300, comprising a first TE array 1301, with hot side 1302 and cold side 1303 in good thermal contact with substrate 1304. A second TE array 1305 with hot side 1306 in good thermal contact with substrate

1304. Hot side 1307 of TE array 1305 is in good contact with substrate 1308. Similarly, a third TE array 1309 with hot side 1310 is in good thermal contact with substrate 1308. Cold side 1311 of TE array 1309 is in good contact with cold side substrate 1312. TE arrays 1301, 1305 and 1309 are comprised of n-type and p-type TE couples 1315 connected electrically in series or series parallel arrangements with the hot sides 1302, 1306 and 1310 of the couples on the bottom side of each array and the cold side 1303, 1307 and 1311 at the top of each array. Thus, cooling $Q_C$ 1313 plus electric power input into array 1309, not shown, is rejected by the hot side of array 1309 and absorbed by cold side of array 1305. Similarly, thermal power from the hot side of array 1309 plus electric power input into array 1305, not shown, is rejected at the hot side of array 1305 and absorbed by cold side of array 1301. That thermal power plus the electric power input into array 1301, not shown is rejected to hot side 1302.

TE cascades 1300 are commercially available from several sources. Their primary usage is to produce DTs that are beyond the Max DT of single stage CTE devices or are beyond the cooling capacity of single stage CTE devices at the required DT. Cascades, 1300 are commercially available with up to six arrays. Generally, each additional array may provide a diminishing contribution to DT. Importantly, because of the efficiency limitations of each CTE array, COP is very low for several stage cascades.

Figure 54:
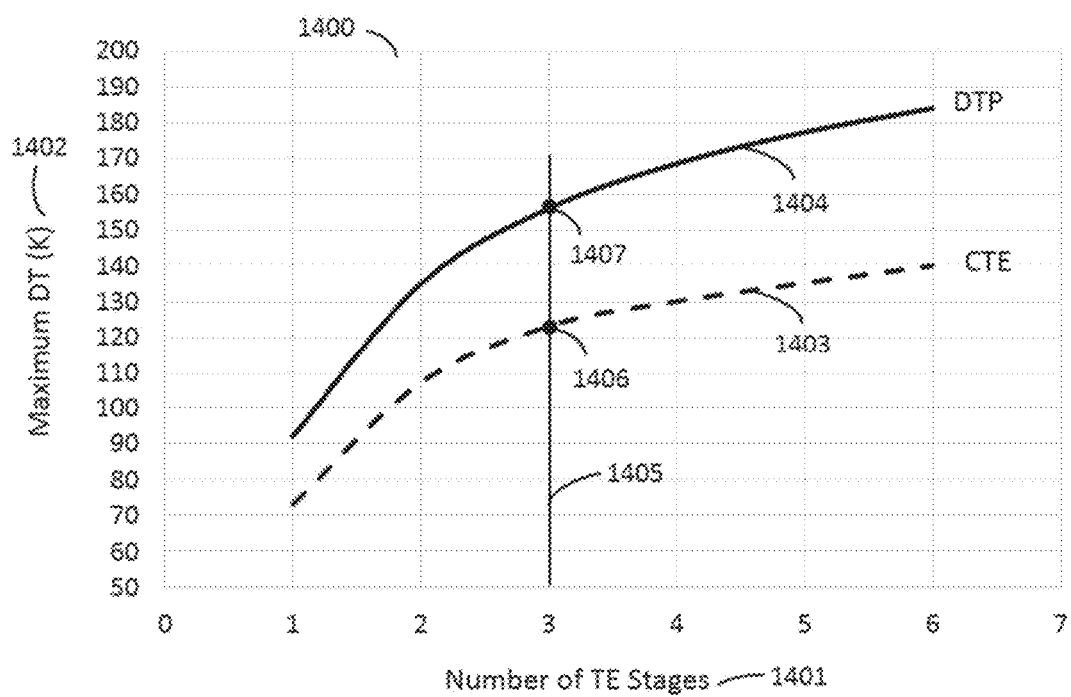
FIG. 54 is a plot comparing example CTE and DTP TE element performance as a function of the number of cascade stages.

Since DTP TE systems can increase TE system efficiency and heat pumping capacity, DTP TE cascade designs exhibit important performance characteristics not available in CTE cascades. FIG. 54 presents a performance comparison between CTE and DTP cascade TE system designs. Graph 1400 has as the horizontal axis TE cascade stages 1401 and vertical axis Max DT 1402. CTE cascade system curve 1403 and DTP curve 1404 are plots of the Max DT attainable with commercially available CTE cascades and DTP cascade designs using present TE materials operating at a hot side of 300 K. As an example, the performance of 3 stage CTE and DTP cascades, vertical line 1405 intersects CTE curve 1403 at point 1406 corresponding to a Max DT of about 122 K. Line 1406 intersects DTP TE curve 1404 at point 1407 corresponding to a Max DT of about 156 K. The 156 K value is not attainable with commercial CTE cascades with up to 6 stages. These design results show the potential compounding benefits from increased COP and $Q_C$ of DTP TE designs in cascade applications.

Figure 55:
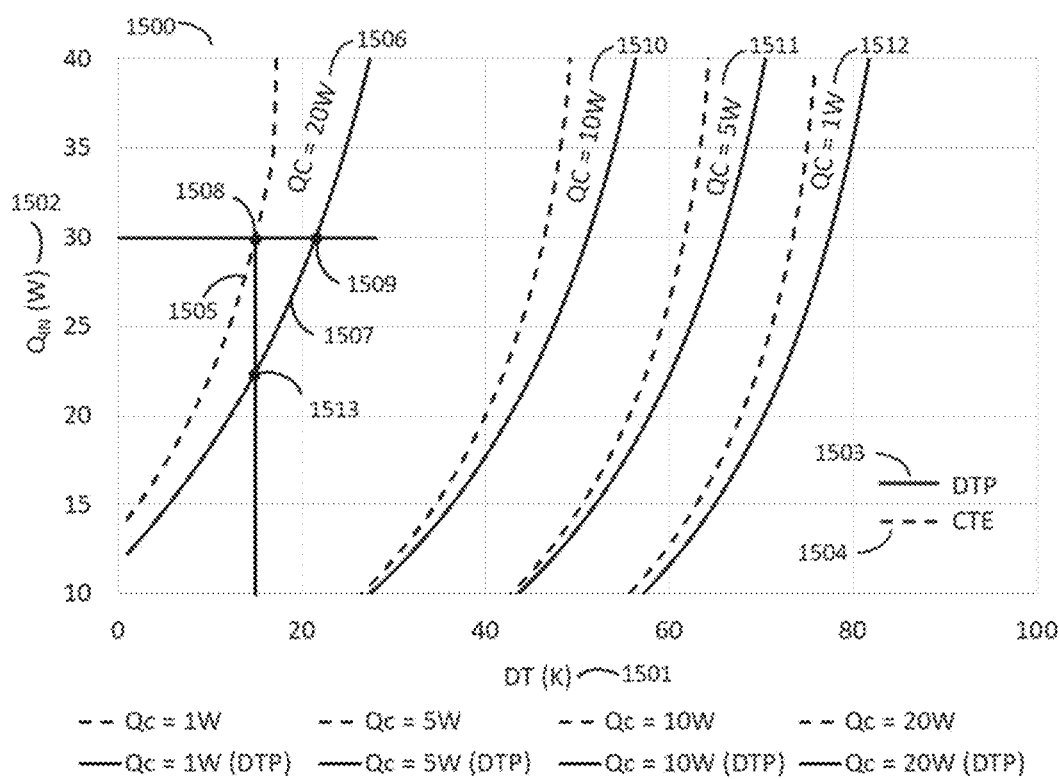
FIG. 55 is a plot comparing example CTE and DTP TE elements in terms of input power and temperature difference for a fixed size and different heat loads.

FIG. 55 depicts graph 1500 with horizontal axis DT 1501 and vertical axis input power $Q_{IN}$ 1502. Solid lines 1503 denote DTP and dashed 1504 denote CTE properties. For a CTE module with fixed TE mass and module physical dimension, dashed curve 1505 presents the relationship between the electrical power input 1502 and the maximum DT 1501 that can produce cooling power output $Q_C$ of $20_W$ 1506. Similarly, solid DTP curve 1507 presents the relationship between the electrical power input 1502 of a DTP module with the same fixed TE mass and the maximum DT 1501 for which a cooling power output $Q_C$ of $20_W$ 1506 can be produced. As an example, point 1508 on CTE curve 1505 at 30 W of power input $Q_{IN}$ 1502, will produce $Q_C=20$ W of cooling power 1506 at a Max DT 1501 of about 17 K point 1508. Similarly, point 1509 on DTP curve 1507 has the same input power $Q_{IN}=30$ W 1502 and will produce 20 W of cooling power at a higher Max DT 1501 of about 21K. Thus, under the same input power and module size constraints, the DTP module can operate at about a 23% greater DT 1501. Similarly, for $Q_C=10$ W 1510, $Q_C=5$ W 1511 and $Q_C=1$ W 1512, DTP modules provide greater Max DT 1501 at all power input levels $Q_{IN}$ 1502. As another example, for a DT 1501 of 17 K and output of $Q_C=20$ W 1506, a CTE module operating at point 1508 of curve 1505 will require a power input $Q_{IN}$ of 30 W while a DTP module of the same size which operates on curve 1507 at point 1513 will require a power input $Q_{IN}$ 1502 of about 22 W. Thus, in this example, the amount of power input $Q_{IN}$ 1502 for use in operation is reduced about 27% for a DTP module as compared to a CTE module.

DTP modules can also operate at a combination of temperature difference, input power and output power $Q_C$ that exceed the capabilities of CTE modules of the same size. For example, a DTP module can operate at point 1509 at DT 1501 of about 22 K, an operating condition for which CTE module, curve 1505, cannot operate at any power level $Q_{IN}$ 1502. These attributes of DTP compared to CTE provide another demonstration of the flexibility to design thermoelectric devices with less input power and thermoelectric material mass, for every temperature difference and heat load.

Compared to CTE elements, which are produced from a single material, the transport properties that change along the direction of current flow of segmented DTP TE elements, may be more favorably manufactured using different processes or processes new to TE element fabrication. Herein, some potentially useful production technologies and methods are described.

In segmented DTP elements made with discrete sections, each section may be metalized on both ends and the segments solder connected to one another. The solder, or solders, can be a conventional solders used within the electronics or other industries or solders tailored to meet the performance requirement of particular DTP TE systems. For example, it may be advantageous to use solders and fluxes formulated to reduce interface thermal and electrical losses at the ends of a TE element to less than 2% of the resistance of the TE element itself, so the interfacial resistances are small compared to the resistance of the TE material portion of an element and do not reduce performance below an acceptable amount. Also, it may be advantageous to use solder systems or TE material surface treatments so that the solder does not wick along the TE leg in the direction of current flow and by controlling wicking, reduce short circuiting from element side wetting to acceptable levels. Also, solders may be used that have mechanical properties that provide stress reduction from thermal coefficient of expansion (CTE) mismatch at segment and TE element end interfaces.

The joining of dissimilar materials, such as a section of an organic TE material adjacent to a section of an inorganic TE material, may benefit from solder connection. Similarly, if CTE mismatch is relatively large, as might be the case in organic/inorganic TE material interfaces, joining of the materials may benefit by connection through low rigidity porous metal interfaces or other conductive material interface systems such as conductive epoxies.

Alternatively, the DTP TE material sections may be fabricated from partially consolidated material powders that are placed in layers to form the DTP segments and spark sinter bonded and consolidated. As another alternative, the TE materials may be coextruded and fabricated into TE elements or systems by current production methods or methods developed for DTP TE device assembly. These processes may produce segmented elements that have reduced or eliminated interfacial resistances. Alternatively, TE segments may be bonded through compression bonding at pressures, time and temperatures that do not degrade the TE material properties. For some material systems it may be beneficial to treat or otherwise prepare the surfaces by adding intermediary materials that enhanced bond quality or by special surface treatments that improve joint properties, reduce interfacial losses or increase mechanical strength and durability.

As another alternative, the TE materials may be fabricated by additive manufacturing (AM), screening, or other printing processes. These processes may be employed to produce DTP TE segmented elements with interfacial resistances that are reduced or eliminated. Further, AM, screening, or printing processing may be used to construct DTP TE elements with thin layers to be consolidated into DTP elements consisting of as few as two segments to more than 5 segments. With these methods, consolidation may be performed without the use of any interfacial solder, adhesive, or other constituents that may add undesirable interfacial resistances.

DTP TE elements with continuously varying properties may be produced using TE material growth from a melt similar to one of the methods used to fabricate CTE elements, but adapted to provide suitable DTP properties by varying the melt constituents in the direction of material growth.

Another method for varying DTP properties within a TE element can be selective doping, in which ion implantation of varying density and depth in used to tailor the Seebeck coefficient, electrical resistivity and or the thermal conductivity of the TE element in the direction of current flow. Implantation may be especially beneficial to reduce interfacial resistances at boundaries of TE segments and at TE element ends. Implantation may also be of benefit to modify the Seebeck coefficient at element ends and interfaces to modify the Thompson effect at such locations and to reduce interfacial losses. Either in combination with ion implantation or separately, the DTP TE element and segments may benefit from thermally induced diffusion of dopants controlled in a manner that produces the change in one or more transport property to produce higher performing DTP TE elements or segments.

Yet another method of varying DTP properties is to subject certain TE materials, such as BiSb based materials to magnetic fields and magnetic field gradients. For example Seebeck coefficient can vary with magnetic field strength at temperature between 50 K and 200 K (Goldsmid, Electronic Refrigeration, 1986, FIG. 4.22). In this embodiment, the TE material itself may not have a compositional change either over the entire length of a DTP TE element or a portion of its length, and the magnetic field gradient may produce transport property variations that may be tailored to produce a DTP TE device.

As provided herein, any combinations of the above processes, material modifications, segment connection methods and connection material systems and environmental exposure may be combined to produce DTP TE elements. See also the following reference authored by the present inventors, the entire contents which reference are incorporated by reference herein: Crane and Bell, "Maximum temperature difference in a single-stage thermoelectric device through distributed transport properties," International Journal of Thermal Sciences 154: 106404, pages 1-9 (2020).

Heating Operation.

In the description of FIGS. 41, 51 and 52 and the usage of TE couples 100, 1100, and 1200 are described in terms of their cooling capability. As an example, thermal power is extracted from cold sides 103 and 105 and heat is rejected from hot side 104. The hot side heat rejection is $Q_H$ 110. In steady state operation, conservation of energy requires that:

$$Q_H = Q_C + Q_{IN} \quad (15),$$

where $Q_{IN}$ is the power supplied by electric power input 108 and all other sources of power acting on the TE couple 100. For explanatory purposes in this discussion of heating operation, it is assumed that power supplied by electric power input 108 is the sole source of $Q_{IN}$. Then, dividing Equation (15) by $Q_{IN}$ provides that:

$$COP_H = COP_C + 1 \quad (16),$$

where $COP_H$ is the heating efficiency and $COP_C$ is the cooling efficiency. $COP_C$ has heretofore been identified as COP. It is important to notice that in steady state operation, since the two differ by a constant, whatever design processes and operating conditions maximize $COP_C$, they also maximize $COP_H$. In steady state, the performance optimizations ascribed to the cooling power of cold sides of the TE couples in FIGS. 41, 51 and 52 apply to hot side heat output $Q_H$ 110. These performance characteristics are a direct result of Equation (16).

If heating output is a design objective, either in addition to cooling or instead of cooling, the hot side of DTP designs can provide heating efficiency and thermal pumping capacity greater than that of CTE systems. As a result, in steady state operation of DTP designs, thermal power (heat) is utilized from the hot side of a DTP system, the resulting heat pump performance can be superior to the thermal power output of comparable CTE system in the same manner as cooling efficiency and cooling capacity can be superior to that of CTE systems. However, and to further clarify performance capability of DTP TE systems, if in steady state operation, the electron flow shown in FIG. 41 is reversed, so hot side 104 becomes cold (thermal power absorbing) and cold sides 103 and 105 become hot (thermal power rejecting) generally, $COP_H$ for a DTP system will be lower than that of a comparable (reference) CTE system.

The differences in COP and $Q_C$ between CTE and DTP TE couples, modules and devices (parts) are a function of the ratio between DT of the measurement condition and Max DT of the CTE part. The functional relationship is discussed and described in the following references authored by the present inventors: Crane and Bell, "Maximum temperature difference in a single-stage thermoelectric device through distributed transport properties," International Journal of Thermal Sciences 154: 106404, pages 1-9 (2020); and Bell, "Optimally distributed transport properties can produce highest performance thermoelectric systems," Phys. Status Solidi A: 1900562, pages 1-7 (2019). For clarity, when general statements are made herein comparing COP and $Q_C$ between CTE and DTP parts, and no specific temperature differential is noted, the ratio DT/(Max DTcte) is 0.9, where Max DTcte is for the comparable CTE part temperature measurement condition. Further, the measurements are made within the design operating temperature range of the TE part. This definition of the measurement condition holds for claims herein in which COPs and QCs of CTE and DTP systems are contrasted. These conditions hold as well for loop curves 803, 804 and 806 in FIG. 48.

It will be appreciated that one or more DTP TE materials, elements, or couples having any suitable DTP design, such as described with reference to FIGS. 42-55, may be used in any suitable heat pump system or vapor cycle, such as described with reference to FIGS. 1-40. The heat pump system or vapor cycle additionally or alternatively may include one or more CTE TE materials, elements, or couples.

Accordingly, under some aspects provided herein, a heat pump system is provided that can be used in a cooling mode and/or in a heating mode. The heat pump system may include tubing configured to hold a refrigerant, a compressor configured to increase pressure of the refrigerant within the tubing, and a first heat exchanger that is downstream of the compressor. The first heat exchanger may be configured to receive a first fluid flow, to receive the refrigerant from the tubing, and to change the enthalpy of the first fluid flow through heat exchange with the refrigerant. The heat pump system may include a second heat exchanger that is configured to receive a second fluid flow, to receive the refrigerant from the tubing, and to change the enthalpy of the second fluid flow through heat exchange with the refrigerant. The heat pump system may include a thermoelectric device that is coupled to the tubing downstream of the first heat exchanger, and configured to change the enthalpy of the refrigerant in the tubing. The heat pump system may include first and second expansion valves that are coupled to the tubing and downstream of the thermoelectric device and the first heat exchanger. The first expansion valve may be located on a first side of the thermoelectric device, and the second expansion valve may be located on a second side of the thermoelectric device. The first and second expansion valves may be configured to expand the refrigerant and reduce refrigerant pressure while conserving refrigerant enthalpy. The heat pump system may include a four-way valve that is controllable to reverse refrigerant flow within the tubing without changing compressor operation. The heat pump system may include a control system configured to control at least the thermoelectric device, the four-way valve, and the compressor to switch the heat pump system from the heating mode to the cooling mode and to switch the heat pump system from the cooling mode to the heating mode. Nonlimiting examples of such a heat pump system are described, for example, with reference to FIGS. 10, 15, 16, 22, and 23. The control systems provided herein can also include or may be provided by mechanical means such as any suitable combination of one or more switches and/or or one or more valves. That is, the control systems provided herein may be or include any suitable electronic control system, mechanical control system, or combined electrical and mechanical control system.

Under another aspect, a heat pump system is provided that can be used in a cooling mode and in a heating mode. The heat pump system may include tubing configured to hold a refrigerant; a compressor configured to increase pressure of the refrigerant within the tubing; and a first heat exchanger that is downstream of the compressor. The first heat exchanger may be configured to receive a first fluid flow, to receive the refrigerant from the tubing, and to change the enthalpy of the first fluid flow through heat exchange with the refrigerant. The heat pump system may include a second heat exchanger that is configured to receive a second fluid flow, to receive the refrigerant from the tubing, and to change the enthalpy of the second fluid flow through heat exchange with the refrigerant. The heat pump system may include a thermoelectric device that is coupled to the tubing downstream of the first heat exchanger, and configured to change the enthalpy of the refrigerant in the tubing. The heat pump system may include first and second expansion valves that are coupled to the tubing and downstream of the thermoelectric device and the first heat exchanger. The first expansion valve may be located on a first side of the thermoelectric device, and the second expansion valve may be located on a second side of the thermoelectric device. The first and second expansion valves may be configured to expand the refrigerant and reduce refrigerant pressure while conserving refrigerant enthalpy. The heat pump system may include at least one valve that is controllable to reverse refrigerant flow within the tubing without changing compressor operation. The heat pump system may include a control system configured to control at least the thermoelectric device and the at least one valve to switch the heat pump system from the heating mode to the cooling mode and to switch the heat pump system from the cooling mode to the heating mode. Nonlimiting examples of such a heat pump system are described, for example, with reference to FIGS. 10, 15, 16, 22, and 23.

Under another aspect, a heat pump system is provided that can be used for temperature control. The heat pump system may include tubing configured to hold a refrigerant; a compressor configured to increase pressure of the refrigerant within the tubing; and a first heat exchanger that is downstream of the compressor and that is configured to receive a first fluid flow, to receive the refrigerant from the tubing, and to change the enthalpy of the first fluid flow through heat exchange with the refrigerant. The heat pump system further may include a second heat exchanger that is configured to receive a second fluid flow, to receive the refrigerant from the tubing, and to change the enthalpy of the second fluid flow through heat exchange with the refrigerant. The heat pump system further may include a thermoelectric device that is coupled to the tubing downstream of the first heat exchanger, and configured to change the enthalpy of the refrigerant in the tubing. The heat pump system further may include first and second expansion valves that are coupled to the tubing and downstream of the thermoelectric device and the first heat exchanger. The first expansion valve may be located on a first side of the thermoelectric device, and the second expansion valve may be located on a second side of the thermoelectric device. The first and second expansion valves may be configured to expand the refrigerant and reduce refrigerant pressure while conserving refrigerant enthalpy. The heat pump system may include at least one valve that is controllable to reverse refrigerant flow within the tubing without changing compressor operation. The heat pump system may include a control system configured to control at least the thermoelectric device and the at least one valve to switch the heat pump system from the heating mode to the cooling mode and to switch the heat pump system from the cooling mode to the heating mode. Nonlimiting examples of such a heat pump system are described, for example, with reference to FIGS. 10, 15, 16, 22, and 23.

Under another aspect, a heat pump system is provided that can be used in a cooling mode and in a heating mode. The heat pump system may include tubing configured to hold a refrigerant; a compressor configured to increase pressure of the refrigerant within the tubing; and a first heat exchanger that is downstream of the compressor and that is configured to receive a first fluid flow, to receive the refrigerant from the tubing, and to change the enthalpy of the first fluid flow through heat exchange with the refrigerant. The heat pump system may include a second heat exchanger that is configured to receive a second fluid flow, to receive the refrigerant from the tubing, and to change the enthalpy of the second fluid flow through heat exchange with the refrigerant. The heat pump system may include a thermoelectric device that is coupled to the tubing downstream of the first heat exchanger, and configured to change the enthalpy of the refrigerant in the tubing. The heat pump system may include an expansion valve that is coupled to the tubing and downstream of the thermoelectric device and the first heat exchanger, configured to expand the refrigerant and reduce refrigerant pressure while conserving refrigerant enthalpy. The heat pump system may include at least one valve that is controllable to reverse refrigerant flow within the tubing without changing compressor operation. The heat pump system may include a control system configured to control at least the thermoelectric device and the at least one valve to switch the heat pump system from the heating mode to the cooling mode and to switch the heat pump system from the cooling mode to the heating mode. Nonlimiting examples of such a heat pump system are described, for example, with reference to FIGS. 1, 2, 3, 4, 5, 6, 7, 8, 9, 11, 12, 13, 14, 18, 19, 20, 21, 22, 23, 32, 33, 34, 35, 36, 37, 38, 39, and 40.

Under another aspect, a heat pump system is provided that can be used in a cooling mode. The heat pump system may include tubing configured to hold a refrigerant; a compressor configured to increase pressure of the refrigerant within the tubing; and a first heat exchanger that is downstream of the compressor. The first heat exchanger may be configured to receive a first fluid flow, to receive the refrigerant from the tubing, and to change the enthalpy of the first fluid flow through heat exchange with the refrigerant. The heat pump system may include a second heat exchanger that is configured to receive a second fluid flow, to receive the refrigerant from the tubing, and to change the enthalpy of the second fluid flow through heat exchange with the refrigerant. The heat pump system may include a thermoelectric device that is coupled to the tubing downstream of the first heat exchanger, and configured to change the enthalpy of the refrigerant in the tubing. The heat pump system may include an expansion valve that is coupled to the tubing and downstream of the thermoelectric device and the first heat exchanger, configured to expand the refrigerant and reduce refrigerant pressure while conserving refrigerant enthalpy. The heat pump system may include a control system configured to control at least the thermoelectric device. Nonlimiting examples of such a heat pump system are described, for example, with reference to FIGS. 1, 2, 3, 20, and 32-40.

Under another aspect, a heat pump system is provided that can be used in a heating mode. The heat pump system may include tubing configured to hold a refrigerant; a compressor configured to increase pressure of the refrigerant within the tubing; and a first heat exchanger that is downstream of the compressor and that is configured to receive a first fluid flow, to receive the refrigerant from the tubing, and to change the enthalpy of the first fluid flow through heat exchange with the refrigerant. The heat pump system may include a second heat exchanger that is configured to receive a second fluid flow, to receive the refrigerant from the tubing, and to change the enthalpy of the second fluid flow through heat exchange with the refrigerant. The heat pump system may include a thermoelectric device that is coupled to the tubing downstream of the first heat exchanger, and configured to change the enthalpy of the refrigerant in the tubing. The heat pump system may include an expansion valve that is coupled to the tubing and downstream of the thermoelectric device and the first heat exchanger, and is configured to expand the refrigerant and reduce refrigerant pressure while conserving refrigerant enthalpy. The heat pump system may include a control system configured to control at least the thermoelectric device. Nonlimiting examples of such a heat pump system are described, for example, with reference to FIGS. 4, 5, 6, and 21.

In some examples of any of such heat pump systems, the thermoelectric device is integrated into the first heat exchanger or the second heat exchanger, e.g., in a similar manner to that described with reference to FIG. 1. The control system may be configured to turn off a part of the thermoelectric device in the second heat exchanger while leaving on another part of the thermoelectric device, e.g., in a manner similar to that described with reference to FIG. 1.

In some examples of any of such heat pump systems, the thermoelectric device is separate from the second heat exchanger. Nonlimiting examples of such a heat pump system are described, for example, with reference to FIGS. 10, 15, 16, 22, and 23.

Additionally, or alternatively, in some examples of any of such heat pump systems, a temperature of the refrigerant in the second heat exchanger is based, at least in part, on operation of the second heat exchanger, a temperature of the refrigerant at an inlet to the second heat exchanger, an ambient temperature, and how many parts of the thermoelectric device are turned on. Nonlimiting examples of such a heat pump system are described, for example, with reference to FIGS. 10, 15, 16, 22, and 23.

Additionally, or alternatively, in some examples of any of such heat pump systems, the heat pump system is configured to minimize and control operating pressure and inhibit over-pressure conditions, e.g., in a similar such as described with reference to FIG. 25.

Additionally, or alternatively, in some examples of any of such heat pump systems, the thermoelectric device is downstream of the second heat exchanger on a hot side of the second heat exchange. Nonlimiting examples of such a heat pump system are described, for example, with reference to FIG. 10 and FIG. 16. Alternatively, in some examples of the heat pump system, the thermoelectric device is upstream of the second heat exchanger on a hot side of the second heat exchanger. As yet another alternative, in some examples of the heat pump system, the control system is configured to switch whether the thermoelectric device is upstream or downstream of the second heat exchanger on a hot side of the second heat exchanger. Nonlimiting examples of such a heat pump system are described, for example, with reference to FIGS. 3, 6, and 9. Optionally, the heat pump system may include an additional two to six valves coupled to the control system and controllable by the control system to switch whether the thermoelectric device is upstream or downstream of the second heat exchanger on the hot side, for example in a manner such as described with reference to FIGS. 3, 6, and 9.

Additionally, or alternatively, in some examples of any of such heat pump systems, the heat pump system is configured to operate subcritically for all ambient temperatures, e.g., in a manner such as described with reference to FIG. 25. Alternatively, in some examples of the heat pump system, the control system is configured to switch the heat pump system between operating subcritically and operating transcritically depending on the conditions, e.g., in a manner such as described with reference to FIG. 25. As yet another alternative, in some examples of the heat pump system, the heat pump system is configured to operate transcritically for all ambient temperatures, e.g., in a manner such as described with reference to FIG. 25.

Additionally, or alternatively, in some examples of any of such heat pump systems, the heat pump system is configured to provide heating, ventilation, and air conditioning (HVAC) to a passenger vehicle. Alternatively, in some examples, the heat pump system is configured to provide HVAC to an electric or hybrid electric vehicle. Alternatively, in some examples, the heat pump system is configured to provide HVAC to a bus. Alternatively, in some examples, the heat pump system is configured to provide HVAC to an electric bus. Alternatively, in some examples, the heat pump system is configured to provide HVAC to a building. Nonlimiting examples of a heat pump system for use in such contexts are described further above. As a further option, the heat pump system further may include a fan for supplying cabin air to the first heat exchanger. As an additional or alternative option, in examples that include a secondary liquid loop, the secondary liquid loop provides separation of the refrigerant from a passenger compartment, e.g., in a manner such as described with reference to FIG. 10. In some examples, the heat pump system is configured to provide HVAC and/or hot water to a building, e.g., in a manner such as described with reference to FIG. 16.

Additionally, or alternatively, in some examples of any of such heat pump systems, the control system is configured to operate different sections of the thermoelectric device at different currents and voltages, respectively, at the same time, e.g., in a manner such as described with reference to FIGS. 29 and 30.

Additionally, or alternatively, in some examples of any of such heat pump systems, the control system is configured to operate the thermoelectric device at greater than a current for optimum coefficient of performance (COP) in order to increase heat pumping, e.g., in a manner such as described further above and with reference to FIGS. 29 and 30.

Additionally, or alternatively, in some examples of any of such heat pump systems, the control system is configured to operate the thermoelectric device at close to maximum heat pumping current, e.g., in a manner such as described further above and with reference to FIGS. 29 and 30.

Additionally, or alternatively, in some examples of any of such heat pump systems, the heat pump system further includes at least one secondary liquid loop connected to at least one of the first and second heat exchangers, e.g., in a manner such as described with reference to FIGS. 10, 11, 12, and 15. Additionally, or alternatively, in some examples, the heat pump system further includes a secondary liquid loop connected to the thermoelectric device, e.g., in a manner such as described with reference to FIGS. 10, 11, 12, and 15. Optionally, the secondary liquid loop may include second tubing configured to hold a coolant mixture, a pump coupled to the second tubing, and at least one additional liquid-to-air heat exchanger coupled to the second tubing e.g., in a manner such as described with reference to FIGS. 10, 11, 12, and 15. As a further or alternative option, the secondary liquid loop provides further control with thermal storage, e.g., in a manner such as described with reference to FIG. 10.

Additionally, or alternatively, in some examples of any of such heat pump systems, the control system is configured to switchably operate each of the first and second heat exchangers as either a condenser/gas cooler or evaporator depending on the direction of refrigerant flow, e.g., in a manner such as described with reference to FIGS. 7, 15, 16, 17, 22, and 23.

Additionally, or alternatively, in some examples of any of such heat pump systems, the refrigerant includes $CO_2$, e.g., in a manner such as described elsewhere herein. Alternatively, the refrigerant may include R1234yf, e.g., in a manner such as described elsewhere herein.

Additionally, or alternatively, in some examples of any of such heat pump systems, the thermoelectric device includes a Distributed Transport Property (DTP) material structure, e.g., in a manner such as described elsewhere herein and in International Patent Application No. PCT/US2020/016247, filed on Jan. 31, 2020 and entitled "Thermoelectric Elements and Devices with Enhanced Maximum Temperature Differences Based on Spatially Varying Distributed Transport Properties."

Additionally, or alternatively, in some examples of any of such heat pump systems, the thermoelectric device includes a refrigerant-to-air device, e.g., in a manner such as described with reference to FIGS. 16, 17, 18, and 19. Alternatively, the thermoelectric device includes a refrigerant-to-liquid device, e.g., in a manner such as described with reference to FIG. 10.

Additionally, or alternatively, in some examples of any of such heat pump systems, the thermoelectric device is configured to reject heat to air separately from heat rejection by the second heat exchanger, e.g., in a manner such as described with reference to FIG. 11.

Additionally, or alternatively, in some examples of any of such heat pump systems, heating is supplied by the thermoelectric device only, e.g., in a manner such as described with reference to FIG. 11.

Additionally, or alternatively, in some examples of any of such heat pump systems, the heat pump system further includes an air handler configured to separate heated air from the first heat exchanger and heated air from the thermoelectric device, e.g., in a manner such as described with reference to FIGS. 18 and 19.

Additionally, or alternatively, in some examples of any of such heat pump systems, the second heat exchanger includes a refrigerant-to-liquid heat exchanger, e.g., in a manner such as described with reference to FIGS. 12-14.

Additionally, or alternatively, in some examples of any of such heat pump systems, heat rejection from the thermoelectric device to fluid is in parallel to heat rejection from the second heat exchanger, e.g., in a manner such as described with reference to FIGS. 17 and 19. As a further option, the heat pump system may include first and second valves coupled to the control system to enable switching between rejecting heat from the thermoelectric device before or after the second heat exchanger, e.g., in a manner such as described with reference to FIGS. 3, 6, 9, 13, and 14.

Additionally, or alternatively, in some examples of any of such heat pump systems, the thermoelectric device is split into first and second parts, e.g., in a manner such as described with reference to FIGS. 15 and 35. As a further option if a secondary liquid loop is included, the secondary liquid loop may include two parts, each with its own pump, for respective ones of the first and second parts of the split thermoelectric device, e.g., in a manner such as described with reference to FIG. 15.

Additionally, or alternatively, in some examples of any of such heat pump systems, the thermoelectric device is in a cross-flow configuration, e.g., in a manner such as described with reference to FIGS. 16, 17, 18, and 19. Alternatively, the thermoelectric device may be in a counter-flow configuration, e.g., in a manner such as described with reference to FIGS. 1 and 10. As a further alternative, the thermoelectric device may be in a parallel flow configuration, e.g., in a manner such as described with reference to FIG. 10.

Additionally, or alternatively, in some examples of any of such heat pump systems, the control system is configured to operate the refrigerant loop as a coolant loop only for the thermoelectric device with at least one of the first and second expansion valves fully open and the compressor bypassed, e.g., in a manner such as described with reference to FIG. 18.

Additionally, or alternatively, in some examples of any of such heat pump systems, the heat pump system further includes a fan configured to provide flow in either direction across one of the first and second heat exchangers, e.g., in a manner such as described elsewhere herein.

Additionally, or alternatively, in some examples of any of such heat pump systems, the thermoelectric device operates as an intermediate stage, e.g., in a manner such as described with reference to FIGS. 34, 38, 39, and 40.

Additionally, or alternatively, in some examples of any of such heat pump systems, the thermoelectric device includes a plurality of thermoelectric devices, e.g., in a manner such as described with reference to FIGS. 15, 35, 36, 37, 38, 39, and 40.

Additionally, or alternatively, in some examples of any of such heat pump systems, the thermoelectric device functions as a second stage, and the first heat exchanger operates as either an evaporator or condenser depending on whether the system is in cooling or heating mode, e.g., in a manner such as described with reference to FIGS. 22 and 23.

Additionally, or alternatively, in some examples of any of such heat pump systems, the control system is configured to switchably reverse liquid flow in the secondary liquid loop, e.g., in a manner such as described with reference to FIG. 10.

Additionally, or alternatively, in some examples of any of such heat pump systems, the heat pump system further includes one or more sensors operably coupled to the control system for use by the control system to determine one or more of: optimal compressor speed, thermoelectric device current, control of the four-way valve, and indoor and outdoor air flow, e.g., in a manner such as described elsewhere herein.

Additionally, or alternatively, in some examples of any of such heat pump systems, the heat pump system further includes an accumulator, e.g., in a manner such as described elsewhere herein.

Additionally, or alternatively, in some examples of any of such heat pump systems, the control system is configured to control the thermoelectric device to control maximum operating pressure, e.g., in a manner such as described elsewhere herein.

Additionally, or alternatively, in some examples of any of such heat pump systems, at least one of the expansion valves includes a bi-flow expansion valve, e.g., in a manner such as described with reference to FIGS. 10, 15, 16, 22, and 23.

Additionally, or alternatively, in some examples of any of such heat pump systems that include the at least one valve, the at least one valve may include a four-way valve, e.g., in a manner such as described with reference to FIGS. 10, 15, 16, 22, and 23.

Additionally, or alternatively, in some examples of any of such heat pump systems, the control system further is configured to control the compressor, e.g., in a manner such as described with reference to FIGS. 10, 15, 16, 22, and 23.

Under another aspect, a thermoelectric device is provided. Optionally, the thermoelectric device may be for use in the heat pump system described herein. However, it should be appreciated that the thermoelectric device may be used in any suitable heat pump system, vapor compression cycle, or other application.

Additionally or alternatively, in some examples, the thermoelectric device includes independent rows of alternating p-type and n-type thermoelectric materials, e.g., in a manner such as described with reference to FIGS. 29, 30, and 31. Optionally, each of the independent rows may be operable at a separate electrical current, e.g., in a manner such as described with reference to FIG. 29.

Additionally or alternatively, in some examples, the thermoelectric device includes potting material. Optionally, the potting material includes low thermal conductivity silicone. As a further or alternative option, the potting material may include vacuum-filled glass spheres. Nonlimiting examples of potting materials are provided with reference to FIGS. 29 and 30.

Additionally or alternatively, in some examples of the thermoelectric device, first and second fluid flows involve parallel streams in a counterflow configuration, e.g., in a manner such as described with reference to FIG. 29.

Additionally or alternatively, in some examples of the thermoelectric device, mandrels are used when the rows are potted together to allow flow from one row to another, e.g., in a manner such as described with reference to FIG. 29.

Additionally or alternatively, in some examples of the thermoelectric device, the first fluid flow, the second fluid flow, and the electrical currents are all in different planes, e.g., in a manner such as described with reference to FIG. 30.

Additionally or alternatively, in some examples, the thermoelectric device includes multiple planes of thermoelectric rows to create a block of thermoelectric rows with each row operating on one or more electrical currents, e.g., in a manner such as described with reference to FIG. 30.

Additionally or alternatively, in some examples of the thermoelectric device, the device operates in cross-flow, e.g., in a manner such as described with reference to FIG. 30.

Additionally or alternatively, in some examples, the thermoelectric device includes turbulators to facilitate heat transfer, e.g., in a manner such as described with reference to FIGS. 29 and 30.

Additionally or alternatively, in some examples of the thermoelectric device, the thermoelectric rows are formed using a single ingot formed by pressing together p-type, n-type, and metal powders in a multi-layer fashion. Optionally, the single ingot is diced to form separate ones of the thermoelectric rows. As a further or alternative option, the metal powder may include nickel, copper, or aluminum. Nonlimiting examples of forming and using such ingots are provided with reference to FIG. 31.

Additionally or alternatively, in some examples, the thermoelectric device includes electrical contacts on each end of each row, wherein the electrical contacts are part of the corresponding row, e.g., in a manner such as described with reference to FIG. 31.

Additionally or alternatively, in some examples of the thermoelectric device, one or more holes is made in the metal layers of the single ingot using one or more mandrels, e.g., in a manner such as described with reference to FIG. 31. Optionally, the thermoelectric device further may include a dielectric coating in the holes of the metal layers to provide electrical isolation from fluid flow, e.g., in a manner such as described with reference to FIG. 31.

Under another aspect provided herein, a thermoelectric heat pump includes at least one distributed transport properties (DTP) thermoelectric (TE) couple comprising at least one DTP TE element. The at least one DTP TE element includes a DTP TE material with a Seebeck coefficient, thermal conductivity, or electrical resistance varying within said DTP TE element such that when that DTP TE element is subjected to a fixed temperature differential and no current is flowing in a primary direction that produces heat pumping action, at least at one position within that DTP TE element there is a current that in steady state operation produces a lower temperature than the temperature at that position when no current is flowing. Nonlimiting examples of such a thermoelectric heat pump are provided with reference to FIGS. 44 and 45.

In some examples of the thermoelectric heat pump, the steady state current that produces said lower temperature at least at the one position is between 0 current flow and a current flow that produces maximum coefficient of performance (COP). Nonlimiting examples of such a thermoelectric heat pump are provided with reference to FIGS. 44 and 45.

Additionally, or alternatively, in some examples of the thermoelectric heat pump, in the at least one DTP TE element, a change in a composition of the DTP TE material in the primary direction of current flow produces a maximum cooling capacity at least 10% greater than that produced by a reference TE couple of same length in the primary direction of current flow and fabricated using any single n-type and any single p-type TE material contained within the at least one DTP couple. Nonlimiting examples of such a thermoelectric heat pump are provided with reference to FIGS. 46, 47, 48, and 49.

Additionally, or alternatively, in some examples of the thermoelectric heat pump, a change in a composition of the DTP TE material in the primary direction of current flow produces a maximum cooling capacity at least 20% greater than that produced by a reference TE couple of same length in the primary direction of current flow and fabricated using any single n-type and any single p-type TE material contained within the at least one DTP couple. Nonlimiting examples of such a thermoelectric heat pump are provided with reference to FIGS. 46, 47, 48, and 49.

Additionally, or alternatively, in some examples of the thermoelectric heat pump, a change in a composition of the DTP TE material in the primary direction of current flow produces a maximum COP increase at least 2% greater than that produced by a reference TE couple of same length in the primary direction of current flow and fabricated using any single n-type and any single p-type TE material contained within the at least one DTP couple. Nonlimiting examples of such a thermoelectric heat pump are provided with reference to FIGS. 47 and 48.

Additionally, or alternatively, in some examples of the thermoelectric heat pump, a change in a composition of the DTP TE material in the primary direction of current flow produces a maximum COP increase at least 5% greater than that produced by a reference TE couple of same length in the primary direction of current flow and fabricated using any single n-type and any single p-type TE material contained within the at least one DTP couple. Nonlimiting examples of such a thermoelectric heat pump are provided with reference to FIGS. 47 and 48.

Additionally, or alternatively, in some examples of the thermoelectric heat pump, a change in a composition of the DTP TE material in the primary direction of current flow produces a maximum temperature differential increase at least 2% greater than that produced by a reference TE couple of same length in the primary direction of current flow and fabricated using any single n-type and any single p-type TE material contained within the at least one DTP couple. Nonlimiting examples of such a thermoelectric heat pump are provided with reference to FIGS. 50 and 54. As an example, in FIG. 54 for 1 stage 1401, the max DT 1402 is for CTE module performance curve 1403 is about 72K and for the comparable DTP module performance curve 1404 Max DT is about 91K, or about 26% greater.

Additionally, or alternatively, in some examples of the thermoelectric heat pump, a change in a composition of the DTP TE material in the primary direction of current flow produces a maximum temperature differential increase at least 5% greater than that produced by a reference TE couple of same length in the primary direction of current flow and fabricated using any single n-type and any single p-type TE material contained within the at least one DTP couple. Nonlimiting examples of such a thermoelectric heat pump are provided with reference to FIG. 54. As an example, in FIG. 54 for 1 stage 1401, the max DT 1402 is for CTE module performance curve 1403 is about 72K and for the comparable DTP module performance curve 1404 Max DT is about 91K, or about 26% greater.

Additionally, or alternatively, in some examples of the thermoelectric heat pump, under identical heat load conditions and the same temperature difference, input power to the at least one DTE TE element is at least 5% lower than input power for a reference TE couple of same length in the primary direction of current flow and fabricated using any single n-type and any single p-type TE material contained within the at least one DTP couple. Nonlimiting examples of such a thermoelectric heat pump are provided with reference to FIG. 49.

Additionally, or alternatively, in some examples of the thermoelectric heat pump, under identical heat load conditions and the same temperature difference, input power to the at least one DTE TE element is at least 5% lower than for a reference TE couple of same length in the primary direction of current flow and fabricated using any single n-type and any single p-type TE material contained within the at least one DTP couple. Nonlimiting examples of such a thermoelectric heat pump are provided with reference to FIGS. 44 and 45.

Under another aspect provided herein, a thermoelectric couple is provided that includes at least one distributed transport properties (DTP) thermoelectric (TE) element including more than one TE material composition in a primary direction of current flow and configured such that when current flows in that direction and produces a heat pumping effect, a change in the TE material composition in the primary direction of current flow produces a local cooling effect within the at least one DTP TE element that opposes Joule heating in at least a portion of the DTP TE element. Nonlimiting examples of such a thermoelectric couple are provided with reference to FIGS. 44 and 45.

Under yet another aspect provided herein, a thermoelectric couple is provided that includes at least one distributed transport properties (DTP) thermoelectric (TE) element including more than one TE material composition in a primary direction of current flow and configured such that when current flows in that direction an produces a net thermal power output, a change in the TE material composition in the primary direction of current flow produces a local cooling effect within at the DTP TE element that opposes Joule heating in at least a portion of the at least one DTP TE element. Nonlimiting examples of such a thermoelectric couple are provided with reference to FIGS. 44 and 45.

In some examples of either such thermoelectric couple, the change in the TE material composition in the primary direction of current flow produces a maximum cooling capacity at least 5% greater than that produced by a reference TE couple of same length in the primary direction of current flow and fabricated using any single n-type and any single p-type TE material contained within the at least one DTP couple. Nonlimiting examples of such a thermoelectric couple are provided with reference to FIGS. 46, 47, and 48.

Additionally, or alternatively, in some examples of either such thermoelectric couple, the change in the TE material composition in the primary direction of current flow produces a maximum cooling capacity at least 10% greater than that produced by a reference TE couple of same length in the primary direction of current flow and fabricated using any single n-type and any single p-type TE material contained within the at least one DTP couple. Nonlimiting examples of such a thermoelectric couple are provided with reference to FIGS. 46, 47, and 48.

Additionally, or alternatively, in some examples of either such thermoelectric couple, the change in the TE material composition in the primary direction of current flow produces a maximum efficiency increase at least 2% greater than that produced by a reference TE couple of same length in the primary direction of current flow and fabricated using any single n-type and any single p-type TE material contained within the at least one DTP couple. Nonlimiting examples of such a thermoelectric couple are provided with reference to FIGS. 46, 47, and 48.

Additionally, or alternatively, in some examples of either such thermoelectric couple, the change in the TE material composition in the primary direction of current flow produces a maximum efficiency increase at least 5% greater than that produced by a reference TE couple of same length in the primary direction of current flow and fabricated using any single n-type and any single p-type TE material contained within the at least one DTP couple. Nonlimiting examples of such a thermoelectric couple are provided with reference to FIGS. 46, 47, and 48.

Additionally, or alternatively, in some examples of either such thermoelectric couple, the change in the TE material composition in the primary direction of current flow produces a maximum temperature differential increase at least 2% greater than that produced by a reference TE couple of same length in the primary direction of current flow and fabricated using any single n-type and any single p-type TE material contained within the at least one DTP couple. Nonlimiting examples of such a thermoelectric couple are provided with reference to FIGS. 50 and 54. As an example, in FIG. 54 for 1 stage 1401, the max DT 1402 is for CTE module performance curve 1403 is about 72K and for the comparable DTP module performance curve 1404 Max DT is about 91K, or about 26% greater.

Additionally, or alternatively, in some examples of either such thermoelectric couple, the change in the TE material composition in the primary direction of current flow produces a maximum temperature differential increase at least 5% greater than that produced by a reference TE couple of same length in the primary direction of current flow and fabricated using any single n-type and any single p-type TE material contained within the at least one DTP couple. Nonlimiting examples of such a thermoelectric couple are provided with reference to FIG. 54. As an example, in FIG. 54 for 1 stage 1401 the max DT 1402 is for CTE module performance curve 1403 is about 72K and for the comparable DTP module performance curve 1404 Max DT is about 91K, or about 26% greater.

Additionally, or alternatively, in some examples of either such thermoelectric couple, under identical heat load conditions and the same temperature difference, input power to the at least one DTP TE element is at least 10% lower than for a reference TE couple of same length in the primary direction of current flow and fabricated using any single n-type and any single p-type TE material contained within the at least one DTP couple. Nonlimiting examples of such a thermoelectric couple are provided with reference to FIG. 49.

It is to be understood that any respective features/examples of each of the aspects and embodiments of the disclosure may be implemented together in any appropriate combination, and that any features/examples from any one or more of these aspects may be implemented together to achieve the benefits as described herein.

All of the references described above are hereby incorporated by reference herein in their entireties.

While various illustrative examples are described above, it will be apparent to one skilled in the art that various changes and modifications may be made therein without departing from the invention. The appended claims are intended to cover all such changes and modifications that fall within the true spirit and scope of the invention.

What is claimed is:

1. A heat pump system that can be used for temperature control in a cooling mode or in a heating mode, the heat pump system comprising:
   a fluid conduit configured to hold a refrigerant;
   a compressor configured to increase a pressure of the refrigerant within the fluid conduit;
   a first heat exchanger that is configured to receive the refrigerant and a first fluid flow, and to change the enthalpy of the first fluid flow through heat exchange with the refrigerant;
   a second heat exchanger that is configured to receive the refrigerant and a second fluid flow, and to change the enthalpy of the second fluid flow through heat exchange with the refrigerant;
   a thermoelectric device that includes a hot side and a cold side, wherein the cold side is coupled to the fluid conduit downstream of the first heat exchanger or is coupled to the fluid conduit downstream of the second heat exchanger, and wherein the thermoelectric device is configured to change the enthalpy of the refrigerant in the fluid conduit by pumping heat from the refrigerant (i) directly into the first fluid flow, or (ii) directly into the second fluid flow, or (iii) indirectly into the first fluid flow via a first coolant loop, or (iv) indirectly into the second fluid flow via a second coolant loop;
   at least one expansion valve that is coupled to the fluid conduit and configured to expand the refrigerant and reduce refrigerant pressure while conserving the refrigerant enthalpy;
   at least one valve that is controllable to adjust whether the hot side of the thermoelectric device pumps the heat from the refrigerant (i) directly into the first fluid flow, or (iii) indirectly into the first fluid flow via the first coolant loop, at a location in the first fluid flow that is upstream of the first heat exchanger or is downstream of the first heat exchanger, or pumps heat from the refrigerant (ii) directly into the second fluid flow, or (iv) indirectly into the second fluid flow via the second coolant loop, at a location in the second fluid flow that is upstream of the second heat exchanger or is downstream of the second heat exchanger; and
   a control system configured to control the at least one valve.

2. The heat pump system of claim 1, wherein the heat pump system is configured to minimize and control an operating pressure and inhibit over-pressure conditions or to operate at or below a particular operating pressure for all ambient temperatures.

3. The heat pump system of claim 1, wherein the heat pump system is configured to operate subcritically for all ambient temperatures.

4. The heat pump system of claim 1, wherein the control system is configured to switch the heat pump system between operating subcritically or operating transcritically.

5. The heat pump system of claim 1, wherein the control system is configured to simultaneously operate different sections of the thermoelectric device at different currents or voltages, respectively.

6. The heat pump system of claim 1, wherein the control system is configured to switchably operate each of the first and second heat exchangers as either a condenser/gas cooler or evaporator depending on the direction of refrigerant flow.

7. The heat pump system of claim 1, wherein the refrigerant comprises $CO_2$ (R744), R1234yf, R134a, ethane (R170), propane (R290), isobutane (R600a), ammonia (R717), ethylene (R1150), or propylene (R1270).

8. The heat pump system of claim 1, wherein the thermoelectric device includes a Distributed Transport Property (DTP) thermoelectric material structure.

9. The heat pump system of claim 1, wherein the thermoelectric device is split into at least first and second separately controllable parts.

10. The heat pump system of claim 1, further comprising a fan configured to move the first fluid flow across the first heat exchanger or to move the second fluid flow across the second heat exchanger.

11. The heat pump system of claim 1, further comprising an additional thermoelectric device that operates as an intermediate stage in a multi-stage cascaded system between two vapor-compression stages, wherein the additional thermoelectric device is a condenser for a cold stage and an evaporator for a hot stage.

12. The heat pump system of claim 1, further comprising an additional thermoelectric device that functions as a second stage in a multi-stage cascaded system with a vapor-compression stage, and wherein the first heat exchanger operates as either an evaporator or condenser depending on whether the system is in a cooling mode or a heating mode.

13. The heat pump system of claim 1, further comprising one or more sensors operably coupled to the control system for use by the control system to determine one or more of: a compressor speed, a thermoelectric device current, a control of the at least one valve, a rate of the first fluid flow, and a rate of the second fluid flow.

14. The heat pump system of claim 1, further comprising an accumulator.

15. The heat pump system of claim 1, wherein the control system is configured to switch the heat pump system between temperature control in the cooling mode and temperature control in the heating mode.

16. The heat pump system of claim 1, wherein the control system is configured to control the at least one valve to adjust the hot side of the thermoelectric device to pump heat from the refrigerant into the second fluid flow at a location in the second fluid flow that is upstream of the second heat exchanger at a first time and that is downstream of the second heat exchanger at a second time.

17. The heat pump system of claim 1, wherein the first fluid flow comprises air flow or wherein the second fluid flow comprises air flow.

18. The heat pump system of claim 1, wherein the first heat exchanger is downstream of the compressor.

19. The heat pump system of claim 1, further comprising at least one secondary fluid loop connected to at least one of the first and second heat exchangers and the thermoelectric device.

20. The heat pump system of claim 19, wherein the secondary fluid loop comprises a second fluid conduit configured to hold a coolant, a pump coupled to the second fluid conduit, and at least one additional fluid-to-air heat exchanger coupled to the second fluid conduit and configured to be cooled by the coolant.

21. The heat pump system of claim 1, wherein the control system is configured to control the at least one valve to adjust the hot side of the thermoelectric device to pump heat from the refrigerant into the first fluid flow at a location in the first fluid flow that is upstream of the first heat exchanger at a first time and that is downstream of the first heat exchanger at a second time.

22. The heat pump system of claim 21, wherein the control system is configured to control the at least one valve to adjust the hot side of the thermoelectric device to pump heat from the refrigerant into the second fluid flow at a location in the second fluid flow that is upstream of the second heat exchanger at a first time and that is downstream of the second heat exchanger at a second time.

* * * * *